United States Patent
Kim et al.

(10) Patent No.: US 8,999,528 B2
(45) Date of Patent: Apr. 7, 2015

(54) CONDENSATION COMPOUND AND ORGANIC LIGHT EMITTING DEVICE INCLUDING THE SAME

(71) Applicants: So-Yeon Kim, Yongin (KR); Yoon-Hyun Kwak, Yongin (KR); Bum-Woo Park, Yongin (KR); Jong-Won Choi, Yongin (KR); Wha-Il Choi, Yongin (KR); Sun-Young Lee, Yongin (KR); Ji-Youn Lee, Yongin (KR); Jin-Young Yun, Yongin (KR)

(72) Inventors: So-Yeon Kim, Yongin (KR); Yoon-Hyun Kwak, Yongin (KR); Bum-Woo Park, Yongin (KR); Jong-Won Choi, Yongin (KR); Wha-Il Choi, Yongin (KR); Sun-Young Lee, Yongin (KR); Ji-Youn Lee, Yongin (KR); Jin-Young Yun, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 81 days.

(21) Appl. No.: 13/736,389

(22) Filed: Jan. 8, 2013

(65) Prior Publication Data

US 2014/0034913 A1 Feb. 6, 2014

(30) Foreign Application Priority Data

Aug. 3, 2012 (KR) .................. 10-2012-0085390

(51) Int. Cl.
*H01L 51/54* (2006.01)
*H01L 51/00* (2006.01)
*H01L 51/50* (2006.01)

(52) U.S. Cl.
CPC ........ *H01L 51/0074* (2013.01); *H01L 51/0072* (2013.01); *H01L 51/0073* (2013.01); *H01L 51/5056* (2013.01); *H01L 51/5092* (2013.01); *Y10S 428/917* (2013.01)

(58) Field of Classification Search
None
See application file for complete search history.

(56) References Cited

U.S. PATENT DOCUMENTS

| | | | |
|---|---|---|---|
| 5,635,308 A | 6/1997 | Inoue et al. | |
| 5,645,948 A | 7/1997 | Shi et al. | |
| 5,972,247 A | 10/1999 | Shi et al. | |
| 6,465,115 B2 | 10/2002 | Shi et al. | |
| 6,596,415 B2 | 7/2003 | Shi et al. | |
| 2004/0076853 A1* | 4/2004 | Jarikov | 428/690 |
| 2007/0270595 A1* | 11/2007 | Kim et al. | 548/469 |
| 2011/0042663 A1 | 2/2011 | Abe et al. | |

FOREIGN PATENT DOCUMENTS

| | | |
|---|---|---|
| JP | 8-12600 A | 1/1996 |
| JP | 2000-003782 A | 1/2000 |
| KR | 10-2008-0061800 A | 7/2008 |
| KR | 10-2010-003624 A | 1/2010 |
| KR | 10-2010-0111037 A | 10/2010 |
| KR | 10-2011-0004481 | 1/2011 |

OTHER PUBLICATIONS

C.W. Tang, et al., Organic Electroluminescent Diodes, Appl. Phys. Letter 51, Sep. 21, 1987, pp. 913-915.
Chihaya Adachi, et al., Confinement of Charge Carriers and Molecular Excitons Within 5-nm-Think Emitter Layer in Organic Electroluminescent Devices with a Double Heterostructure, Appl. Phys. Letter 57, Aug. 6, 1990, pp. 531-533.

(Continued)

*Primary Examiner* — Gregory Clark
(74) *Attorney, Agent, or Firm* — Lee & Morse, P.C.

(57) ABSTRACT

A condensation compound is represented by Formula 1, 2, or 3 where $R_1$ to $R_{24}$ and A to F are further defined in the detailed description.

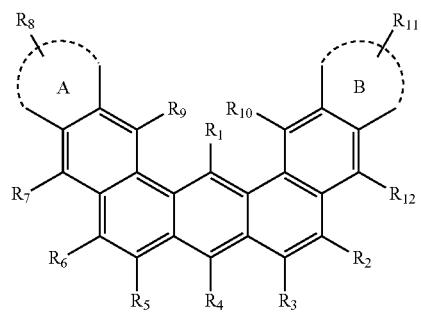

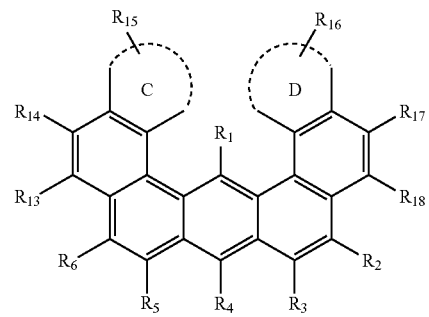

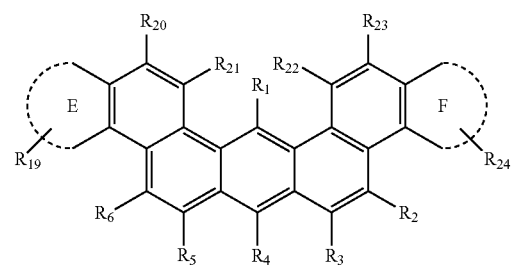

20 Claims, 1 Drawing Sheet

(56) References Cited

OTHER PUBLICATIONS

Youichi Sakamoto, et al., Synthesis Characterization, and Electron-Transport Property of Perfluorinated Phenylene Dendrimers, J. Am. Chem. Soc. 2000, Nov. 22, 1999, pp. 1832-1833.

Shigehiro Yamaguchi, et al., Diphenylamino-Substituted 2,5-Diarylsiloles for Single-Layer Organic Electroluminescent Devices, Chemistry Letters 2001 pp. 98-99.

* cited by examiner

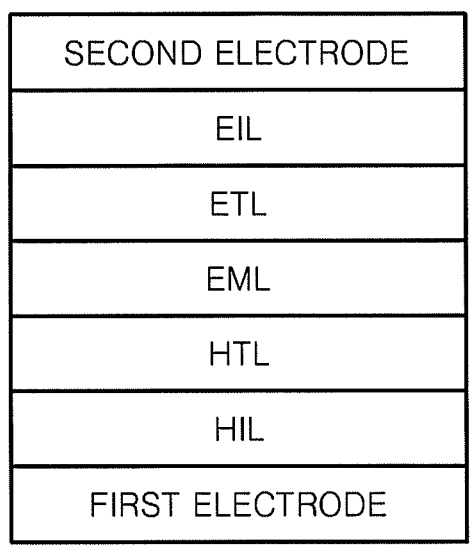

CONDENSATION COMPOUND AND ORGANIC LIGHT EMITTING DEVICE INCLUDING THE SAME

CROSS-REFERENCE TO RELATED APPLICATION

This application claims the benefit under 35 U.S.C. §119 of Korean Patent Application No. 10-2012-0085390, filed on Aug. 3, 2012, in the Korean Intellectual Property Office, the disclosure of which is incorporated herein in its entirety by reference.

BACKGROUND

1. Field

Embodiments relate to a novel condensation compound and an organic light-emitting device including the same.

2. Description of the Related Art

Organic light-emitting devices (OLEDs), which are self-emitting devices, have advantages such as wide viewing angles, excellent contrast, quick response, high brightness, excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

Embodiments are directed to a condensation compound represented by Formula 1, 2, or 3 below:

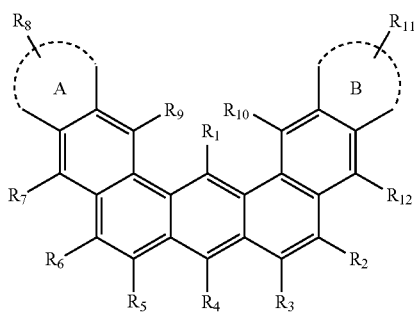

<Formula 1>

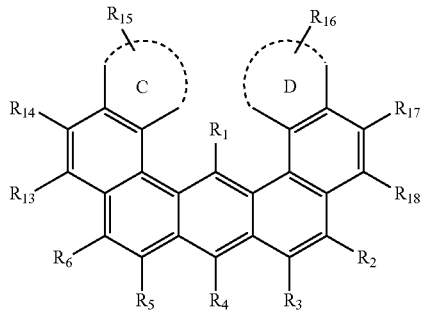

<Formula 2>

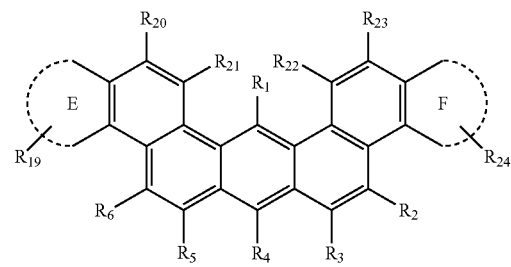

<Formula 3> wherein $R_1$ to $R_{24}$ are each independently a hydrogen atom, a deuterium atom, a halogen atom, a cyano group, a substituted or unsubstituted C1-C60 alkyl group, a substituted or unsubstituted C5-C60 aryl groups, a substituted or unsubstituted C3-C60 heteroaryl group, or a substituted or unsubstituted C6-C60 condensed polycyclic group; A to F each independently represent a substituted or unsubstituted furan group, a substituted or unsubstituted thiophene group, a substituted or unsubstituted pyrrole group, a substituted or unsubstituted benzofuran group, a substituted or unsubstituted benzothiophene group, a substituted or unsubstituted benzopyrrole group, or substituted or unsubstituted benzocyclopentyl group that are fused to a benzo[m]tetraphene skeleton of Formula 1, 2, or 3.

$R_1$ and $R_4$ may each independently be a halogen atom, a cyano group, a substituted or unsubstituted C1-C30 alkyl group, or a substituted or unsubstituted C5-C30 aryl group.

$R_2$ and $R_6$ may each independently be a substituted or unsubstituted C5-C30 aryl group, or a substituted or unsubstituted C5-C30 heteroaryl group.

$R_3$, $R_5$, $R_7$, $R_9$, $R_{10}$, $R_{12}$, $R_{13}$, $R_{14}$, $R_{17}$, $R_{18}$, $R_{20}$, $R_{21}$, $R_{22}$, and $R_{23}$ may each independently be a hydrogen atom or a deuterium atom.

A to F, which are a substituted or unsubstituted furan group, a substituted or unsubstituted thiophene group, a substituted or unsubstituted pyrrole group, a substituted or unsubstituted benzofuran group, a substituted or unsubstituted benzothiophene group, a substituted or unsubstituted benzopyrrole group, or substituted or unsubstituted benzocyclopentyl group, may fuse to the benzo[m]tetraphene skeleton of Formula 1, 2, or 3 at positions 2 and 3 in Formula 4 below, or at positions 2 and 3 in Formula 5 below:

<Formula 4>

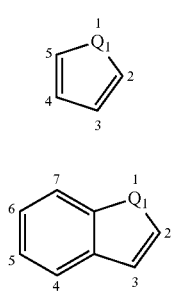

<Formula 5> wherein $Q_1$ is —O—, —NR$_{30}$—, —S— or —CR$_{31}$R$_{32}$—; and $R_{30}$ to $R_{32}$ are each independently a hydrogen atom, a deuterium atom, a substituted or unsubstituted C1-C20 alkyl group, a substituted or unsubstituted C5-C20 aryl group, a substituted or unsubstituted C3-C20 heteroaryl group, or a substituted or unsubstituted C6-C20 condensed polycyclic group.

The condensation compound of Formula 1, 2, or 3 may be symmetrical.

$R_2$ and $R_6$ in Formulae 1 to 3 may each independently be one of the groups represented by Formulae 2a to 2e below:

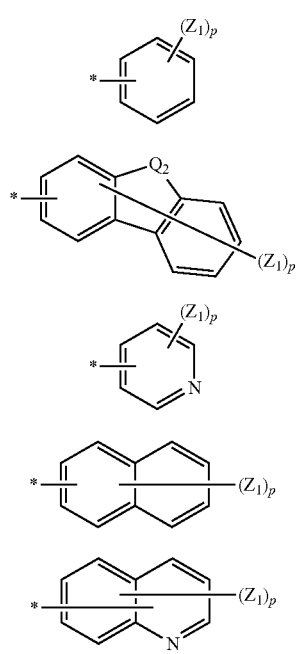

wherein $Q_2$ is a linking group represented by —C(R$_{40}$)(R$_{41}$)—, —N(R$_{42}$)—, —S—, or —O—; $Z_1$, $R_{40}$, $R_{41}$, and $R_{42}$ are each independently a hydrogen atom, a deuterium atom, a substituted or unsubstituted C1-C20 alkyl group, a substituted or unsubstituted C5-C20 aryl group, a substituted or unsubstituted C3-C20 heteroaryl group, a substituted or unsubstituted C6-C20 condensed polycyclic group, an amino group substituted with a C5-C20 aryl group or a C3-C20 heteroaryl group, a halogen atom, a cyano group, a nitro group, a hydroxyl group, or a carboxy group; p is an integer from 1 to 7; and * indicates a binding site.

The condensation compound of Formula 1, 2, or 3 may be one of compounds represented by the following Formulae 1, 22, 54, 54 and 59:

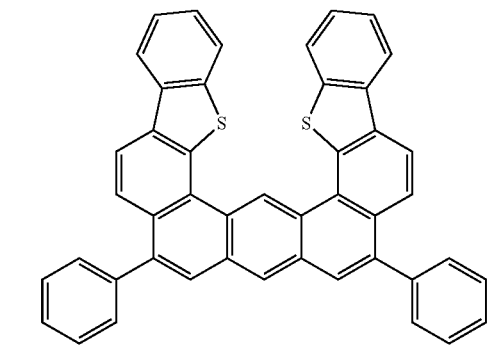

1

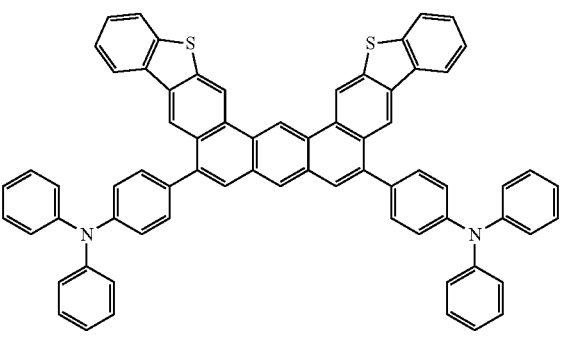

22

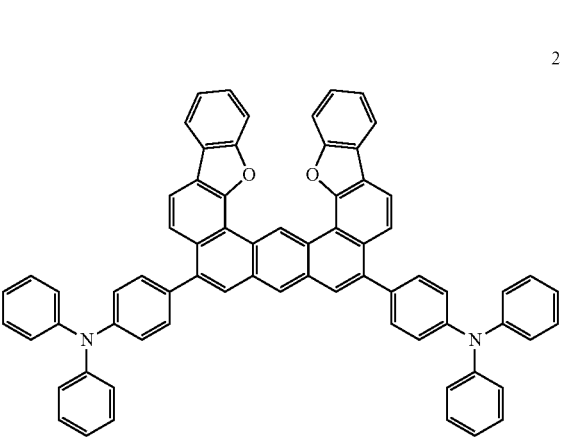

23

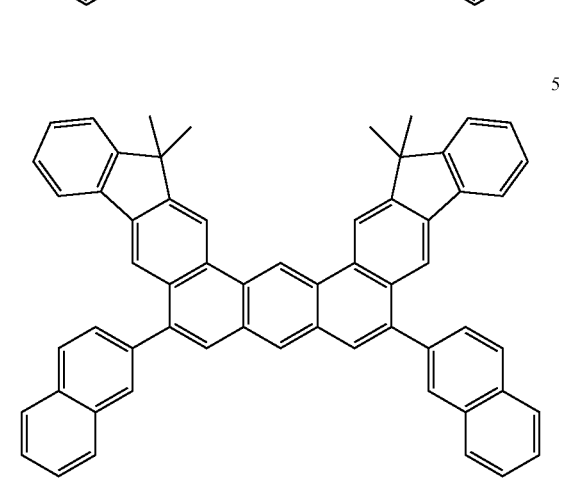

53

-continued

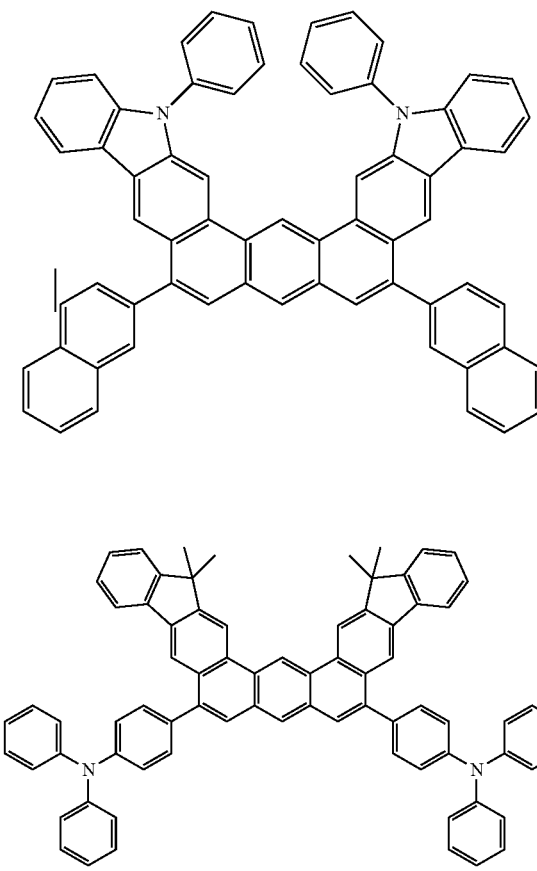

54

59

Embodiments are also directed to an organic light-emitting device (OLED), including a first electrode, a second electrode, and an organic layer between the first electrode and the second electrode, wherein the organic layer includes the condensation compound of claim 1.

The organic layer may include the condensation compound as a fluorescent dopant.

The organic layer may include the condensation compound as a phosphorescent host.

The organic layer may include a blue emission layer or a green emission layer.

The organic layer may include an emission layer (EML), a hole injection layer (HIL), a hole transport layer (HTL), and a functional layer having both electron injection and electron transport capabilities. The EML, the HIL, the HTL, or the functional layer having both electron injection and electron transport capabilities may include the condensation compound. The EML may include an anthracene-based compound, an arylamine-based compound, or a styryl-based compound.

The organic layer may include an EML, a HIL, a HTL, and a functional layer having both electron injection and electron transport capabilities. The EML, the HIL, the HTL, or the functional layer having both electron injection and electron transport capabilities include the condensation compound of claim 1. At least one of a red layer, a green layer, a blue layer, and a white layer of the EML includes a phosphorescent compound.

At least one of the HIL, the HTL, and the functional layer having both hole injection and hole transport capabilities may include a charge-generating material.

The charge-generating material may be a p-dopant. The p-dopant may be a quinone derivative, a metal oxide, or a compound containing a cyano group.

The organic layer may include an electron transport layer (ETL). The ETL may include an electron transporting organic compound and a metal complex.

The metal complex may be lithium quinolate (LiQ) or Compound 203 below:

<Compound 203>

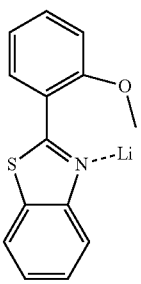

The organic layer may be formed of the condensation compound of claim 1 using a wet method.

The first electrode of the OLED may be electrically connected to a source or drain electrode of a thin-film transistor.

BRIEF DESCRIPTION OF THE DRAWING

The above and other features and advantages will become more apparent by describing in detail exemplary embodiments thereof with reference to the attached drawing in which:

FIG. 1 schematically illustrates the structure of an organic light-emitting device according to an embodiment.

DETAILED DESCRIPTION

As used herein, the term "and/or" includes any and all combinations of one or more of the associated listed items.

An organic light-emitting compound according to an embodiment may be represented by Formula 1, 2, or 3 below:

<Formula 1>

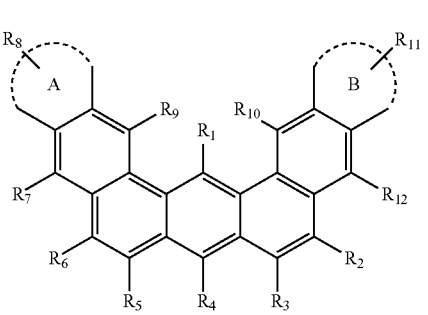

<Formula 2>

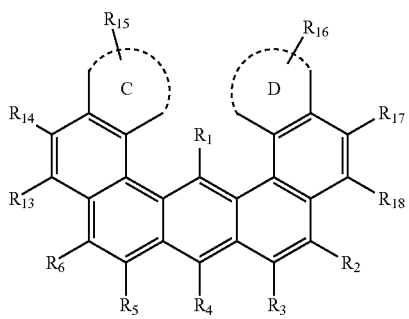

<Formula 3>

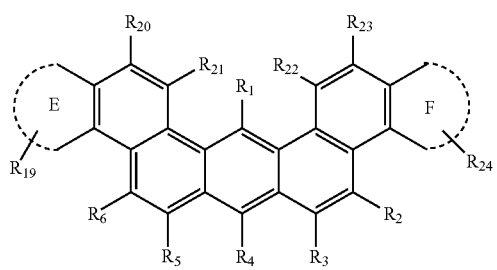

In Formula 1, 2, or 3, $R_1$ to $R_{24}$ are each independently a hydrogen atom, a deuterium atom, a halogen atom, a cyano group, a substituted or unsubstituted C1-C60 alkyl group, a substituted or unsubstituted C5-C60 aryl group, a substituted or unsubstituted C3-C60 heteroaryl group, or a substituted or unsubstituted C6-C60 condensed polycyclic group;

A to F each independently represent a substituted or unsubstituted furan group, a substituted or unsubstituted thiophene group, a substituted or unsubstituted pyrrole group, a substituted or unsubstituted benzofuran group, a substituted or unsubstituted benzothiophene group, a substituted or unsubstituted benzopyrrole group, or substituted or unsubstituted benzocyclopentyl group that are fused to a benzo[m]tetraphene skeleton of Formula 1, 2, or 3.

At least one hydrogen atom of the unsubstituted furan group, unsubstituted thiophene group, unsubstituted pyrrole group, unsubstituted benzofuran group, unsubstituted benzothiophene group, unsubstituted benzopyrrole group, or unsubstituted benzocyclopentyl group may be substituted with a substituted alkyl group which will be described later.

According to an embodiment, the condensation compound may have excellent emission wavelengths and charge transport control as a substituent is fused to the benzo[m]tetraphene skeleton where 5 benzene rings are fused, thus may have a higher luminescent efficiency and improved lifetime characteristics compared to existing host and/or dopant materials. Also, an organic light-emitting device manufactured using the condensation compound may have a very long lifetime and increased power efficiency with improved power consumption.

Substituents of the condensation compound in Formula 1, 2, or 3 will now be described in greater detail.

According to an embodiment, $R_1$ and $R_4$ in Formula 1, 2, or 3 may each independently be a halogen atom, a cyano group, a substituted or unsubstituted C1-C30 alkyl group, a substituted or unsubstituted C5-C30 aryl group.

According to another embodiment, $R_2$ and $R_6$ in Formula 1, 2, or 3 may each independently be a substituted or unsubstituted C5-C30 aryl group, or a substituted or unsubstituted C5-C30 heteroaryl group.

According to another embodiment, $R_3$, $R_5$, $R_7$, $R_9$, $R_{10}$, $R_{12}$, $R_{13}$, $R_{14}$, $R_{17}$, $R_{18}$, $R_{20}$, $R_{21}$, $R_{22}$, and $R_{23}$ in Formula 1, 2, or 3 may each independently be a hydrogen atom or a deuterium atom.

According to another embodiment, A to F in Formula 1, 2, or 3, which are a substituted or unsubstituted furan group, a substituted or unsubstituted thiophene group, a substituted or unsubstituted pyrrole group, a substituted or unsubstituted benzofuran group, a substituted or unsubstituted benzothiophene group, a substituted or unsubstituted benzopyrrole group, or substituted or unsubstituted benzocyclopentyl group may be fused to the benzo[m]tetraphene skeleton of Formula 1, 2, or 3 at positions 2 and 3 in Formula 4 blow, or at positions 2 and 3 in Formula 5 below:

<Formula 4>

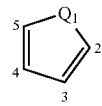

<Formula 5>

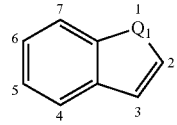

In Formulae 4 and 5, $Q_1$ is —O—, —NR$_{30}$—, —S— or —CR$_{31}$R$_{32}$—; and $R_{30}$ to $R_{32}$ may each independently be a hydrogen atom, a deuterium atom, a substituted or unsubstituted C1-C20 alkyl group, a substituted or unsubstituted C5-C20 aryl group, a substituted or unsubstituted C3-C20 heteroaryl group, or a substituted or unsubstituted C6-C20 condensed polycyclic group.

Formulae 4 and 5 are to describe positions where the substituents are being fused to the benzo[m]tetraphene skeleton, and thus the substituents are not shown.

According to another embodiment, the condensation compound of Formula 1, 2, or 3 may be symmetrical.

According to another embodiment, $R_2$ and $R_6$ in Formulae 1 to 3 may each independently be one of the groups represented by Formulae 2a to 2e below:

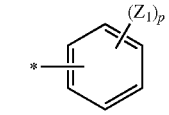

2a

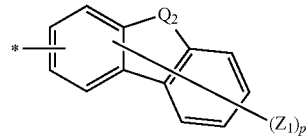

2b

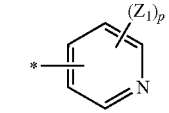

2c

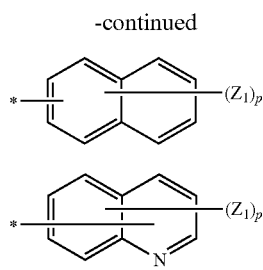

In Formulae 2a to 2e, Q2 is a linking group represented by —C($R_{40}$)($R_{41}$)—, —N($R_{42}$)—, —S—, or —O—; $Z_1$, $R_{40}$, $R_{41}$, and $R_{42}$ are each independently a hydrogen atom, a deuterium atom, a substituted or unsubstituted C1-C20 alkyl group, a substituted or unsubstituted C5-C20 aryl group, a substituted or unsubstituted C3-C20 heteroaryl group, a substituted or unsubstituted C6-C20 condensed polycyclic group, an amino group substituted with a C5-C20 aryl group or a C3-C20 heteroaryl group, a halogen atom, a cyano group, a nitro group, a hydroxyl group, or a carboxy group; p is an integer from 1 to 7; and * indicates a binding site.

Hereinafter, substituents described with reference to the formulae will now be described in detail. In this regard, the numbers of carbons in substituents are presented only for illustrative purposes and do not limit the characteristics of the substituents.

The unsubstituted C1-C60 alkyl group used herein may be linear or branched. Examples of the alkyl group may include, but are not limited to, a methyl group, an ethyl group, a propyl group, an isobutyl group, a sec-butyl group, a pentyl group, an iso-amyl group, a hexyl group, a heptyl group, an octyl group, a nonyl group, and a dodecyl group. At least one hydrogen atom of the alkyl group may be substituted with a deuterium atom, a halogen atom, a hydroxyl group, a nitro group, a cyano group, an amino group, an amidino group, hydrazine, hydrazone, a carboxyl group or a salt thereof, a sulfonic acid group or a salt thereof, a phosphoric acid group or a salt thereof, a C1-C10 alkyl group, a C1-C10 alkoxy group, a C2-C10 alkenyl group, a C2-C10 alkynyl group, a C6-C16 aryl group, or a C4-C16 heteroaryl group.

The unsubstituted C2-C60 alkenyl group indicates an unsaturated alkyl groups having at least one carbon-carbon double bond in the center or at a terminal of the alkyl group. Examples of the alkenyl group are an ethenyl group, a propenyl group, a butenyl group, and the like. At least one hydrogen atom in the unsubstituted alkenyl group may be substituted with a substituent described above in conjunction with the alkyl group.

The unsubstituted C2-C60 alkynyl group indicates an alkyl group having at least one carbon-carbon triple bond in the center or at a terminal of the alkyl group. Non-limiting examples of the unsubstituted C2-C20 alkynyl group are acetylene, propylene, phenylacetylene, naphthylacetylene, isopropylacetylene, t-butylacetylene, and diphenylacetylene. At least one hydrogen atom in the alkynyl group may be substituted with a substituent described above in conjunction with the alkyl group.

The unsubstituted C3-C60 cycloalkyl group indicates a C3-C60 cyclic alkyl group wherein at least one hydrogen atom in the cycloalkyl group may be substituted with a substituent described above in conjunction with the C1-C60 alkyl group.

The unsubstituted C1-C60 alkoxy group indicates a group having a structure of —OA wherein A is an unsubstituted C1-C60 alkyl group as described above. Non-limiting examples of the unsubstituted C1-C60 alkoxy group are a methoxy group, an ethoxy group, a propoxy group, an isopropyloxy group, a butoxy group, and a pentoxy group. At least one hydrogen atom of the alkoxy group may be substituted with a substituent such as those described above in conjunction with the alkyl group.

The unsubstituted C5-C60 aryl group indicates a carbocyclic aromatic system containing at least one ring. At least two rings may be fused to each other or linked to each other by a single bond. The term 'aryl' refers to an aromatic system, such as phenyl, naphthyl, or anthracenyl. At least one hydrogen atom in the aryl group may be substituted with a substituent described above in conjunction with the unsubstituted C1-C60 alkyl group.

Non-limiting examples of the substituted or unsubstituted C5-C60 aryl group are a phenyl group, a C1-C10 alkylphenyl group (for example, ethylphenyl group), a halophenyl group (for example, o-, m-, and p-fluorophenyl group, dichlorophenyl group), a cyanophenyl group, a dicyanophenyl group, a trifluoromethoxyphenyl group, a biphenyl group, a halobiphenyl group, a cyanobiphenyl group, a C1-C10 alkyl biphenyl group, a C1-C10 alkoxybiphenyl group, a o-, m-, and p-tolyl group, an o-, m-, and p-cumenyl group, a mesityl group, a phenoxyphenyl group, a (α,α-dimethylbenzene) phenyl group, a (N,N'-dimethyl)aminophenyl group, a (N,N'-diphenyl)aminophenyl group, a pentalenyl group, an indenyl group, a naphthyl group, a halonaphthyl group (for example, fluoronaphthyl group), a C1-C10 alkylnaphthyl group (for example, methylnaphthyl group), a C1-C10 alkoxynaphthyl group (for example, methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrycenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The unsubstituted C3-C60 heteroaryl group used herein includes one, two or three hetero atoms selected from N, O, P and S. At least two rings may be fused to each other or linked to each other by a single bond. Non-limiting examples of the unsubstituted C4-C60 heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazol group, an indolyl group, a quinolyl group, an isoquinolyl group, and a dibenzothiophene group. In addition, at least one hydrogen atom in the heteroaryl group may be substituted with a substituent described above in conjunction with the unsubstituted C1-C60 alkyl group.

The unsubstituted C5-C60 aryloxy group is a group represented by —OA1 wherein A1 may be a C5-C60 aryl group. An example of the aryloxy group is a phenoxy group. At least one hydrogen atom in the aryloxy group may be substituted with a substituent described above in conjunction with the unsubstituted C1-C60 alkyl group.

The unsubstituted C5-C60 arylthio group is a group represented by —SA1 wherein A1 may be a C5-C60 aryl group. Non-limiting examples of the arylthio group are a benzenethio group and a naphthylthio group. At least one hydrogen atom in the arylthio group may be substituted with a substituent described above in conjunction with the unsubstituted C1-C60 alkyl group.

The unsubstituted C6-C60 condensed polycyclic group used herein refers to a substituent including at least two rings wherein at least one aromatic ring and at least one non-aromatic ring are fused to each other, or refers to a substituent having an unsaturated group in a ring that may not form a conjugate structure. The unsubstituted C6-C60 condensed polycyclic group is distinct from an aryl group or a heteroaryl group in terms of being non-aromatic.

Non-limiting examples of the condensation compound used herein represented by Formula 1, 2, or 3 may be compounds represented by the following Formulae.

1

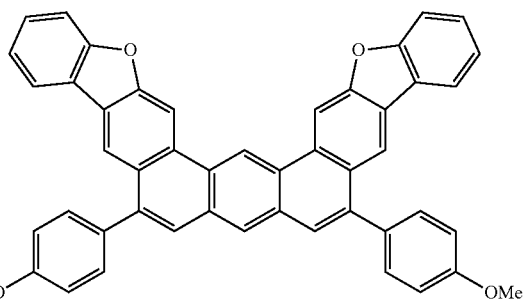

2

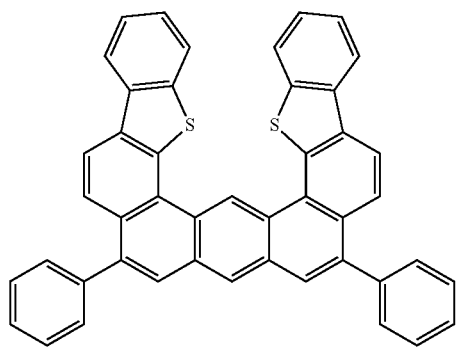

3

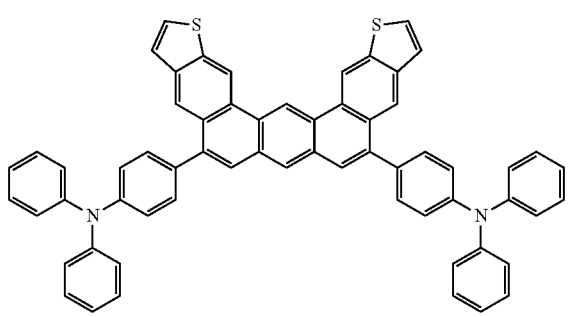

4

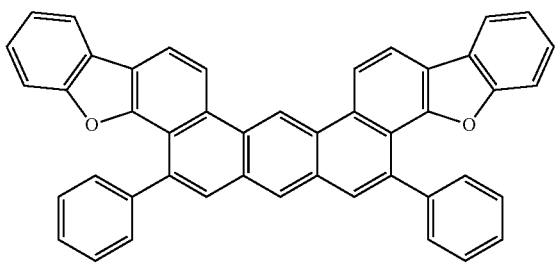

5

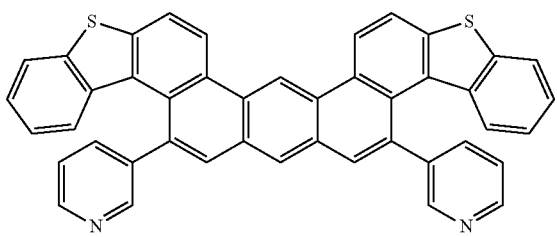

6

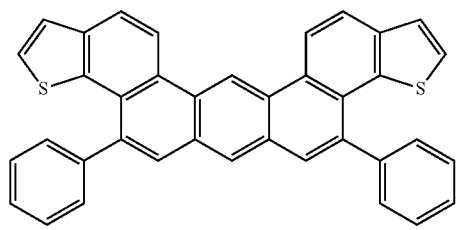

7

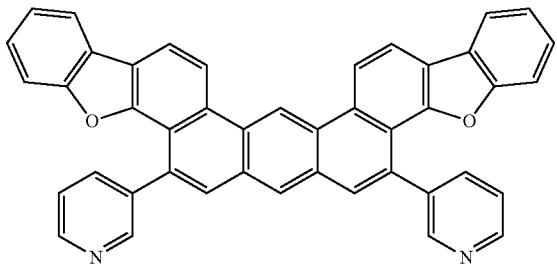

8

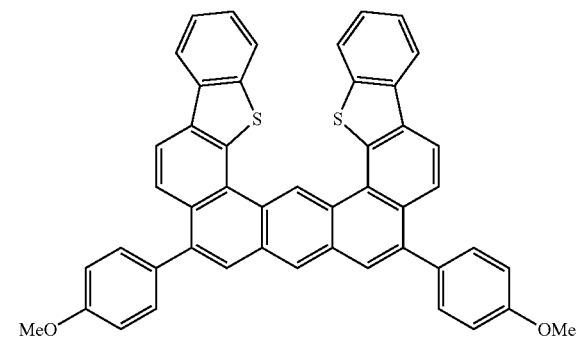

9

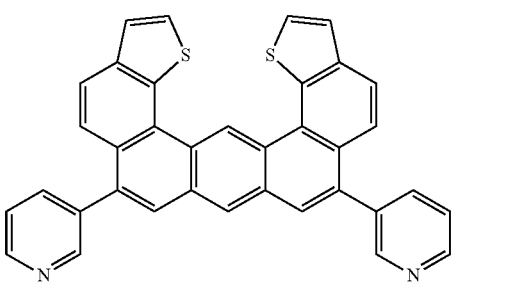

10
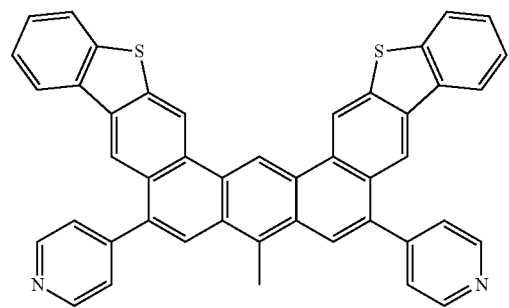
11
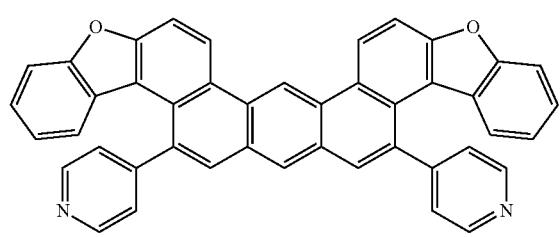
12
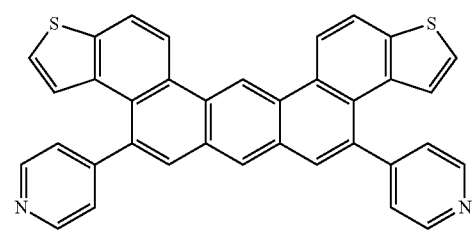
13
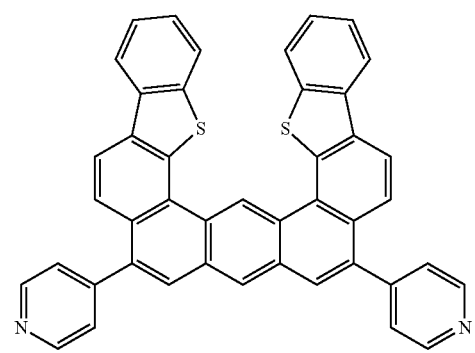
14
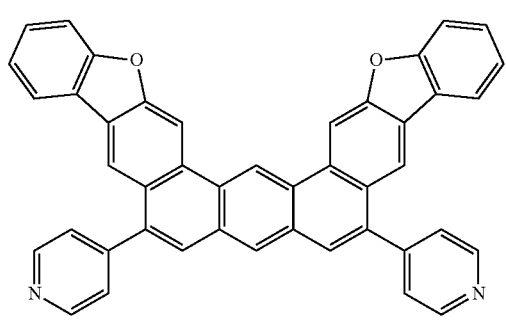
15
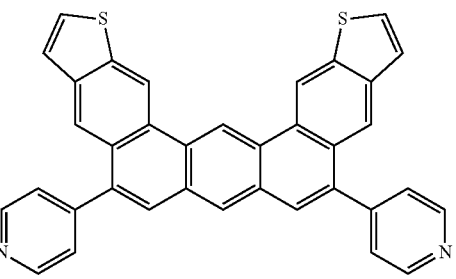
16
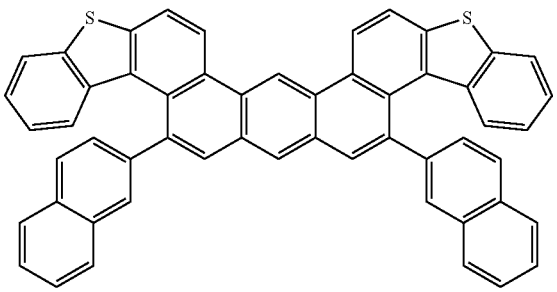
17
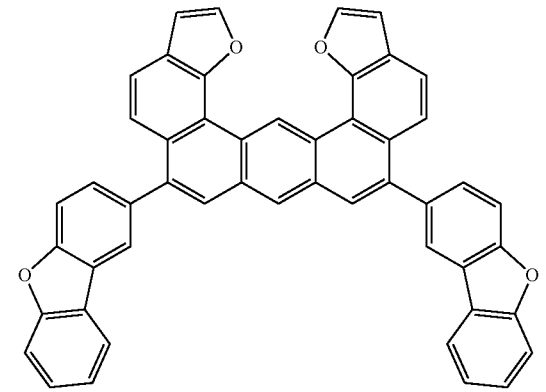
18
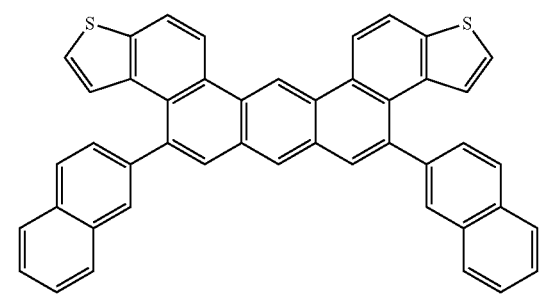
19
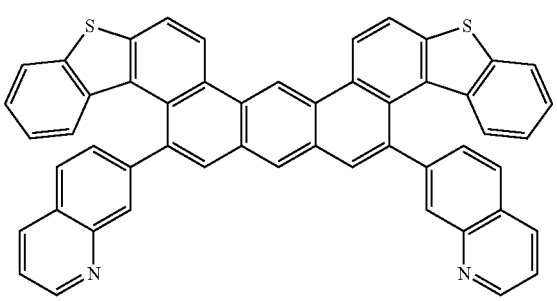

20
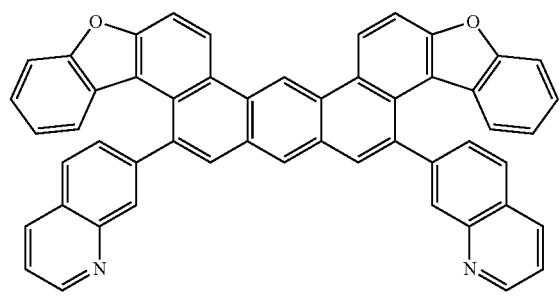
21
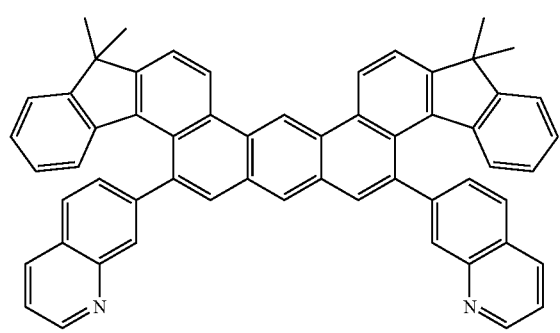
22
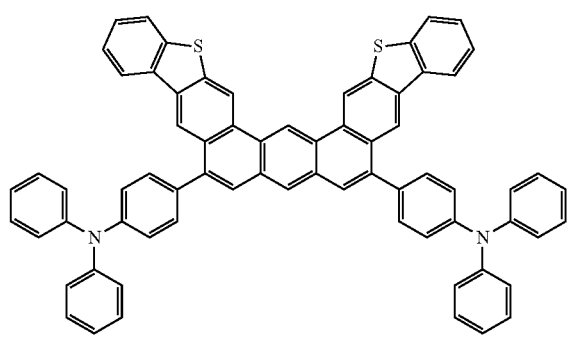
23
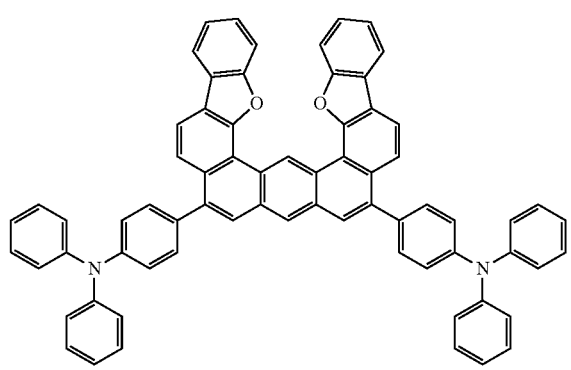
24
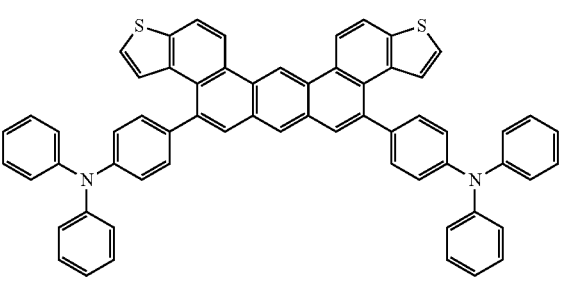
25
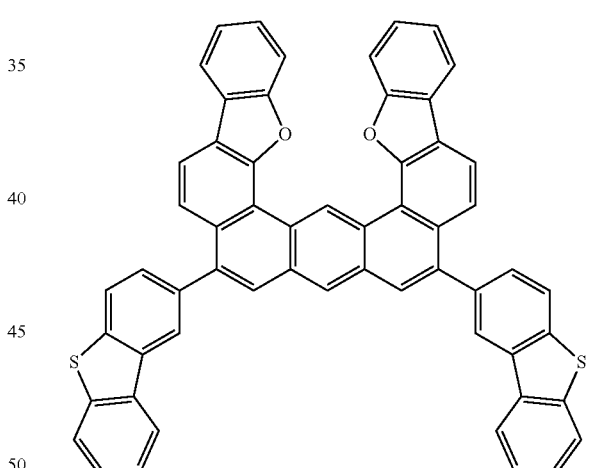
26
27
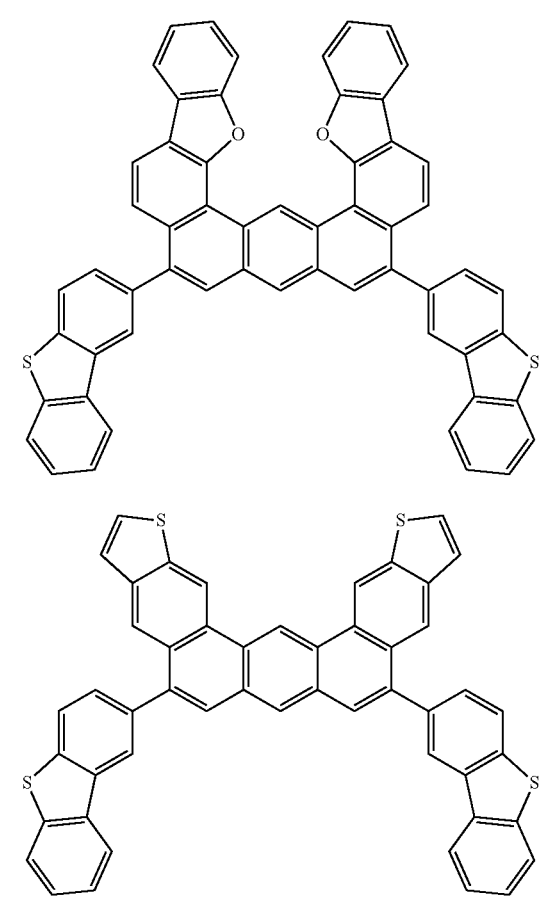

28
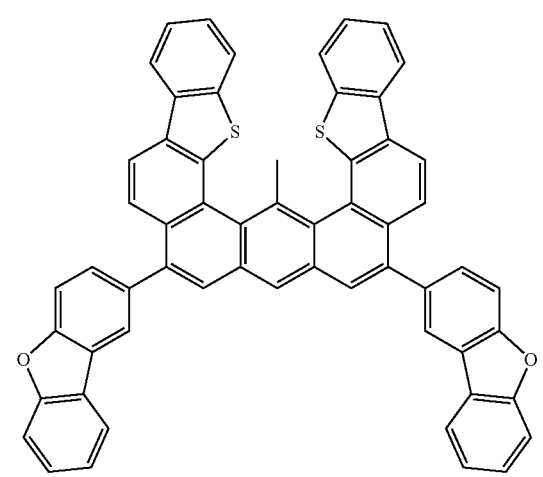
29
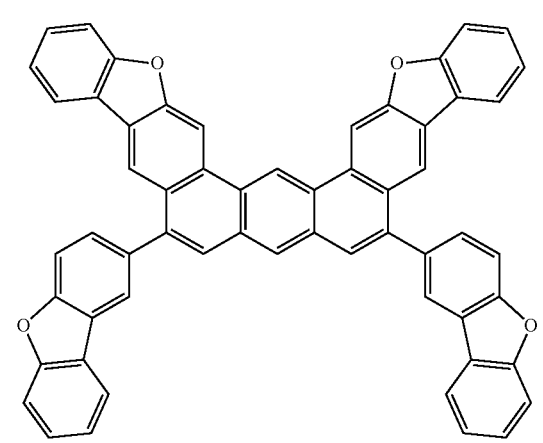
30
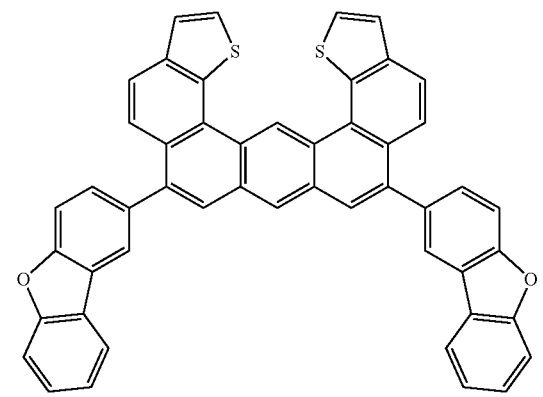
31
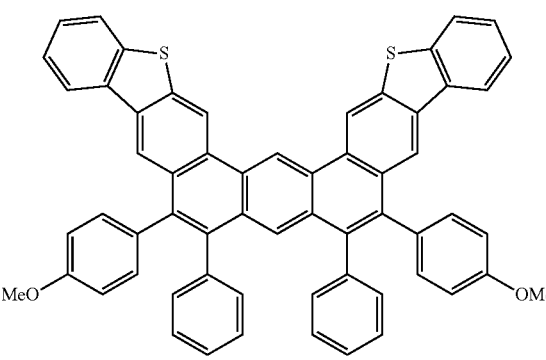
32
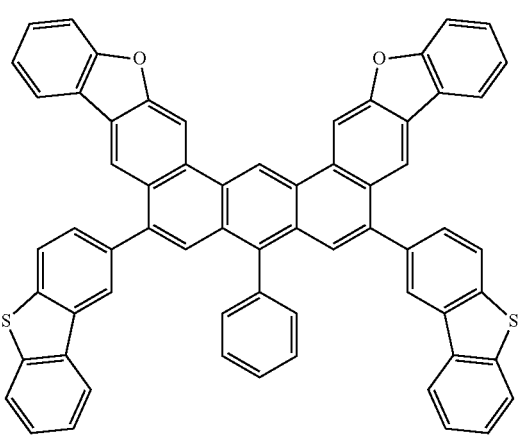
33
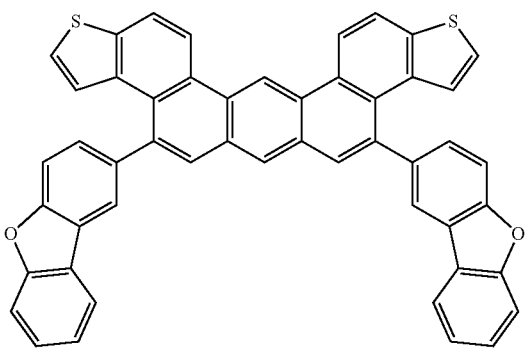
34
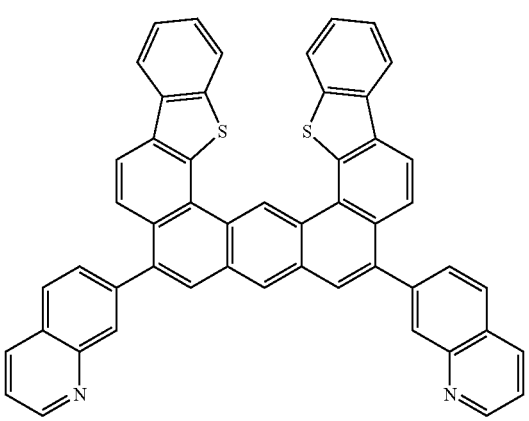
35
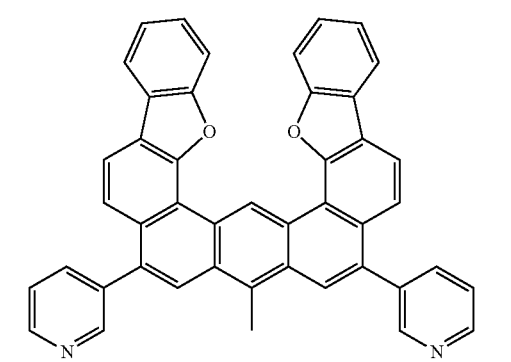

36
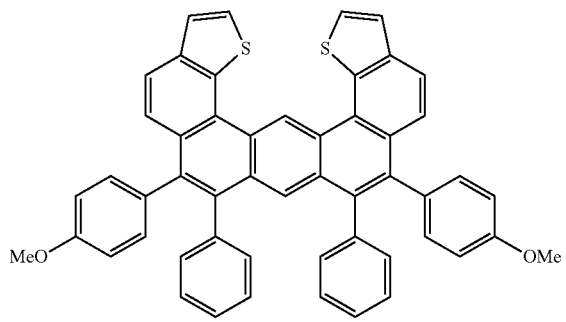
37
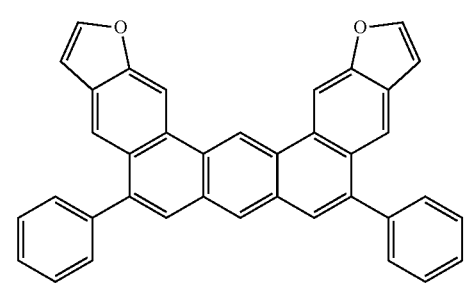
38
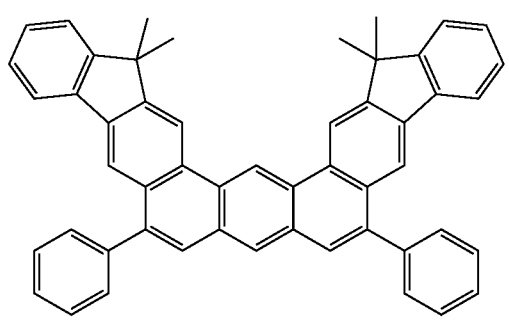
39
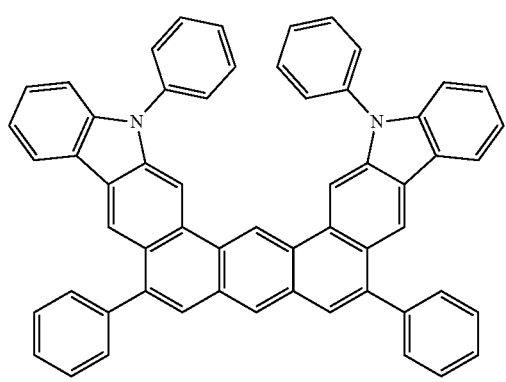
40
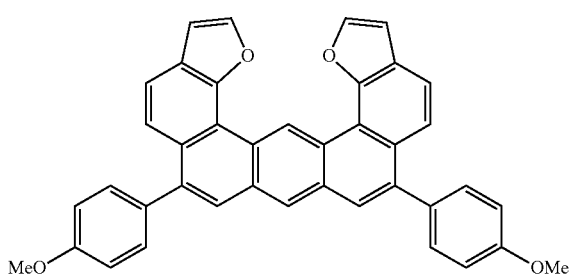
41
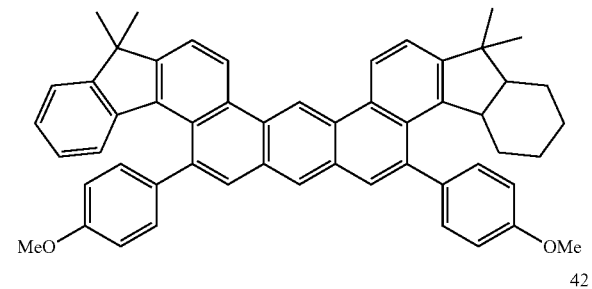
42
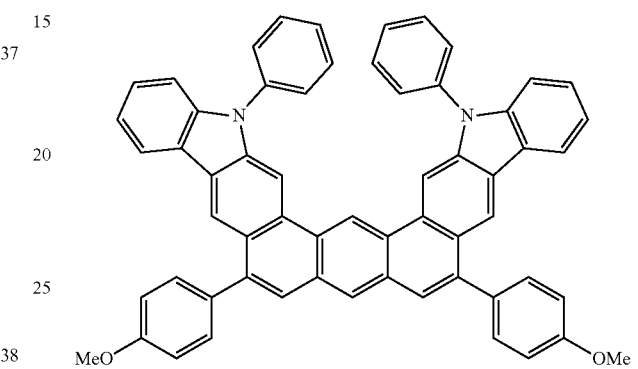
43
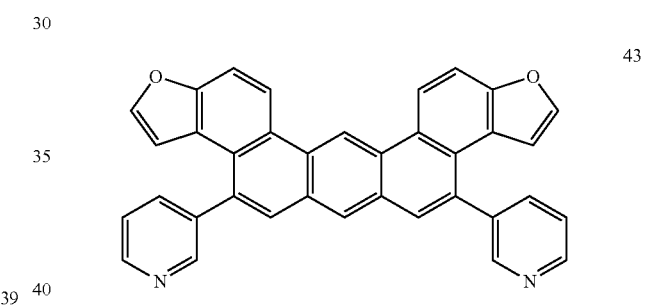
44
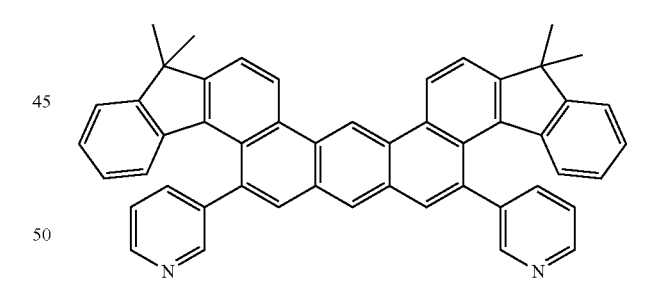
45
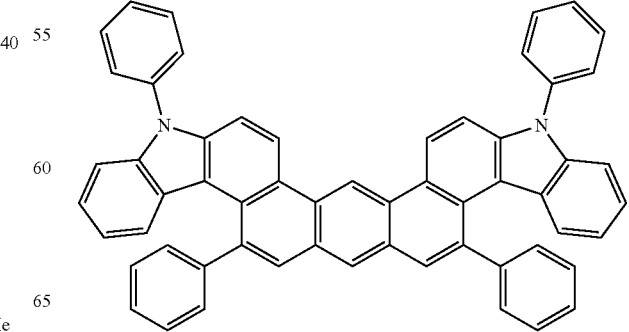

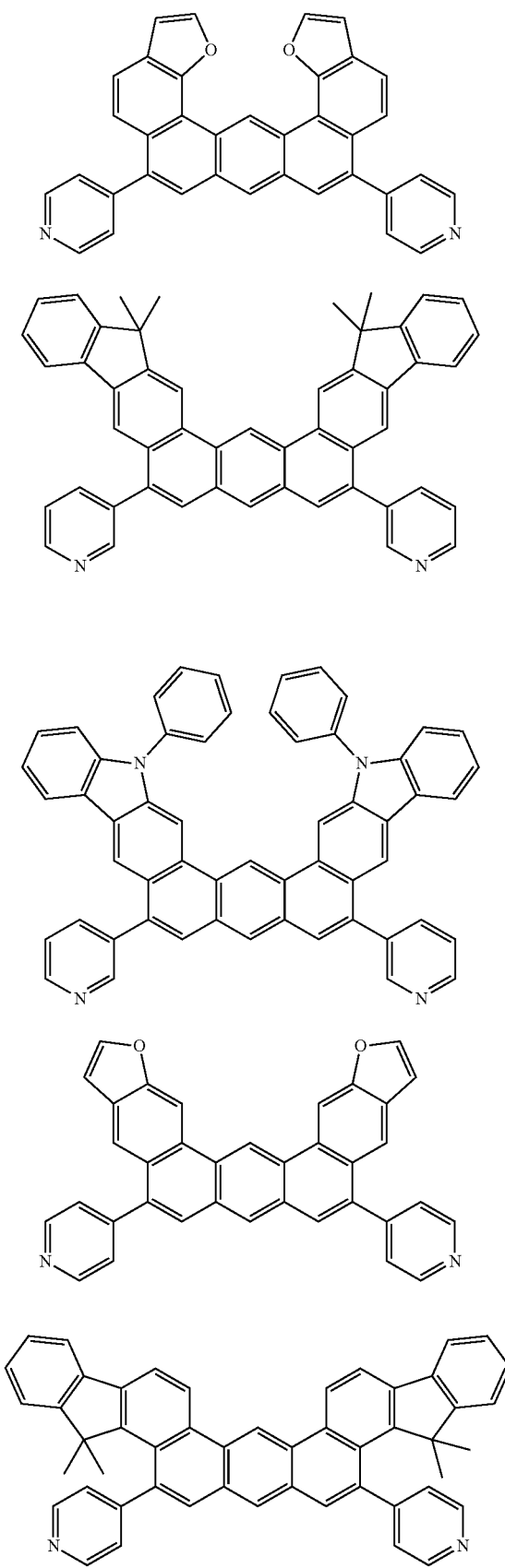
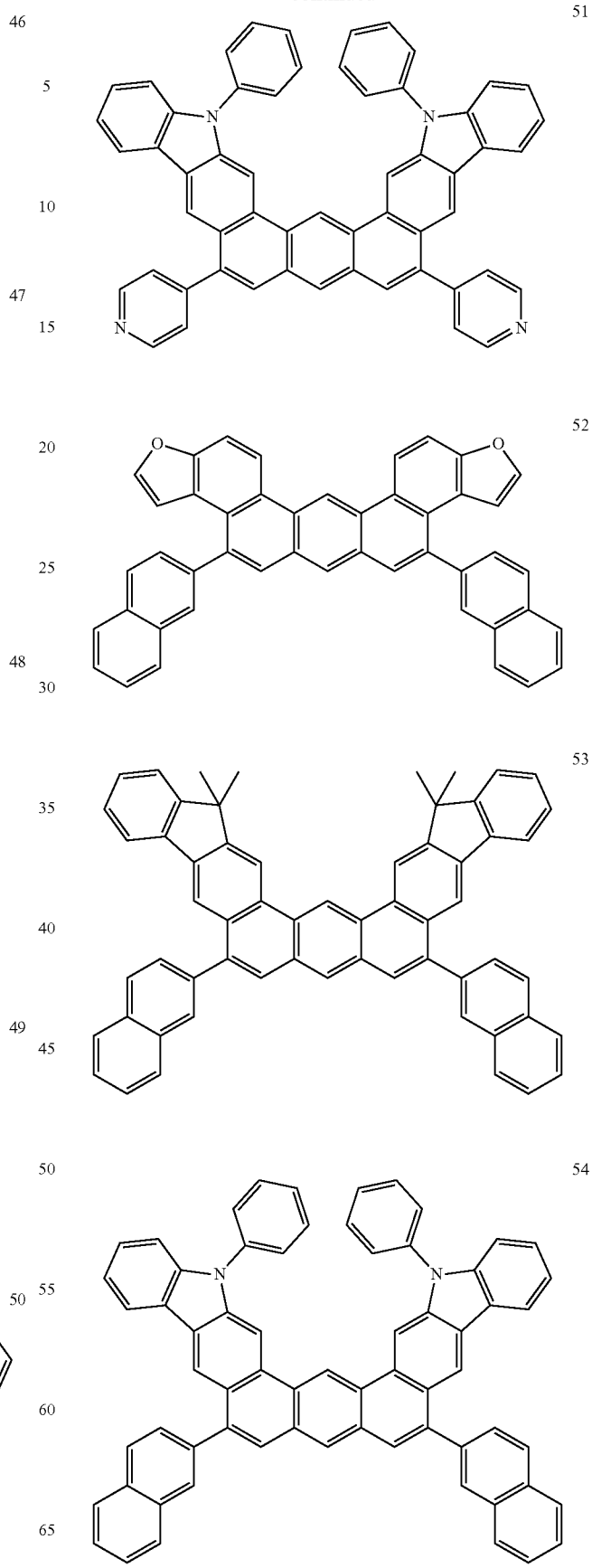

55
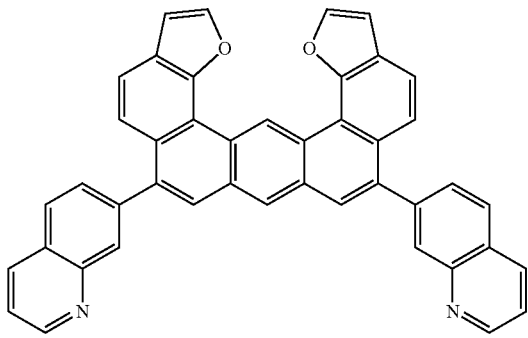
56
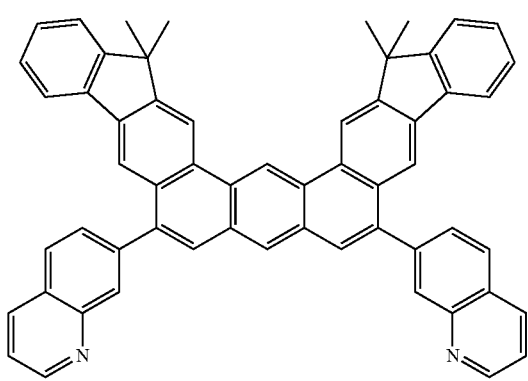
57
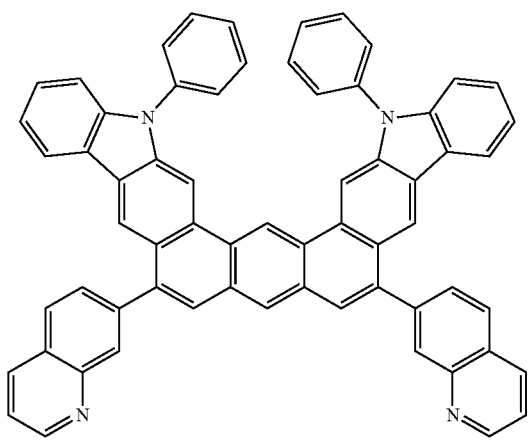
58
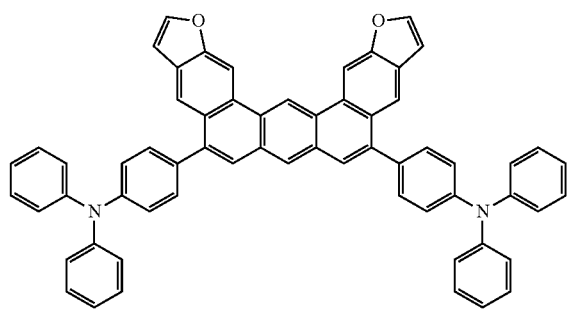
59
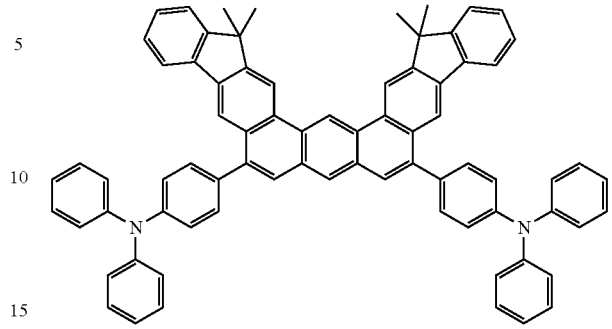
60
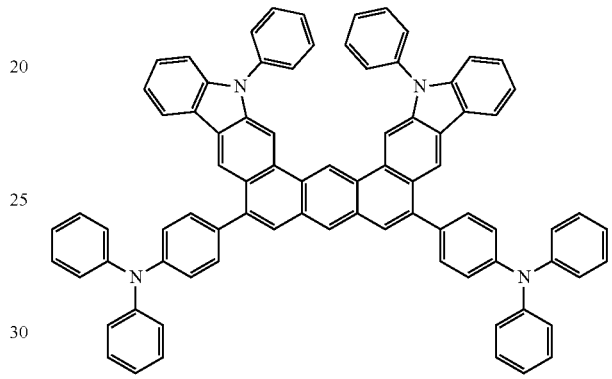
61
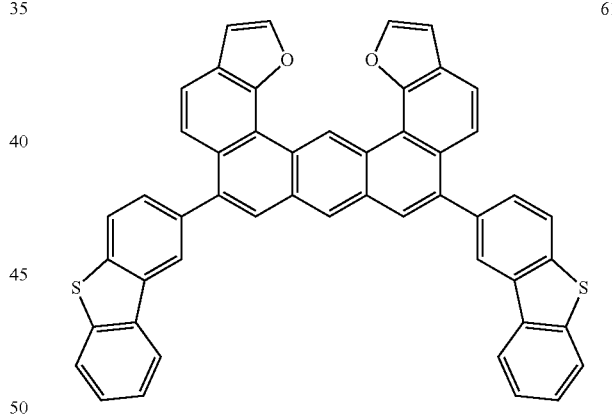
62
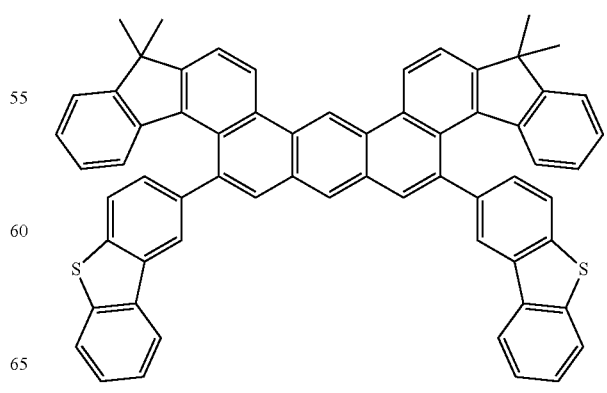

63
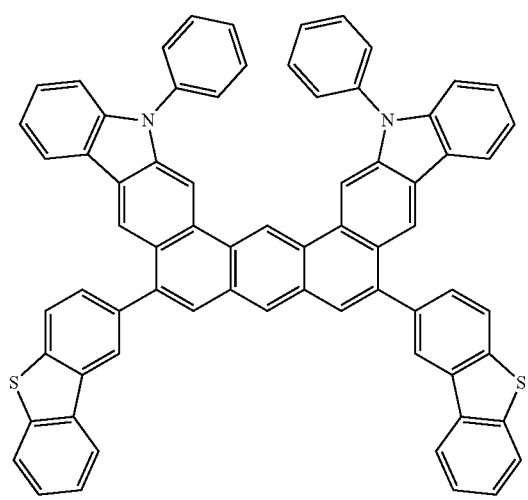
66
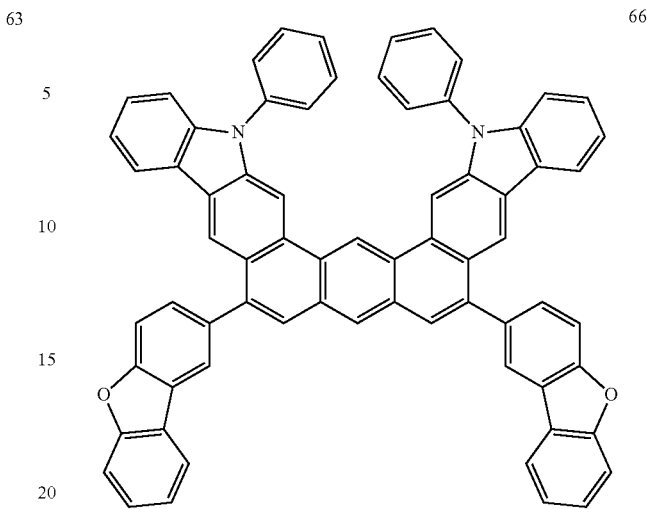
64
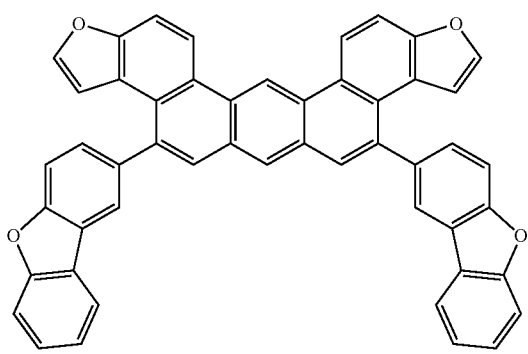
67
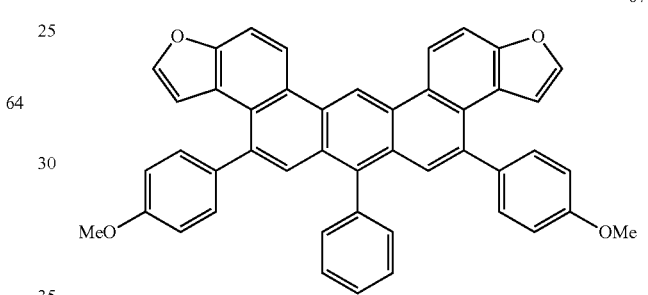
68
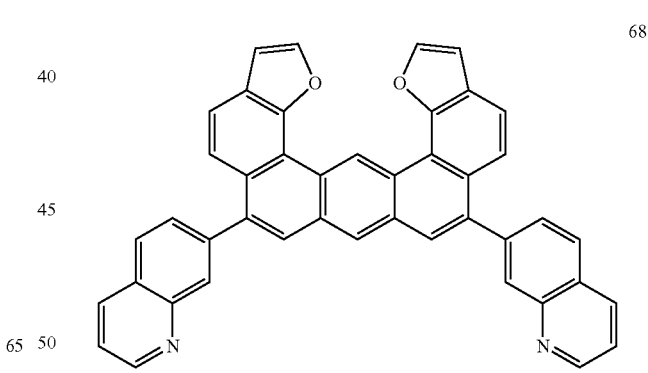
65
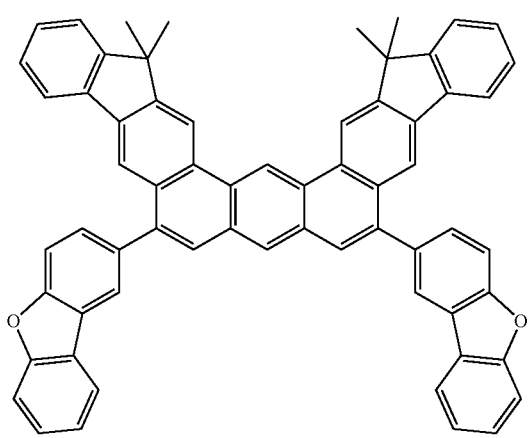
69
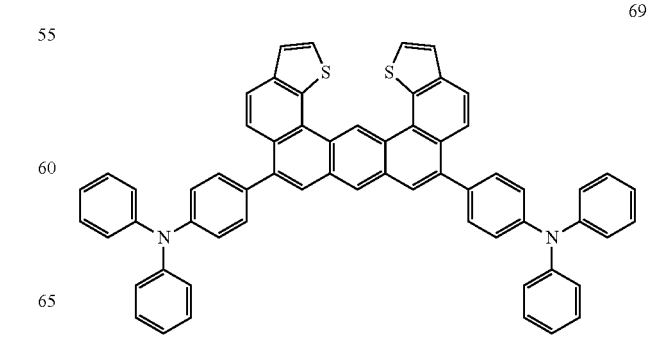

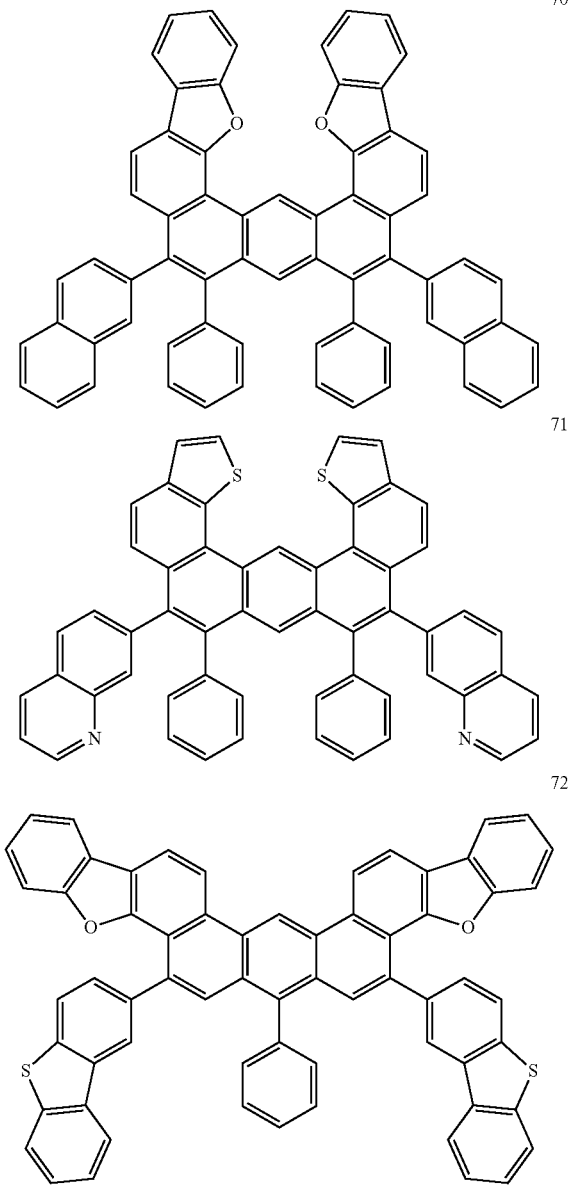

An organic light-emitting device according to another embodiment including a first electrode; a second electrode; and an organic layer disposed between the first electrode and the second electrode, wherein the organic layer includes the condensation compound of Formula 1, 2, or 3 described above.

The organic layer may include at least one layer selected from among a hole injection layer (HIL), a hole transport layer (HTL), a functional layer having both hole injection and hole transport capabilities (hereinafter, "H-functional layer"), a buffer layer, an electron blocking layer, an emission layer (EML), a hole blocking layer (HBL), an electron transport layer (ETL), an electron injection layer (EIL), and a functional layer having both electron injection and electron transport capabilities (hereinafter, "E-functional layer").

In some embodiments, the organic layer may be an EML, for example, a blue EML or a green EML. The condensation compound represented by Formula 1, 2, or 3 may be used as a fluorescent host, a phosphorescent host, or a fluorescent dopant.

According to an embodiment, the organic light-emitting device may include an EML, a HIL, a HTL, or a functional layer having both hole injection and hole transport capabilities, wherein the EML, the HIL, the HTL, or the functional layer having both hole injection and hole transport capabilities may include the condensation compound of Formula 1, 2, or 3 above. The EML may further include an anthracene-based compound, an arylamine-based compound, or a styryl-based compound.

According to another embodiment, the organic light-emitting device may include an EML, a HIL, a HTL, or a functional layer having both hole injection and hole transport capabilities, wherein the EML, the HIL, the HTL, or the functional layer having both hole injection and hole transport capabilities may include the condensation compound of Formula 1, 2, or 3 above. At least one of a red layer, a green layer, a blue layer, and a white layer of the EML may include a phosphorescent compound, and at least one of the HIL, the HTL, and the functional layer having both hole injection and hole transport capabilities may include a charge-generating material. The charge-generating material may be a p-type dopant. The p-type dopant may be a quinine derivative, a metal oxide or a cyano group-containing compound.

According to another embodiment, the organic layer may include an ETL. The ETL may include an electron-transporting organic compound and a metal complex. The metal complex may be a lithium (Li) complex.

The term "organic layer" as used herein refers to a single layer and/or a plurality of layers disposed between the first and second electrodes of the OLED.

The organic layer may include an EML, and the EML may include the condensation compound of Formula 1, 2, or 3 above. The organic layer may include at least one of a HIL, a HTL, and a functional layer having both hole injection and hole transport capabilities (hereinafter, "H-functional layer"); and at least one of the HIL, the HTL, and the functional layer having both hole injection and hole transport capabilities may include the condensation compound of Formula 1, 2, or 3 above.

The compound represented by Formula 1, 2, or 3 in the EML may serve as a fluorescent host or phosphorescent host. For example, the compound represented by Formula 1, 2, or 3 may serve as a blue fluorescent dopant emitting blue light. The compound represented by Formula 1, 2, or 3 in the EML may serve as a fluorescent or phosphorescent host emitting red light, green light, or blue light.

FIG. 1 is a schematic sectional view of an organic light-emitting device according to an embodiment. Hereinafter, a structure of an organic light-emitting device according to an embodiment and a method of manufacturing the same will now be described with reference to FIG. 1.

A substrate (not shown) may be any substrate that is used in existing organic light-emitting devices. In some embodiments, the substrate may be a glass substrate or a transparent plastic substrate with strong mechanical strength, thermal stability, transparency, surface smoothness, ease of handling, and water resistance.

The first electrode may be formed by depositing or sputtering a first electrode-forming material on the substrate. When the first electrode constitutes an anode, a material having a high work function may be used as the first electrode-forming material to facilitate hole injection. The first electrode may be a reflective electrode or a transmission electrode. Suitable first electrode-forming materials include transparent and conductive materials such as ITO, IZO, SnO$_2$, and ZnO. In other implementations, the first electrode may be formed as a reflective electrode using magnesium (Mg), aluminum (Al), aluminum-lithium (Al—Li), calcium (Ca), magnesium-indium (Mg-In), magnesium-silver (Mg—Ag), or the like.

The first electrode may have a single-layer structure or a multi-layer structure including at least two layers. For example, the first electrode may have a three-layered structure of ITO/Ag/ITO.

An organic layer is formed on the first electrode.

The organic layer may include a HIL, a HTL, a buffer layer (not shown), an

EML, an ETL, or an EIL.

The HIL may be formed on the first electrode by vacuum deposition, spin coating, casting, Langmuir-Blodgett (LB) deposition, or the like.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range of about 2,000 rpm to about 5,000 rpm, and a temperature at which heat treatment is performed to remove a solvent after coating may be in the range of about 80° C. to about 200° C.

The HIL may be formed of any material that is commonly used to form a HIL.

Non-limiting examples of the material that can be used to form the HIL are N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris (3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

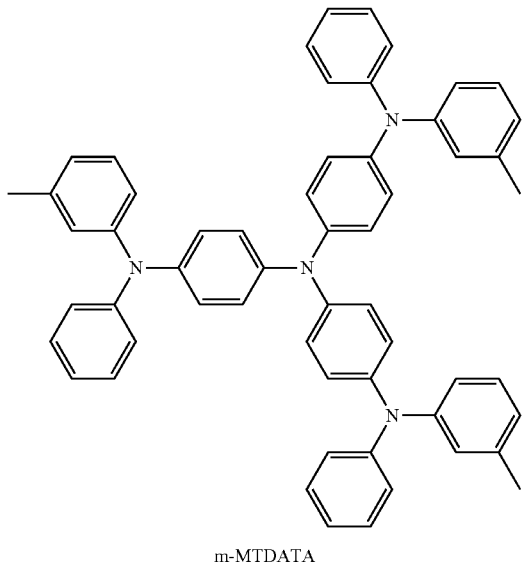

m-MTDATA

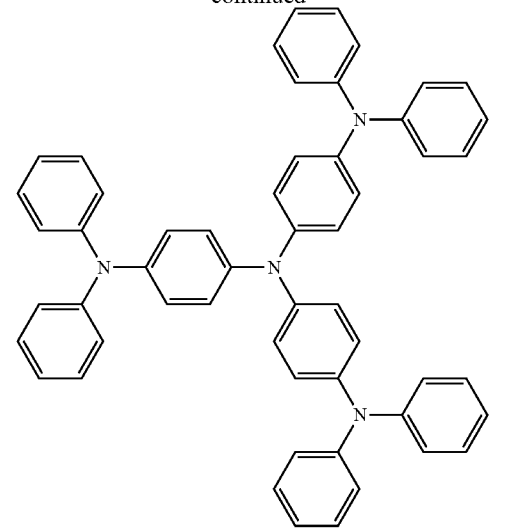

TDATA

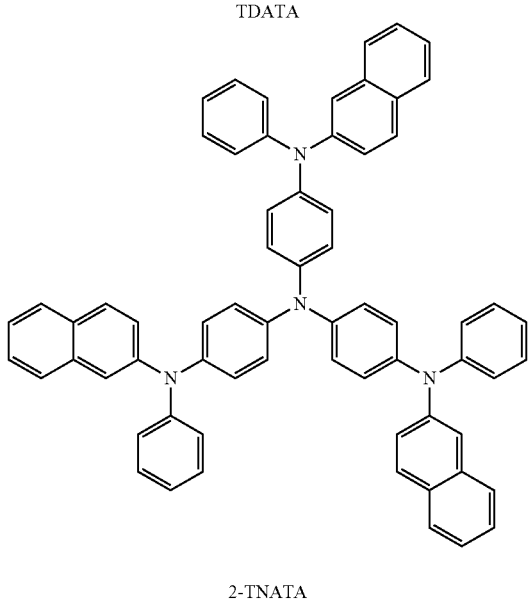

2-TNATA

The thickness of the HIL may be about 100 Å to about 10,000 Å, and, for example, may be from about 100 Å to about 1,000 Å. When the thickness of the HIL is within these ranges, the HIL may have excellent hole injecting ability without a substantial increase in driving voltage.

A HTL may be formed on the HIL by using vacuum deposition, spin coating, casting, Langmuir-Blodgett (LB) deposition, or the like. When the HTL is formed using vacuum deposition or spin coating, the conditions for deposition and coating may be selected from almost the same conditions for the formation of the HIL, though the conditions for the deposition and coating may vary according to the material that is used to form the HTL.

The HTL may be formed of any known hole-transporting materials. Non-limiting examples of suitable known HTL forming materials are carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4', 4"-tris(N-carbazolyl)triphenylamine (TCTA), and N,N'-di(1-naphthyl)-N,N'-diphenylbenzidine) (NPB).

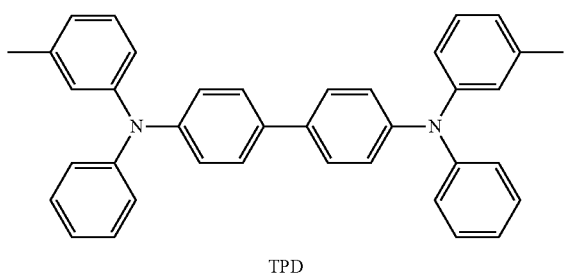

TPD

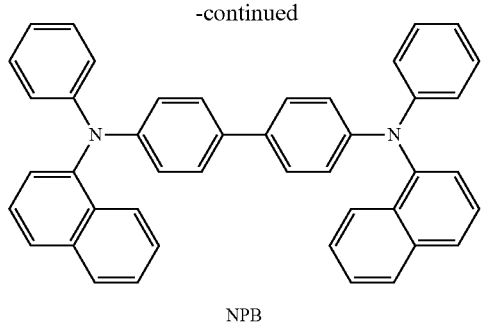

NPB

The thickness of the HTL may be from about 50 Å to about 2,000 Å, for example, may be from about 100 Å to about 1,500 Å. When the thickness of the HTL is within these ranges, the HTL may have excellent hole transporting ability without a substantial increase in driving voltage.

The H-functional layer (having both hole injection and hole transport capabilities) may contain at least one material from each group of the HIL materials and HTL materials. The thickness of the H-functional layer may be from about 500 Å to about 10,000 Å, for example, may be from about 100 Å to about 1,000 Å. When the thickness of the H-functional layer is within these ranges, the H-functional layer may have excellent hole injection and transport capabilities without a substantial increase in driving voltage.

In some embodiments, at least one of the HIL, HTL, and H-functional layer may include at least one of a compound of Formula 300 below and a compound of Formula 350 below:

<Formula 300>

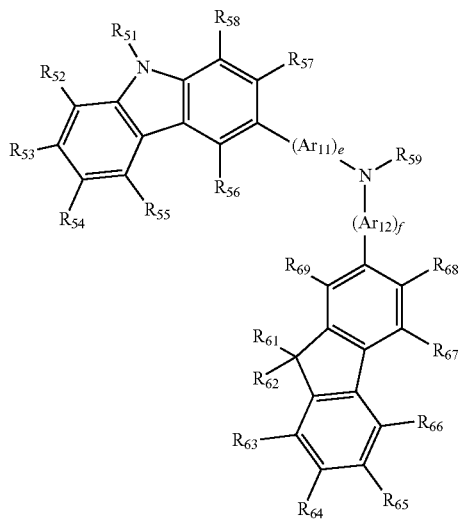

<Formula 350>

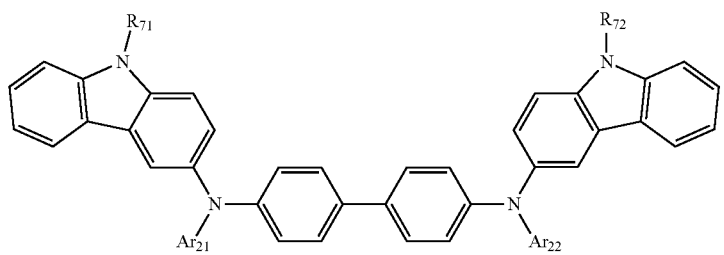

In Formulae 300 and 350, $Ar_{11}$, $Ar_{12}$, $Ar_{21}$ and $Ar_{22}$ may each independently be a substituted or unsubstituted C5-C60 arylene group. $Ar_{11}$, $Ar_{12}$, $Ar_{21}$ and $Ar_{22}$ are as defined above in conjunction with $L_1$, and thus a detailed description thereof will not be repeated here.

In Formula 300, e and f may each independently be an integer from 0 to 5, for example, may be 0, 1, or 2. For example, e may be 1, and f may be 0, but e and f are not limited thereto.

In Formulae 300 and 350, $R_{51}$ to $R_{58}$, $R_{61}$ to $R_{69}$, and $R_{71}$ to $R_{72}$ may each independently be one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C3-C60 cycloalkyl group, a substituted or unsubstituted C5-C60 aryl group, a substituted or unsubstituted C5-C60 aryloxy group, and a substituted or unsubstituted C5-C60 arylthio group. Non-limiting examples of $R_{51}$ to $R_{58}$, $R_{61}$ to $R_{69}$, $R_{71}$, and $R_{72}$ may each independently be one of a hydrogen atom; a deuterium atom; a halogen atom; a hydroxyl group; a cyano group; a nitro group; an amino group; an amidino group; hydrazine; hydrazone; a carboxyl group or a salt thereof; a sulfonic acid group or a salt thereof; a phosphoric acid or a salt thereof; a C1-C10 alkyl group (for example, a methyl group, an ethyl group, a propyl group, a butyl group, a pentyl group, a hexyl group, or the like); a C1-C10 alkoxy group (for example, a methoxy group, an ethoxy group, a propoxy group, a butoxy group, a pentoxy group, or the like); a C1-C10 alkyl group and a C1-C10 alkoxy group that are substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, and a phosphoric acid or a salt thereof; a phenyl group; a naphthyl group; an anthryl group; a fluorenyl group; a pyrenyl group; and a phenyl group, a naphthyl group, an anthryl group, a fluorenyl group, and a pyrenyl group that are substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a C1-C10 alkyl group, and a C1-C10 alkoxy group.

In Formula 300, $R_{59}$ may each independently be a phenyl group, a naphthyl group, an anthryl group, a biphenyl group, or a pyridyl group; or a phenyl group, a naphthyl group, an anthryl group, a biphenyl group, or a pyridyl group that are substituted with at least one of a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted C1-C20 alkyl group, and a substituted or unsubstituted C1-C20 alkoxy group.

In an embodiment the compound of Formula 300 may be a compound represented by Formula 300A below:

<Formula 300A>

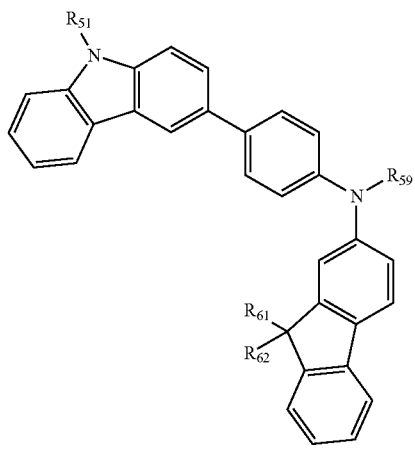

$R_{51}$, $R_{60}$, $R_{61}$ and $R_{59}$ in Formula 300A are as defined above, and thus a detailed description thereof will not be repeated here.

For example, at least one of the HIL, HTL, and H-functional layer may include at least one of compounds represented by Formulae 301 to 320 below, but is not limited thereto:

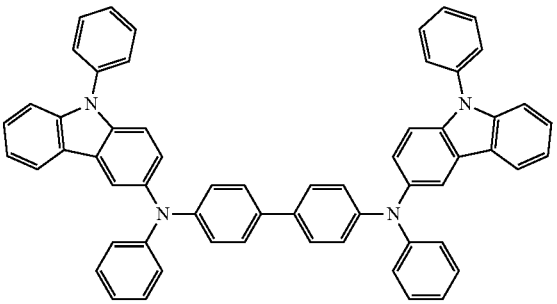

301

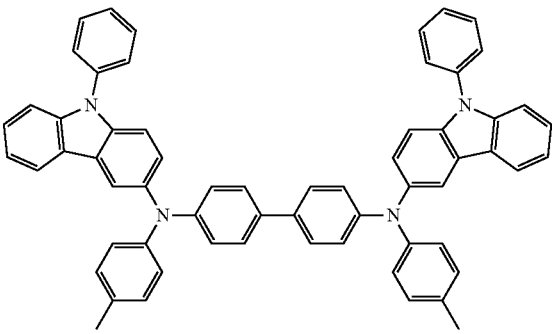

302

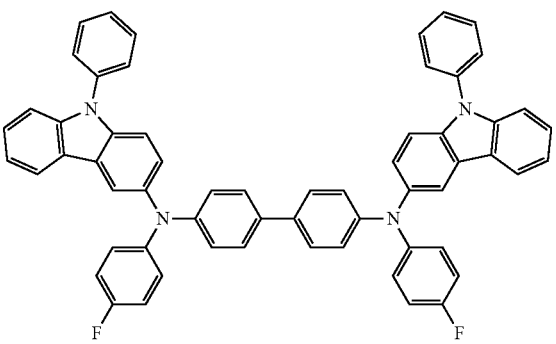

303

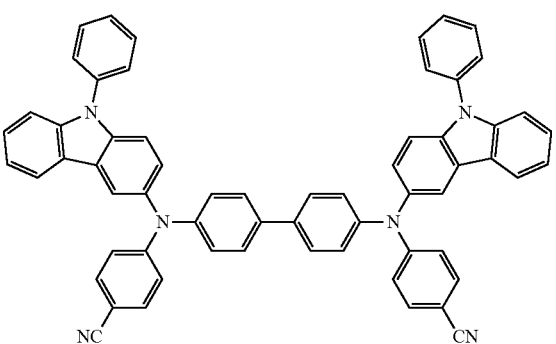

304

305
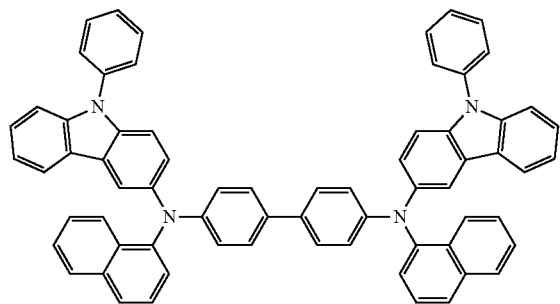
306
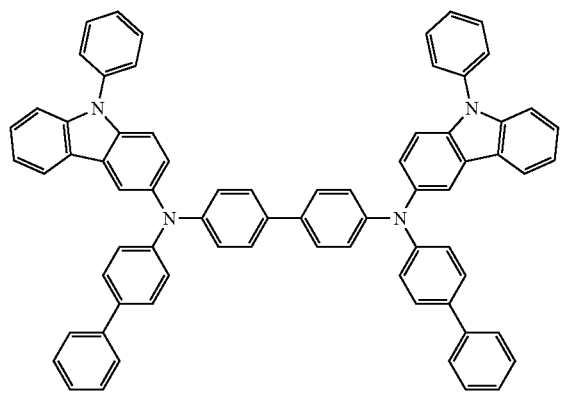
307
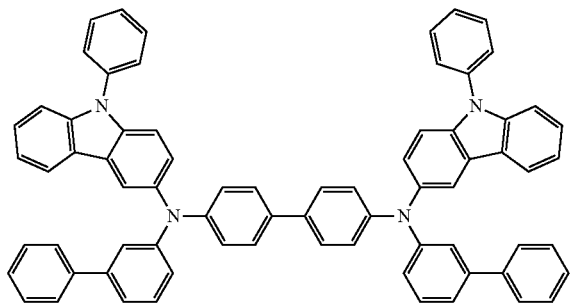
308
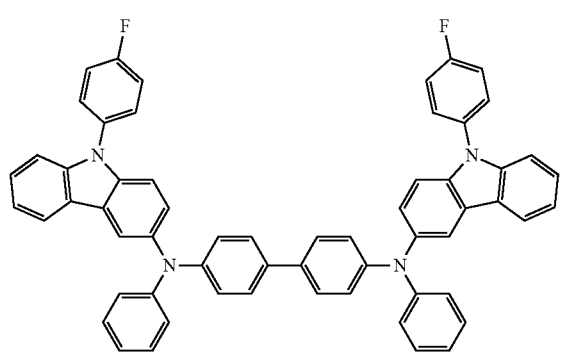
309
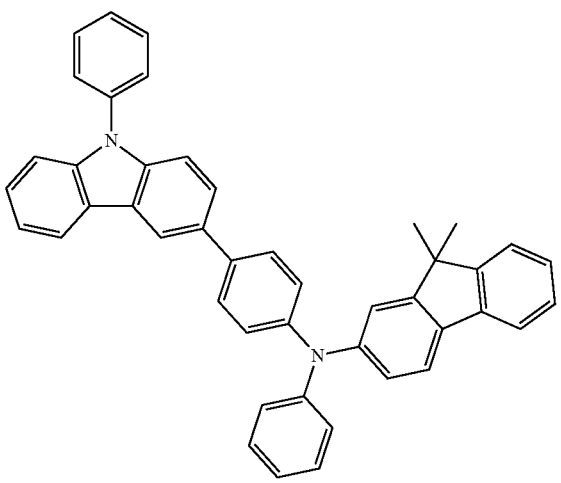
310
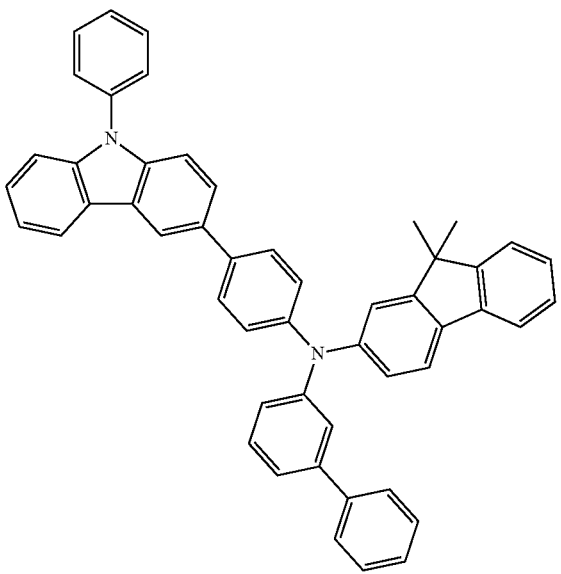

311
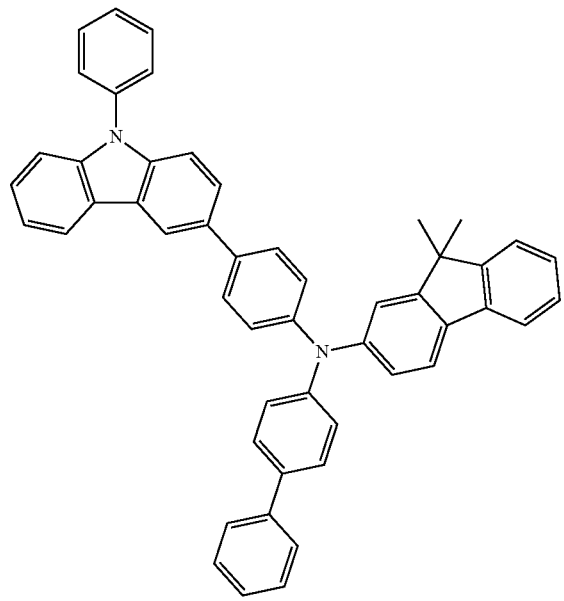
312
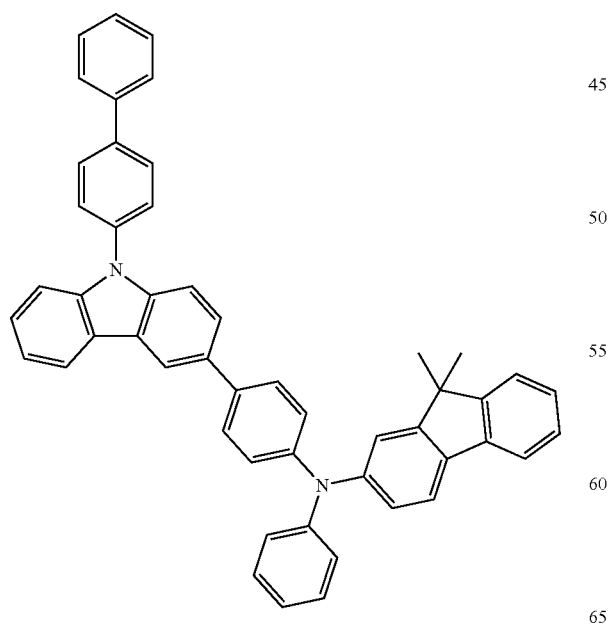
313
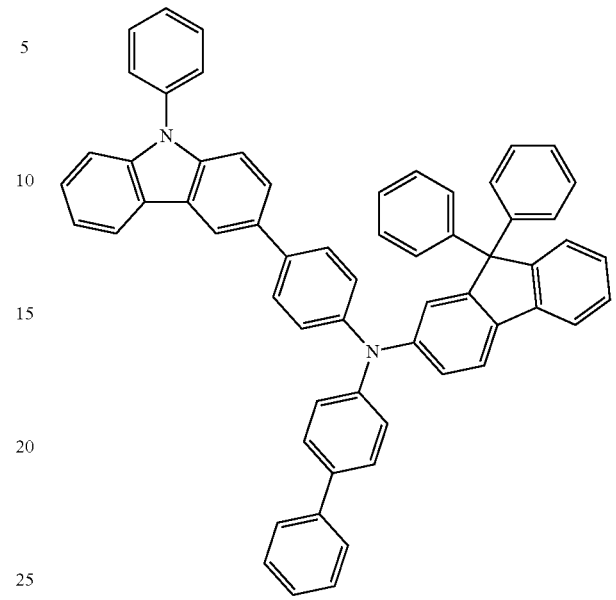
314
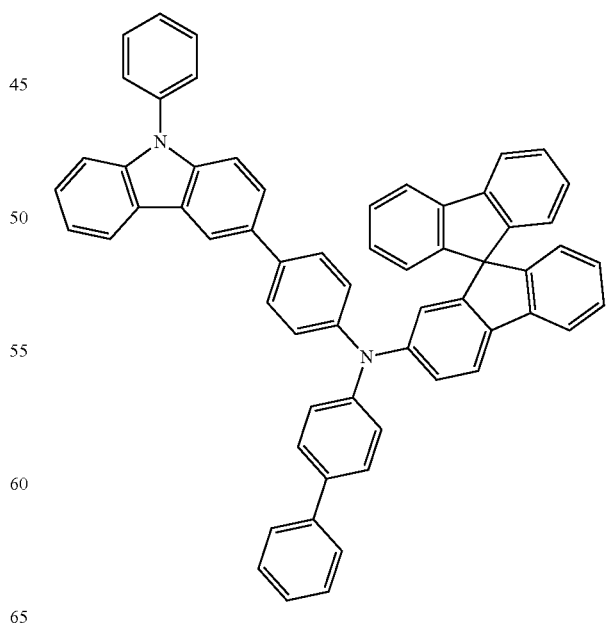

-continued
315
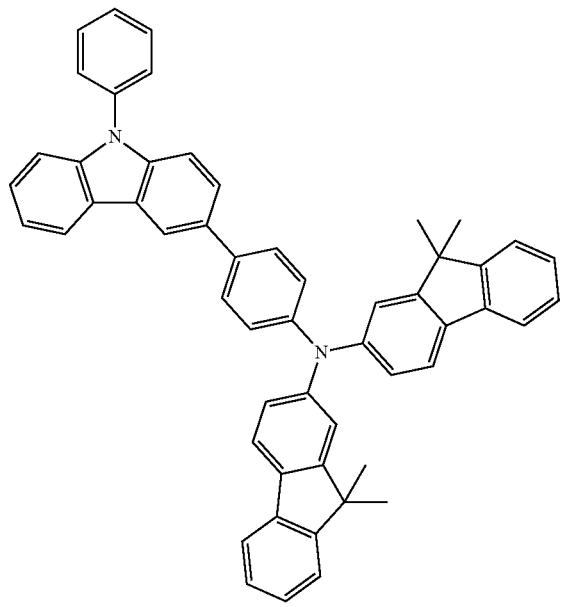
316
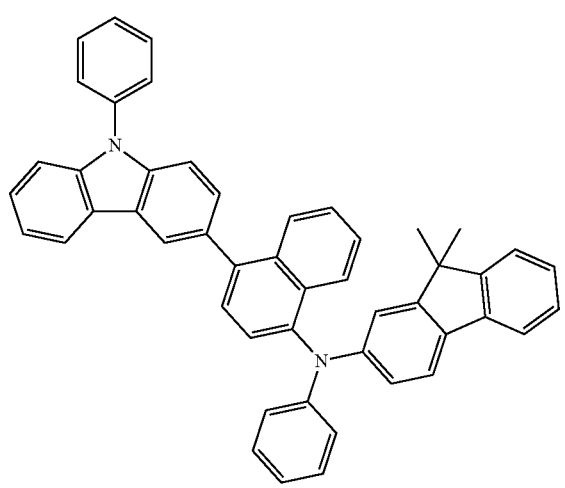
317
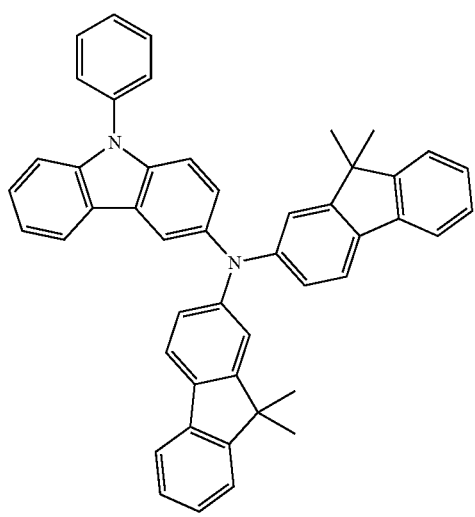
-continued
318
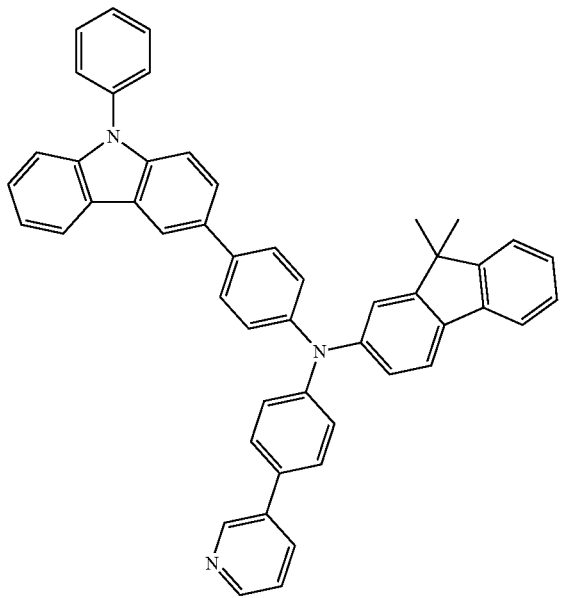
319
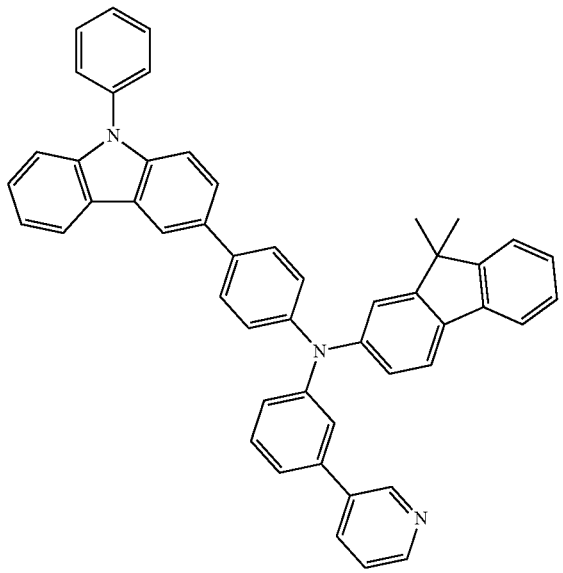

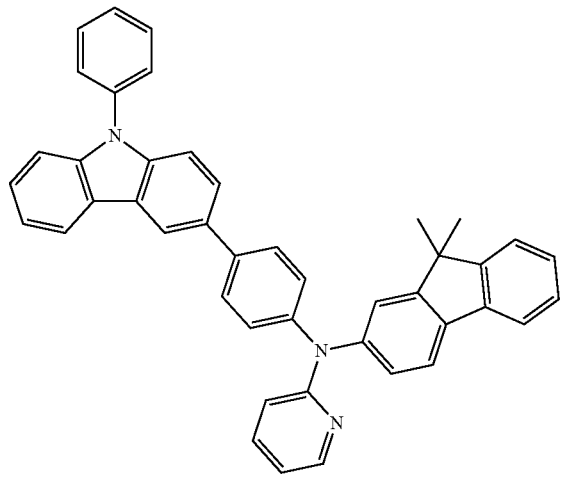

At least one of the HIL, HTL, and H-functional layer may further include a charge-generating material for improved layer conductivity, in addition to a known hole injecting material, hole transport material, and/or material having both hole injection and hole transport capabilities as described above.

The charge-generating material may be, for example, a p-dopant. The p-dopant may be one of a quinine derivative, a metal oxide, and a compound containing a cyano group, as examples. Non-limiting examples of the p-dopant are quinone derivatives such as tetracyanoquinonedimethane (TCNQ), 2,3,5,6-tetrafluoro-tetracyano-1,4-benzoquinonedimethane (F4TCNQ), and the like; metal oxides such as tungsten oxide, molybdenum oxide, and the like; and cyano-containing compounds such as Compound 200 below:

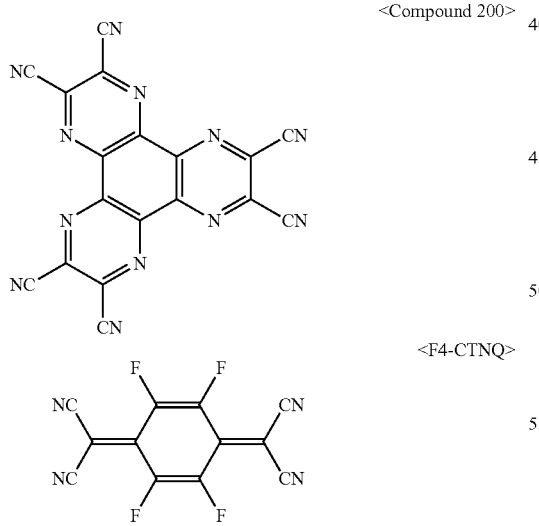

When the HIL, HTL, or H-functional layer further includes a charge-generating material, the charge-generating material may be homogeneously dispersed or inhomogeneously distributed in the HIL, HTL, or H-functional layer.

A buffer layer may be disposed between at least one of the HIL, HTL, and H-functional layer, and the EML. The buffer layer may compensate for an optical resonance distance of light according to a wavelength of the light emitted from the EML, and thus may increase efficiency. The buffer layer may include any suitable hole injecting material or hole transporting material. In other implementations, the buffer layer may include the same material as one of the materials included in the HIL, HTL, and H-functional layer that underlie the buffer layer.

Then, an EML may be formed on the HTL, H-functional layer, or buffer layer by vacuum deposition, spin coating, casting, Langmuir-Blodgett (LB) deposition, or the like. When the EML is formed using vacuum deposition or spin coating, the deposition and coating conditions may be similar to those for the formation of the HIL, though the conditions for deposition and coating may vary according to the material that is used to form the EML.

The EML may include the condensation compound of Formula 1, 2 or 3 according to an embodiment.

The EML may further include a host, in addition to the condensation compound of Formula 1, 2 or 3.

Non-limiting examples of the host include Alq3, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), dmCBP (see formula below), and Compounds 501 to 509 below:

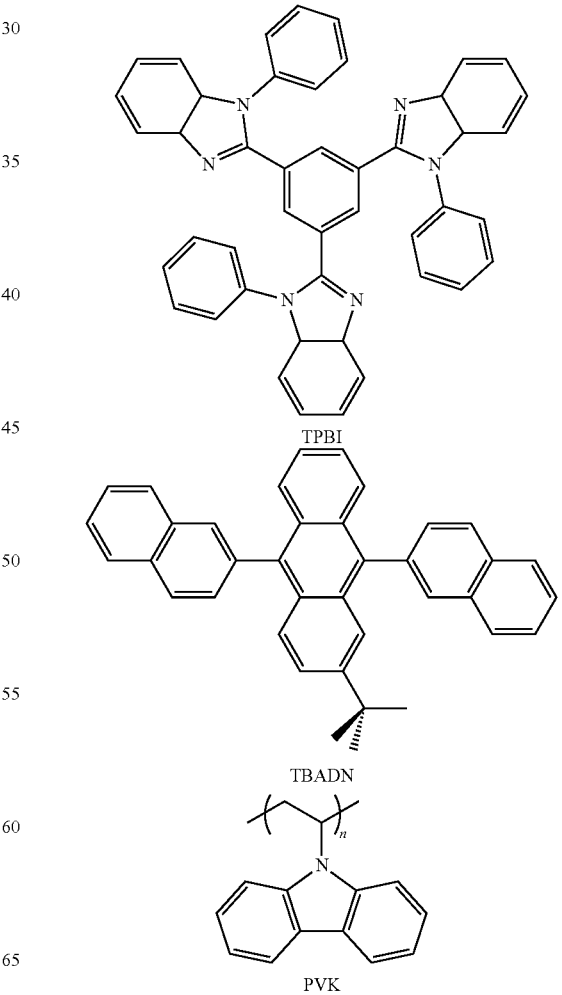

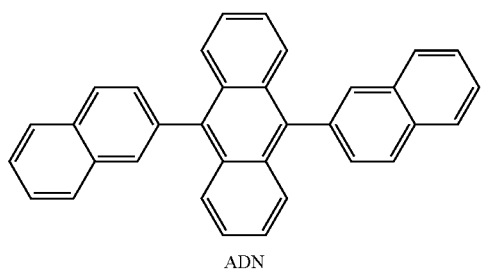
ADN
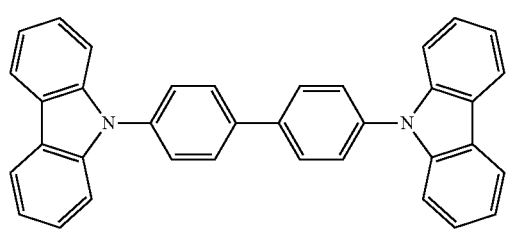
CBP
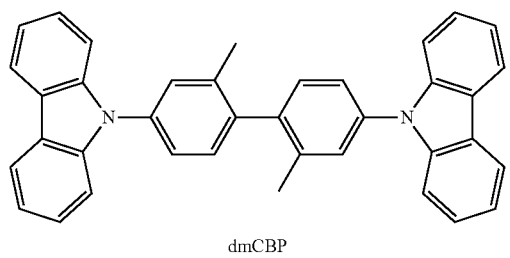
dmCBP
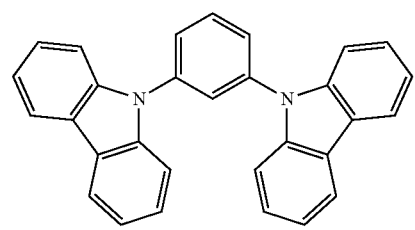
501
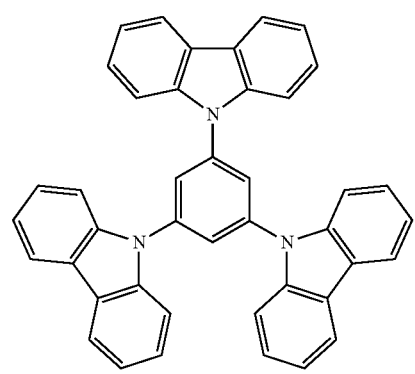
502
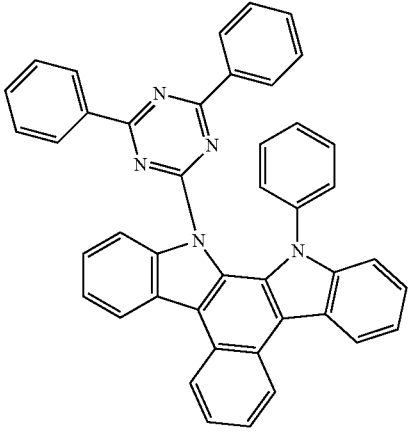
503
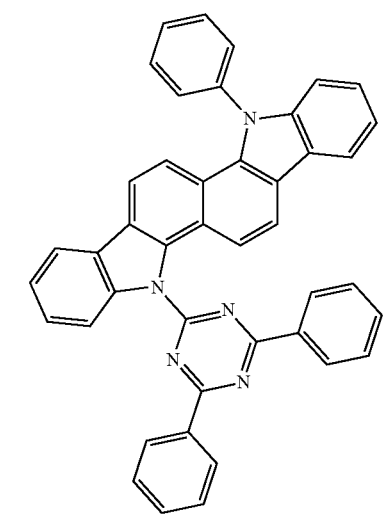
504
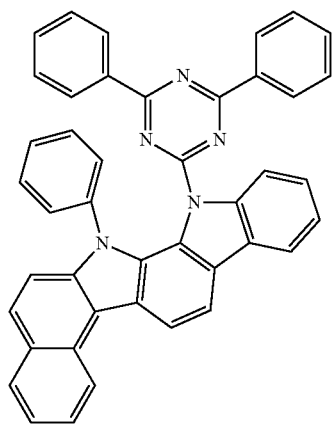
505

-continued

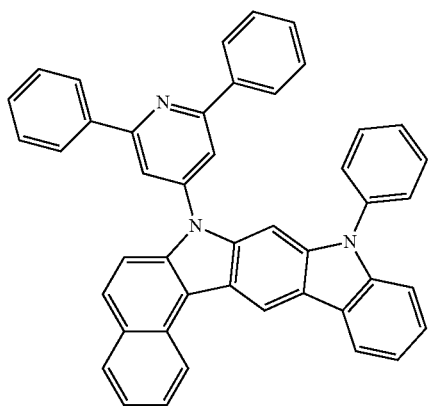
506

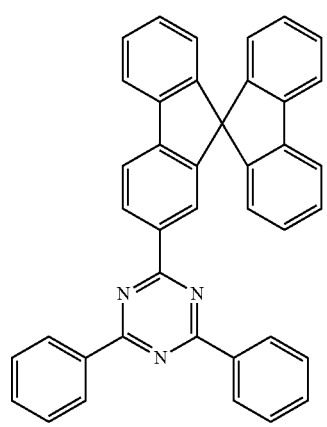
507

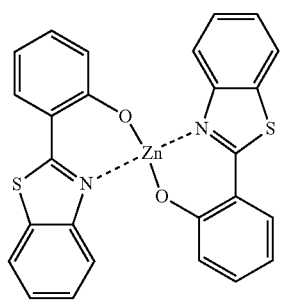
508

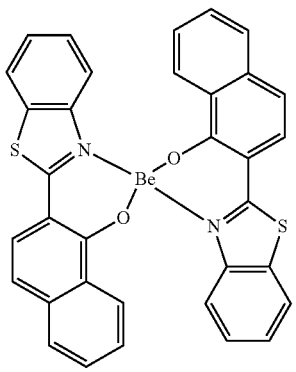
509

In other implementations, an anthracene-based compound represented by Formula 400 below may be used as the host:

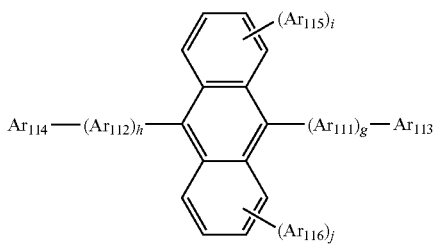

<Formula 400>

In Formula 400, $Ar_{111}$ and $Ar_{112}$ are each independently a substituted or unsubstituted C5-C60 arylene group; $Ar_{113}$ to $Ar_{116}$ are each independently a substituted or unsubstituted C1-C10 alkyl group or a substituted or unsubstituted C5-C60 aryl group; and g, h, I, and j are each independently an integer from 0 to 4.

As non-limiting examples, $Ar_{111}$ and $Ar_{112}$ in Formula 400 may each independently be a phenylene group, a naphthylene group, a phenanthrenylene group, or a pyrenylene group; or a phenylene group, a naphthylene group, a phenanthrenylene group, a fluorenyl group, or a pyrenylene group that are substituted with at least one of a phenyl group, a naphthyl group, and an anthryl group.

In Formula 400 above, g, h, i, and j may each independently be 0, 1, or 2.

As non-limiting examples, $Ar_{113}$ to $Ar_{116}$ in Formula 400 may each independently be one of a C1-C10 alkyl group substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group that are substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a C1-C60 alkyl group, a C2-C60 alkenyl group, a C2-C60 alkynyl group, a C1-C60 alkoxy group, a phenyl group, a naphthyl group, an anthryl group, a pyrenyl group, a phenanthrenyl group, and a fluorenyl group; and

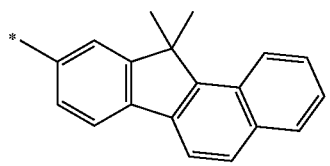 [SMILES: Cc1ccc2c(c1)C(C)(C)c1c-2ccc2ccccc12]

For example, the anthracene compound of Formula 400 above may be one of the compounds represented by the following formulae:

-continued
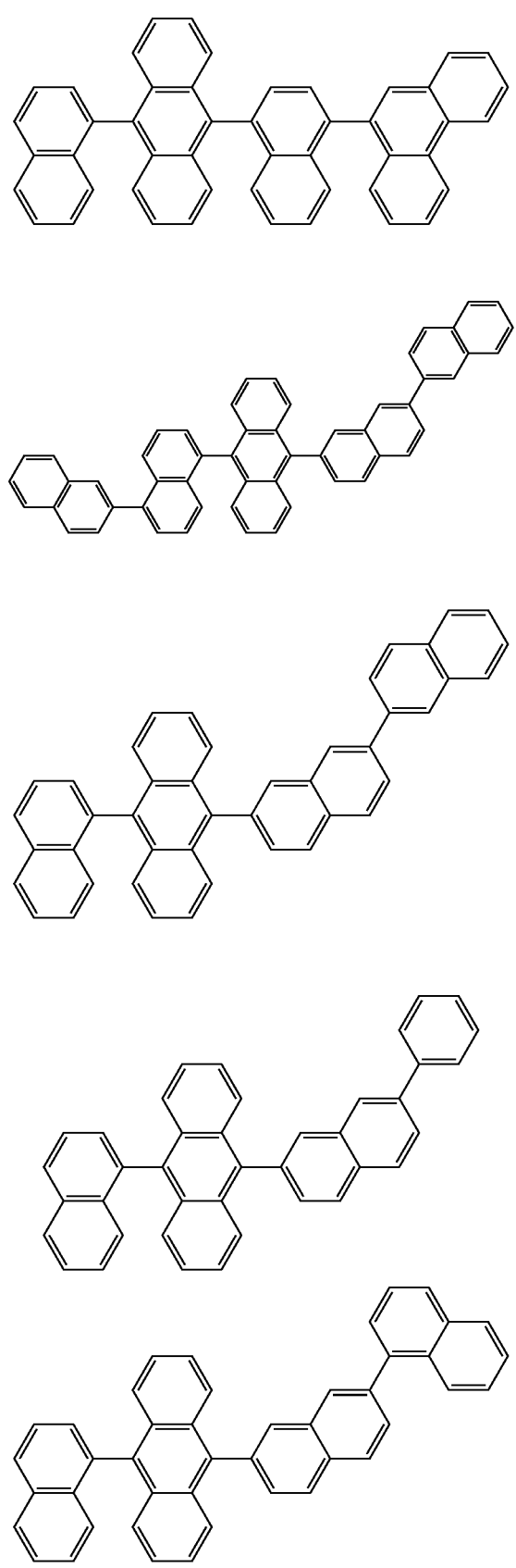
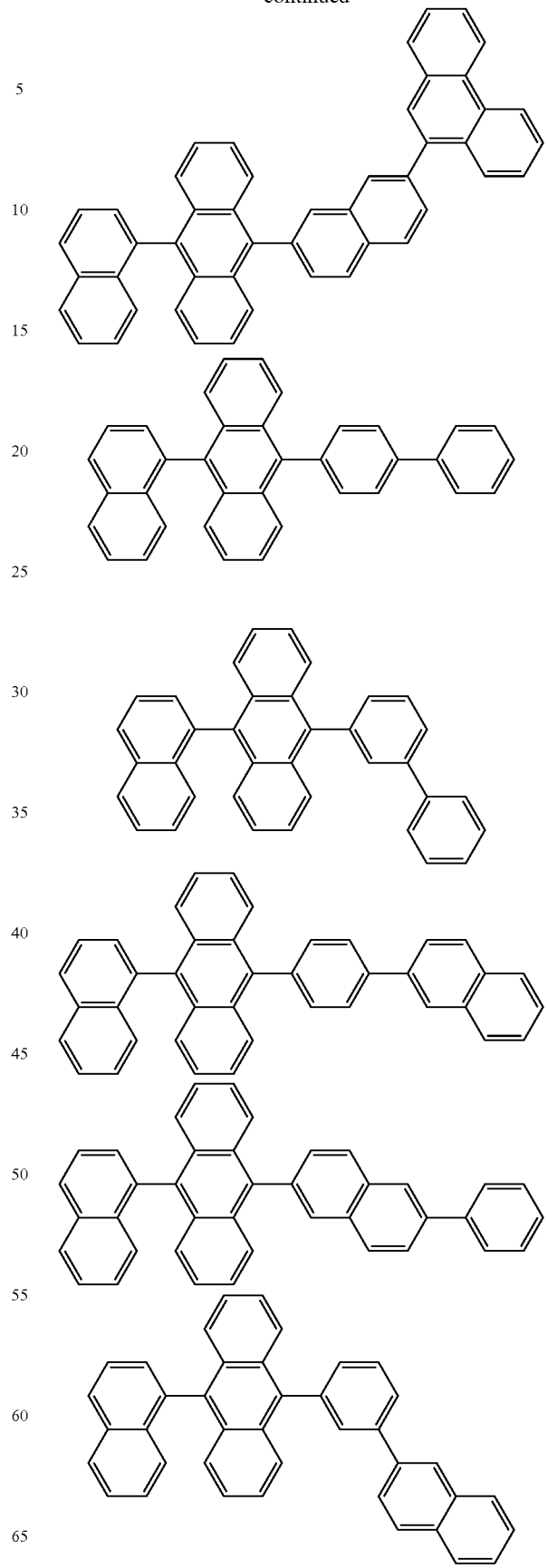

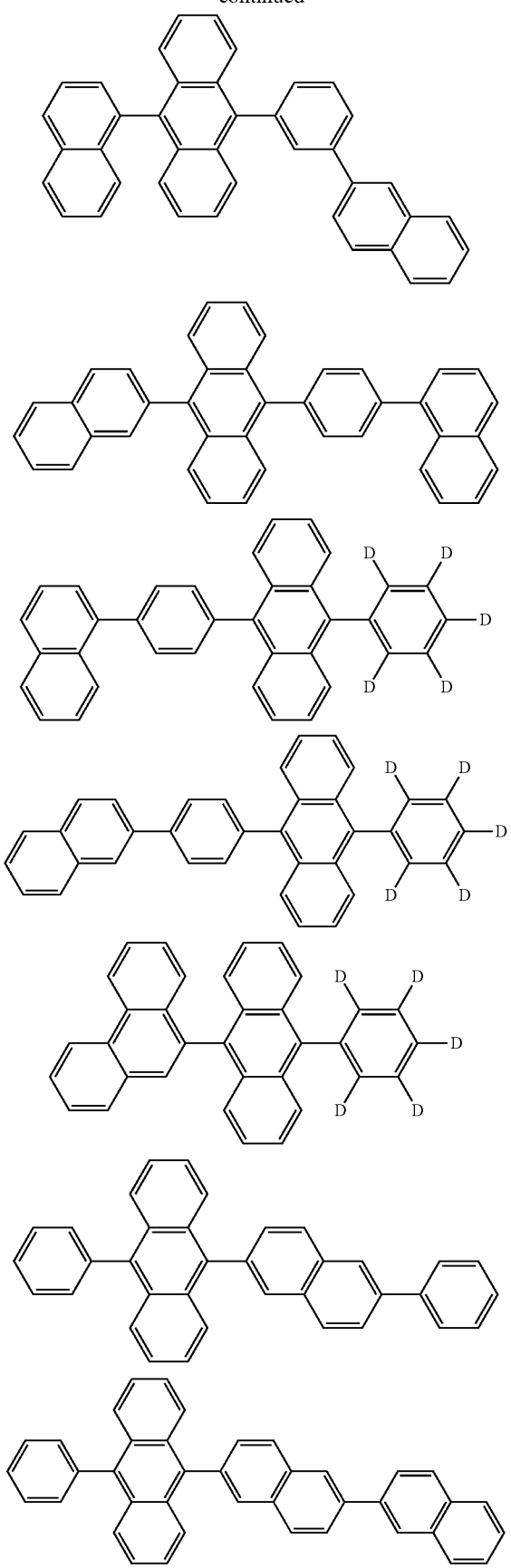

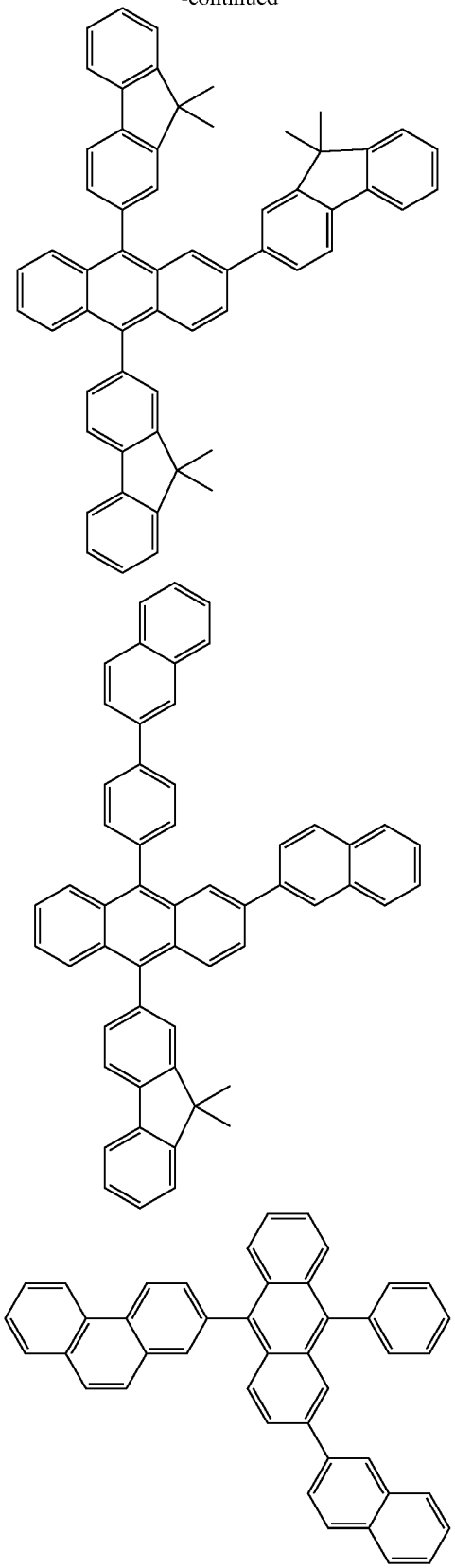

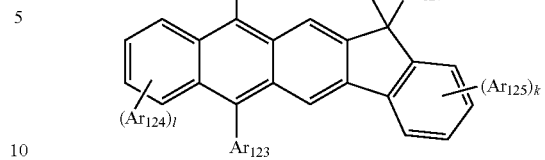
<Formula 401>

Ar₁₂₂ to Ar₁₂₅ in Formula 401 above may be defined as described above in conjunction with Ar₁₁₃ of Formula 400, and thus detailed descriptions thereof will not be repeated here.

Ar₁₂₆ and Ar₁₂₇ in Formula 401 above may each independently be a C1-C10 alkyl group, for example, a methyl group, an ethyl group, or a propyl group.

In Formula 401, k and 1 may each independently be an integer from 0 to 4, for example, 0, 1, or 2.

For example, the anthracene compound of Formula 401 above may be one of the compounds represented by the following formulae:

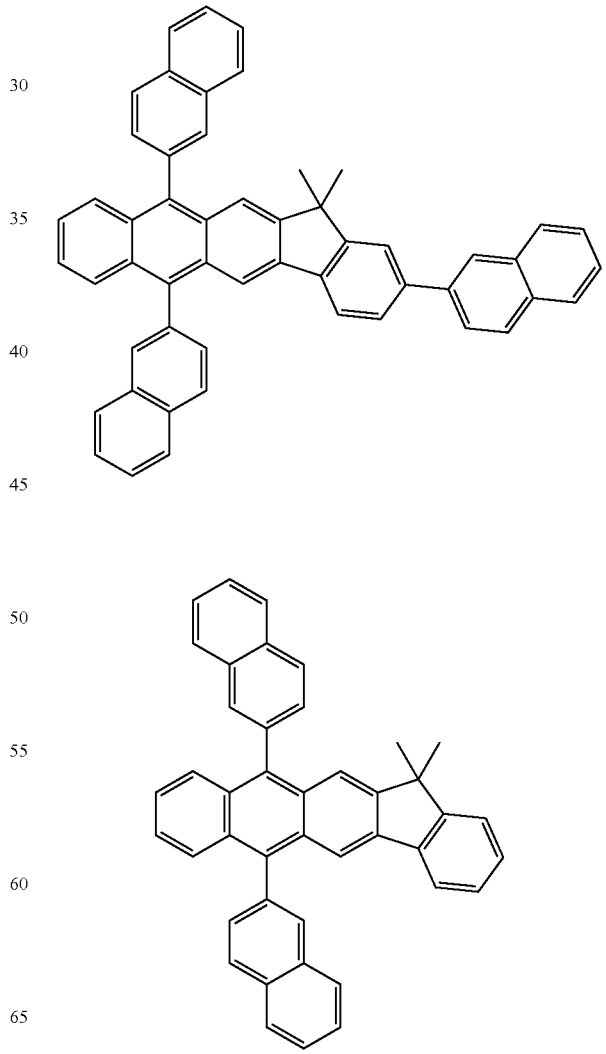

In other implementations, an anthracene-based compound represented by Formula 401 below may be used as the host.

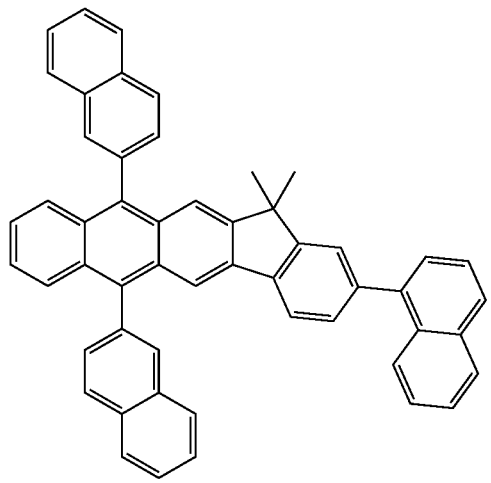

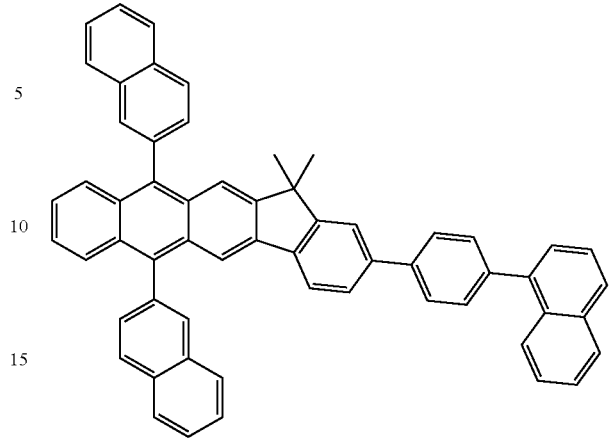

When the OLED is a full color OLED, the EML may be patterned into a red EML, a green EML, and a blue EML. For example, the blue EML may include the condensation compound of Formula 1, 2, or 3 as a blue fluorescent dopant. Also, the green EML may include the condensation compound of Formula 1, 2, or 3 as a green phosphorescent host.

At least one of the red EML, the green EML, and the blue EML may include a dopant described below (ppy=phenylpyridine).

For example, non-limiting examples of the blue dopant may include compounds represented by the following formulae in addition to the compound of Formula 1, 2, or 3:

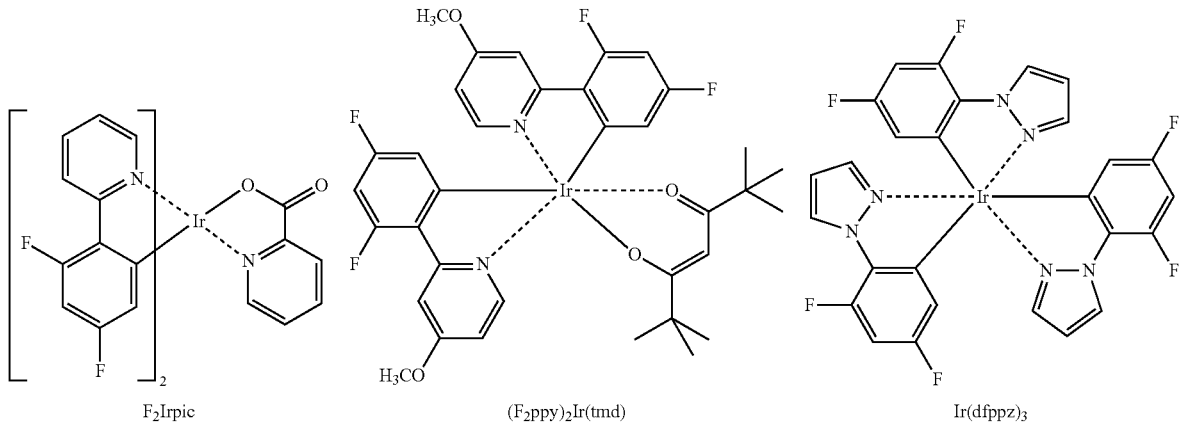

F$_2$Irpic　　　　(F$_2$ppy)$_2$Ir(tmd)　　　　Ir(dfppz)$_3$

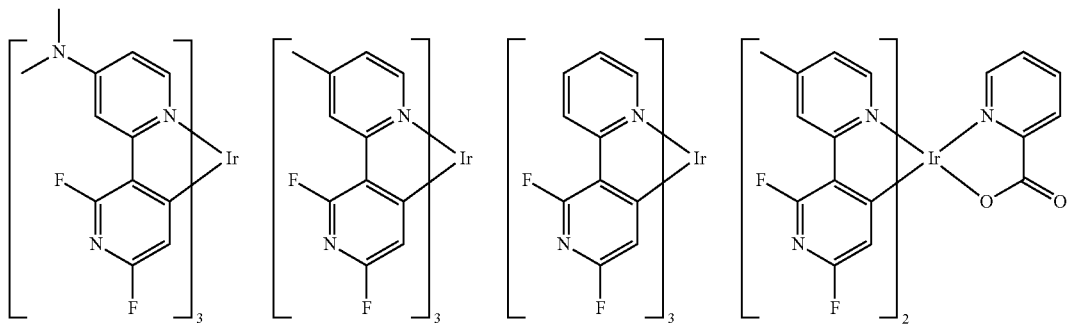

-continued
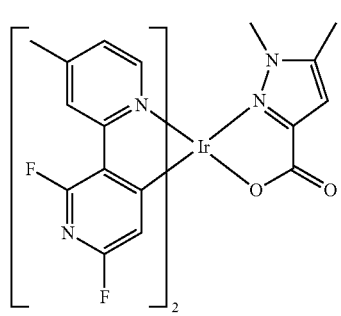
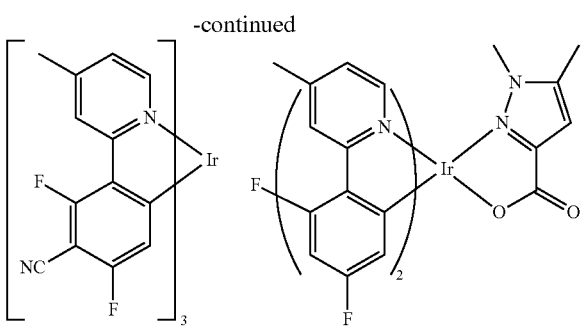
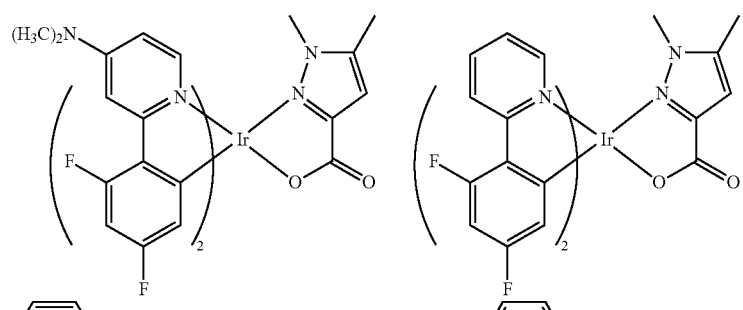
DPVBi
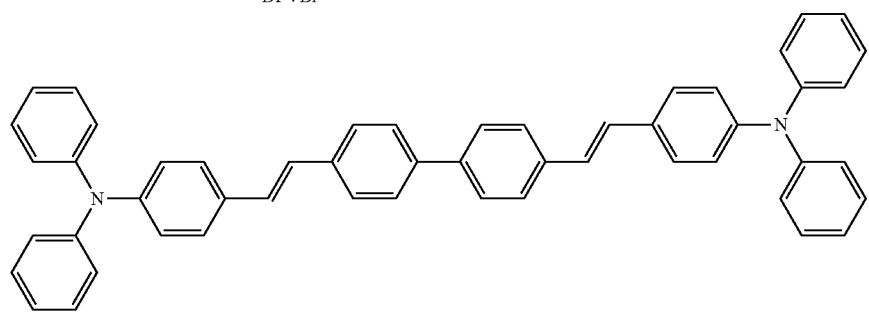
DPAVBi
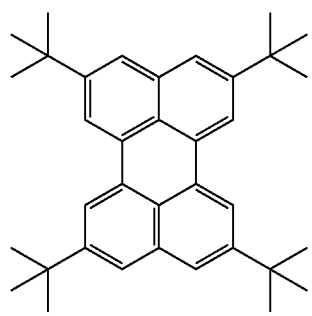
TBPe
Non-limiting examples of the red dopant are compounds represented by the following formulae:

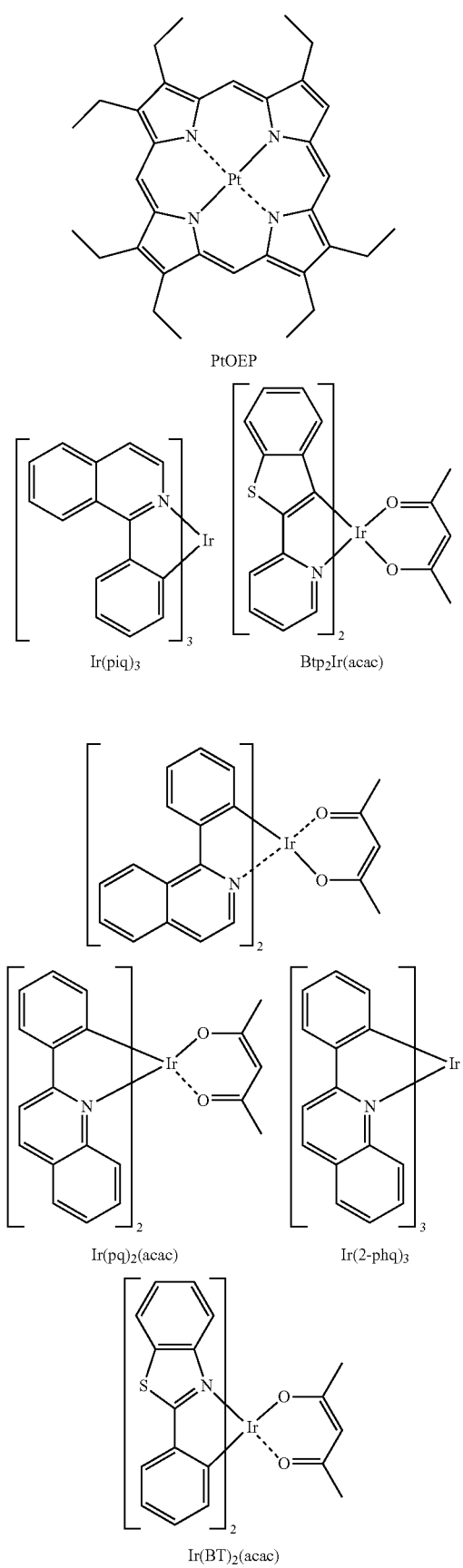
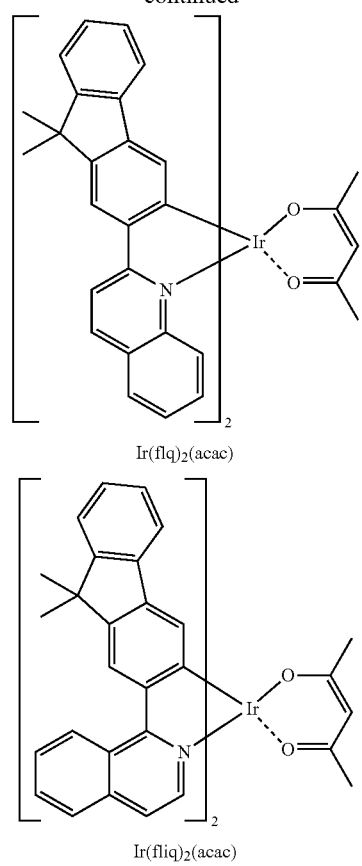
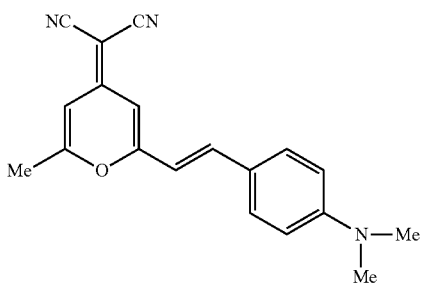
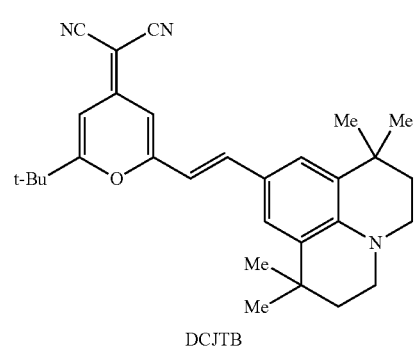
Non-limiting examples of the green dopant include compounds represented by the following formulae:

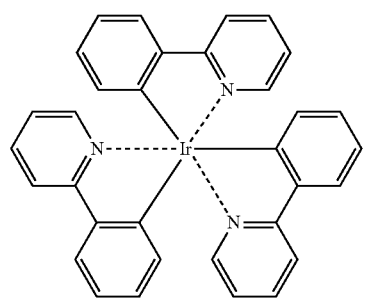
Ir(ppy)₃
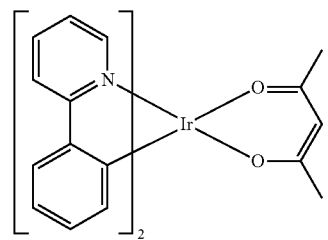
Ir(ppy)₂(acac)
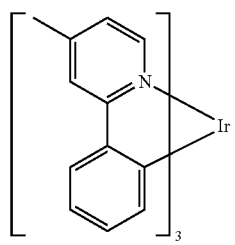
Ir(mpyp)₃
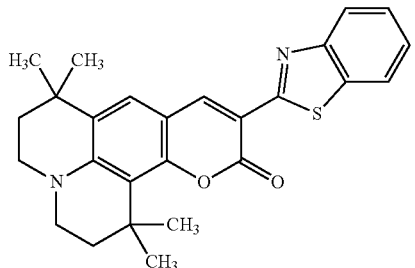
C545T
Non-limiting examples of the dopant that may be used in the EML include Pt-complexes represented by the following formulae:
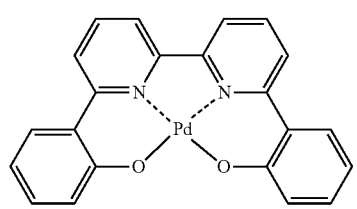
D1
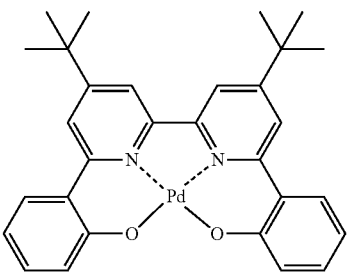
D2
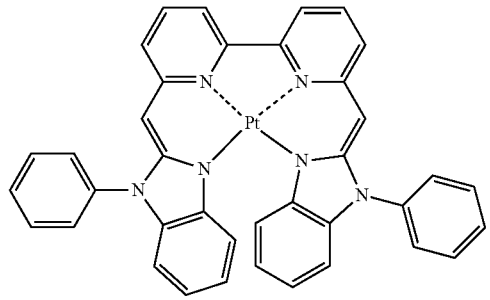
D3
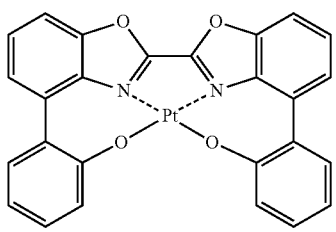
D4
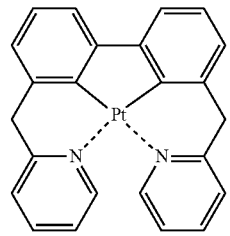
D5
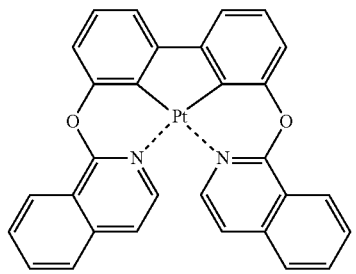
D6
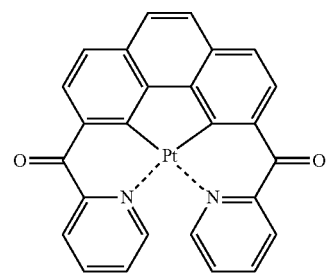
D7

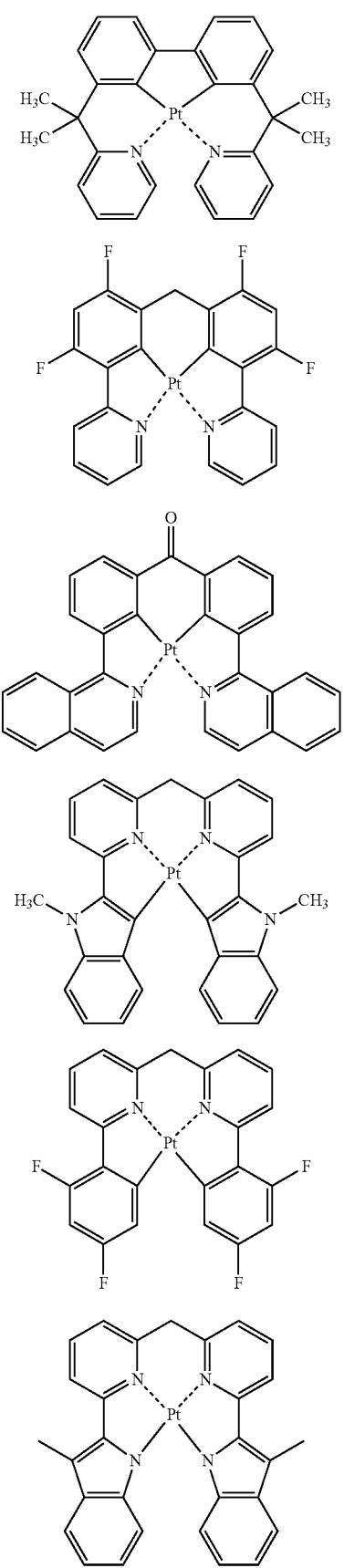
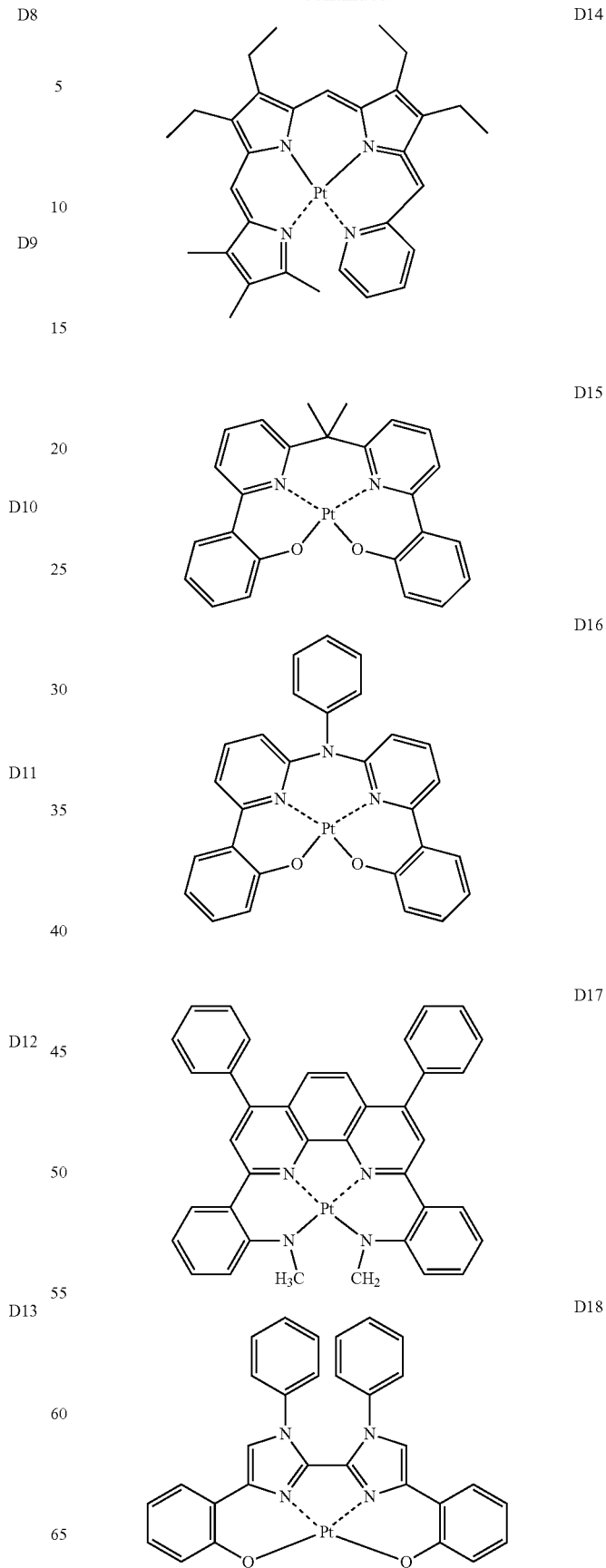

-continued
D19
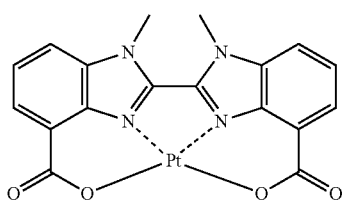
D20
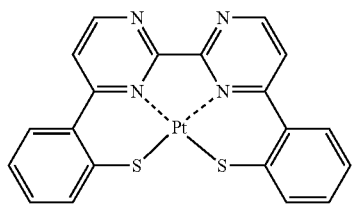
D21
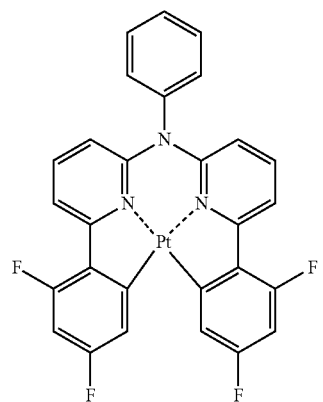
D22
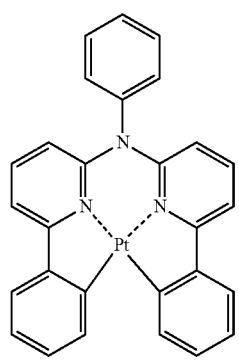
D23
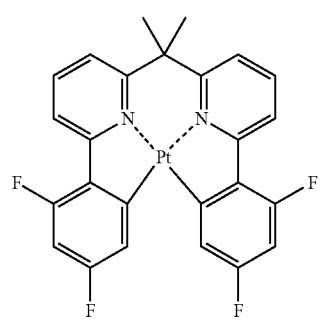
-continued
D24
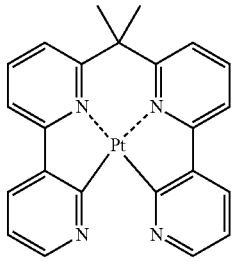
D25
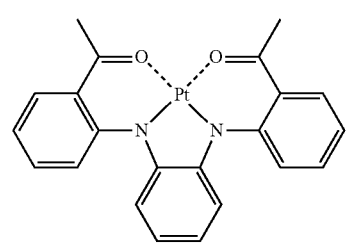
D26
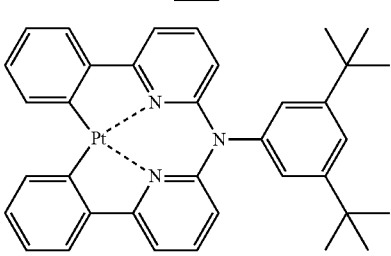
D27
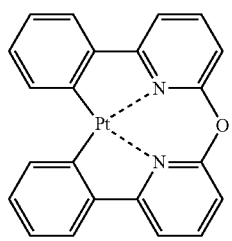
D28
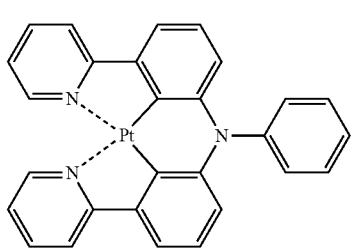
D29
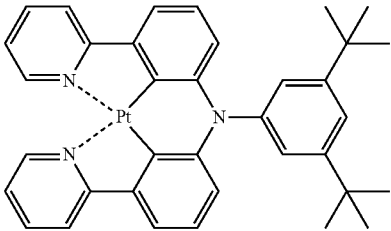

D30 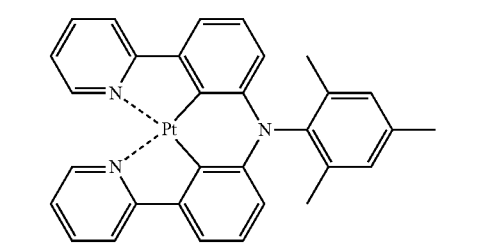
D31 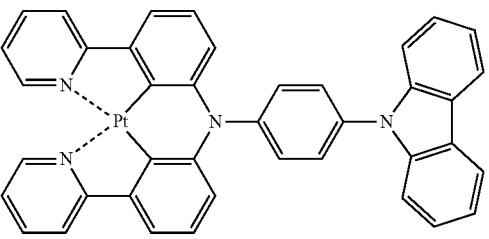
D32 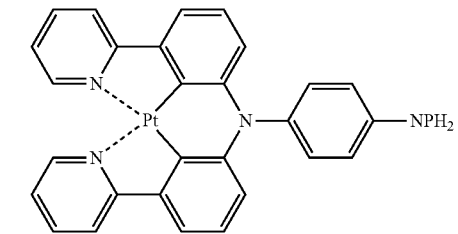
D33 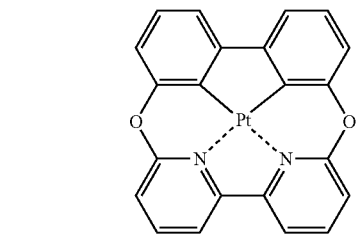
D34 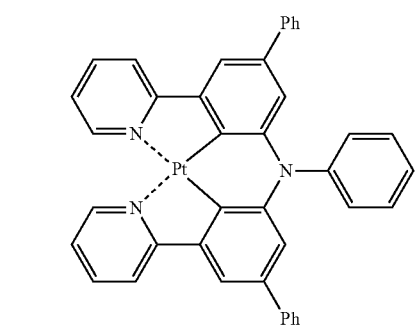
D35 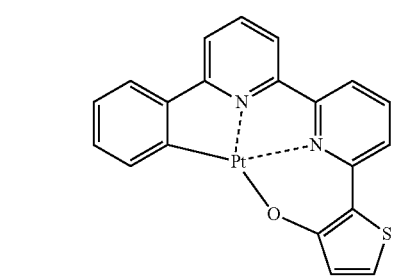
D36 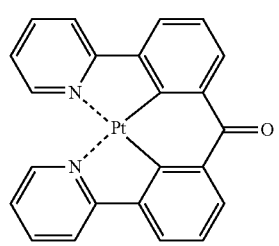
D37 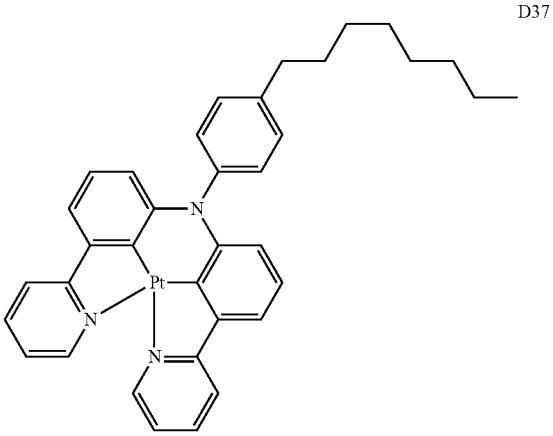
D38 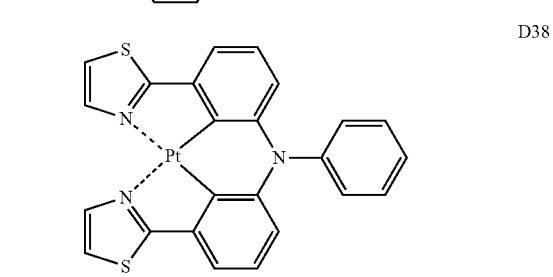
D39 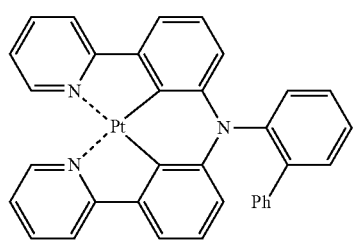
D40 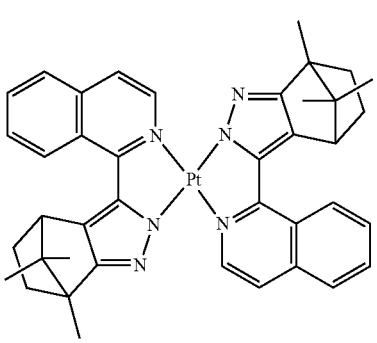

D41 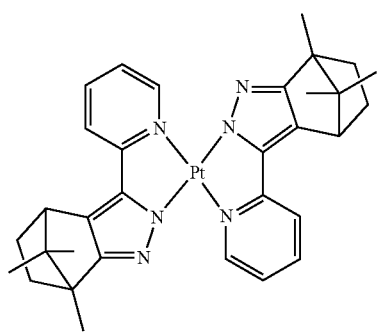
D42 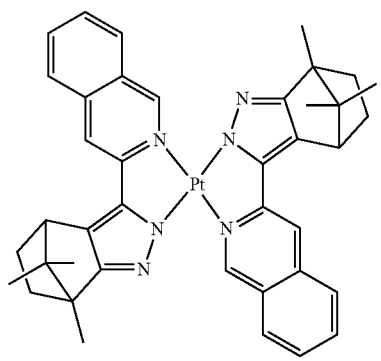
D43 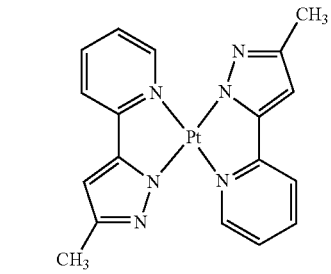
D44 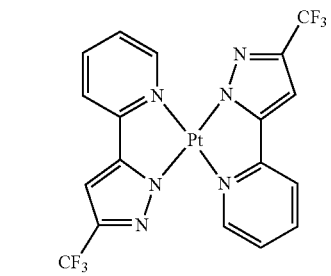
D45 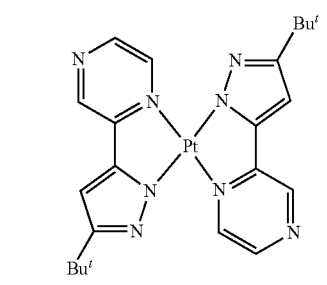
D46 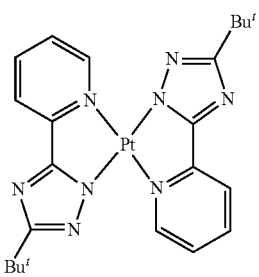
D47 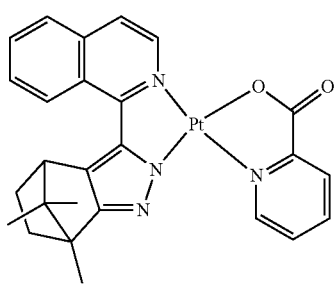
D48 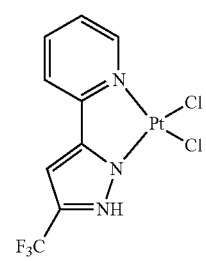
D49 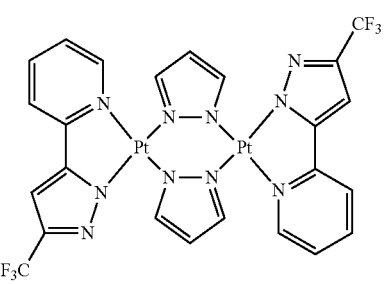
D50 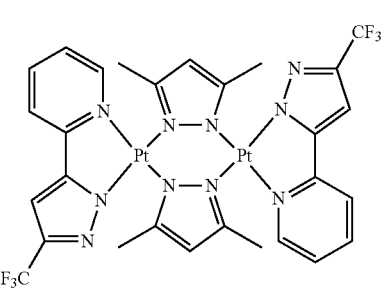
Non-limiting examples of the dopant that may be used in the EML include Os-complexes represented by the following formulae:

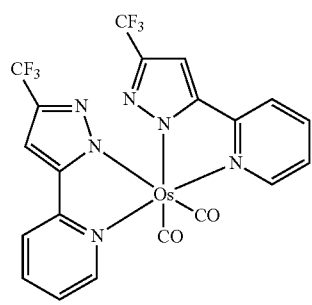

Os(fppz)₂(CO)₂

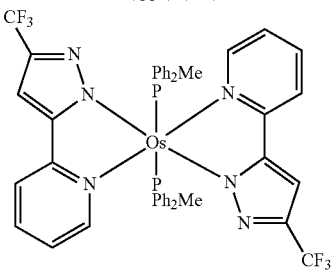

Os(fppz)₂(PPh₂Me)₂

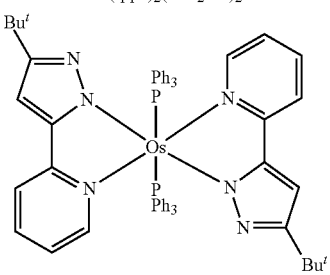

Os(bppz)₂(PPh₃)₂

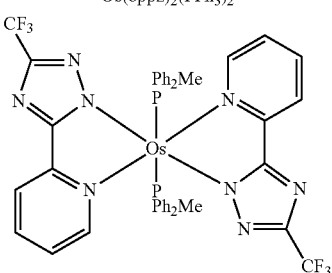

Os(fptz)₂(PPh₂Me)₂

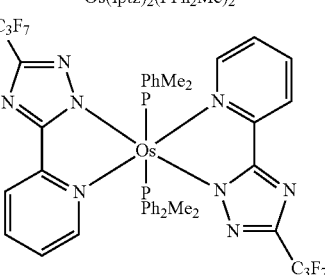

Os(hptz)₂(PPhMe₂)₂

When the EML includes both a host and a dopant, an amount of the dopant contained in the EML may be selected from a range of about 0.01 to about 15 parts by weight based on 100 parts by weight of the host.

The thickness of the EML may be about 100 Å to about 1,000 Å, for example, may be from about 200 Å to about 600 Å. When the thickness of the EML is within these ranges, the EML may have excellent light emitting ability without a substantial increase in driving voltage.

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary according to a compound that is used to form the ETL. A material for forming the ETL may be any known material that can stably transport electrons injected from an electron injecting electrode (cathode). Non-limiting examples of materials for forming the ETL are a quinoline derivative, such as tris(8-quinolinorate)aluminum (Alq3), TAZ, BAlq, beryllium bis(benzoquinolin-10-olate (Bebq2), 9,10-di(naphthalene-2-yl)anthracene (ADN), Compound 201, and Compound 202, but are not limited thereto:

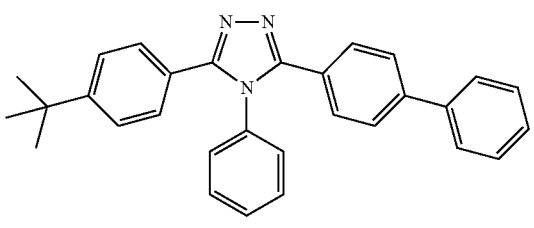

TAZ

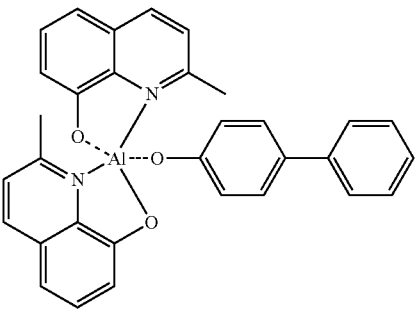

BAlq

<Formula 201>

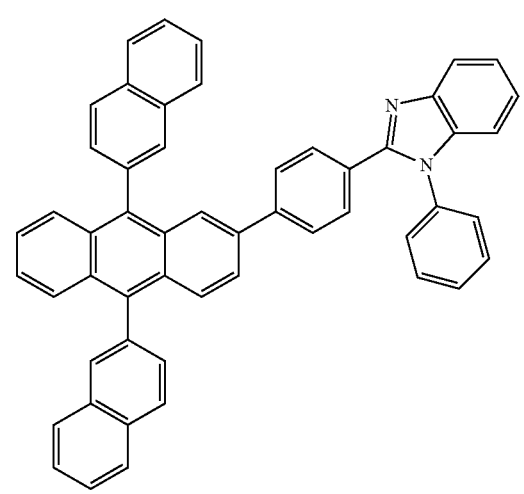

<Formula 202>

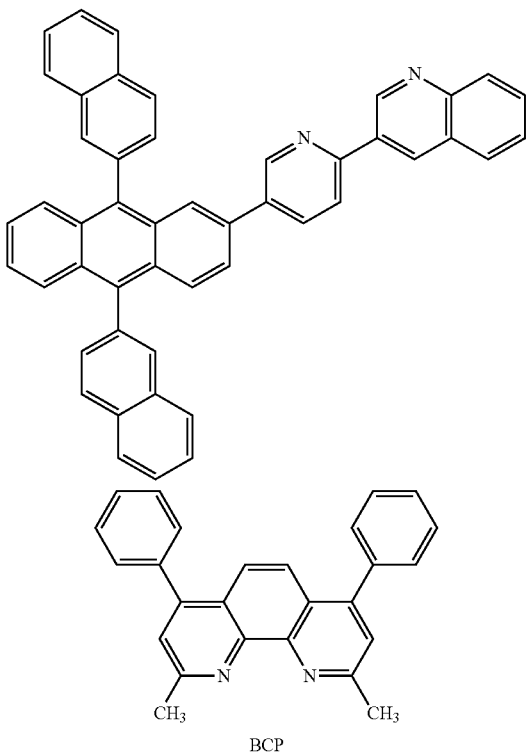

The thickness of the ETL may be from about 100 Å to about 1,000 Å, and in some embodiments, may be from about 150 Å to about 500 Å. When the thickness of the ETL is within these ranges, the ETL may have satisfactory electron transporting ability without a substantial increase in driving voltage.

Also, the ETL may further include a metal-containing material, in addition to any suitable electron-transporting organic compound.

The metal-containing material may include a lithium (Li)-complex. Non-limiting examples of the Li-complex are lithium quinolate (LiQ) and Compound 203 below:

<Compound 203>

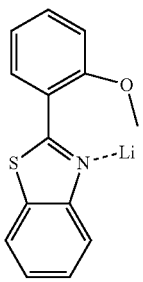

An EIL, which facilitates injection of electrons from the cathode, may be formed on the ETL. Any suitable electron-injecting material may be used to form the EIL.

Non-limiting examples of materials for forming the EIL are LiF, NaCl, CsF, $Li_2O$, and BaO. The deposition and coating conditions for forming the EIL may be selected from almost the same conditions for the formation of the HIL, though the deposition and coating conditions may vary according to the material that is used to form the EIL.

The thickness of the EIL may be from about 1 Å to about 100 Å, for example, from about 3 Å to about 90 Å. When the thickness of the EIL is within these ranges, the EIL may have satisfactory electron injection ability without a substantial increase in driving voltage.

The second electrode is disposed on the organic layer. The second electrode may be a cathode that is an electron injection electrode. A material for forming the second electrode may be a metal, an alloy, an electro-conductive compound that have a low work function, or a mixture thereof. Particularly, the second electrode may be formed of lithium (Li), magnesium (Mg), aluminum (Al), aluminum-lithium (Al—Li), calcium (Ca), magnesium (Mg)-indium (In), magnesium-silver (Mg—Ag), or the like, and may be formed as a thin film type transmission electrode. Also, to manufacture a top-emission light-emitting device, the transmission electrode may be formed of indium tin oxide (ITO) or indium zinc oxide (IZO).

Although the organic light-emitting device of FIG. 1 is described above, implementations are possible.

When a phosphorescent dopant is used in the EML, a HBL may be formed between the HTL and the EML or between the H-functional layer and the EML by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary according to the material that is used to form the HBL. Any suitable hole-blocking material may be used. Non-limiting examples of hole-blocking materials are oxadiazole derivatives, triazole derivatives, and phenanthroline derivatives. For example, 2,9-dimethyl-4,7-diphenyl-1,10-phenanthroline (BCP) represented by the following formula may be used as a material for forming the HBL:

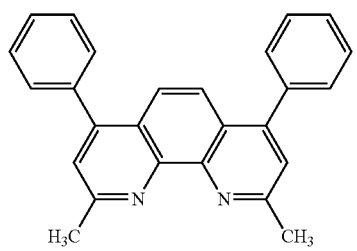

BCP

The thickness of the HBL may be from about 20 Å to about 1,000 Å, and in some embodiments, may be from about 30 Å to about 300 Å. When the thickness of the HBL is within these ranges, the HBL may have improved hole blocking ability without a substantial increase in driving voltage.

According to embodiments, the organic light-emitting device may be included in various types of flat panel display devices, such as in a passive matrix organic light-emitting display device or in an active matrix organic light-emitting display device. In particular, when the organic light-emitting diode is included in an active matrix organic light-emitting display device including a thin-film transistor, the first electrode on the substrate may function as a pixel electrode, electrically connected to a source electrode or a drain electrode of the thin-film transistor. Moreover, the organic light-emitting device may also be included in flat panel display devices having double-sided screens.

In some embodiments, the organic layer of the organic light-emitting device may be formed of the condensation compound of Formula 1, 2, or 3 using a deposition method or may be formed using a wet method of coating a solution of the condensation compound of Formula 1, 2 or 3.

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further it is to be understood that the embodiments are not limited to the particular details described in the Examples and Comparative Examples.

EXAMPLES

The condensation compound according to an embodiment may be synthesized by following Reaction Scheme 1 below:

<Reaction Scheme 1>

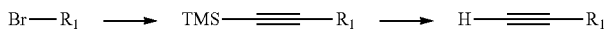

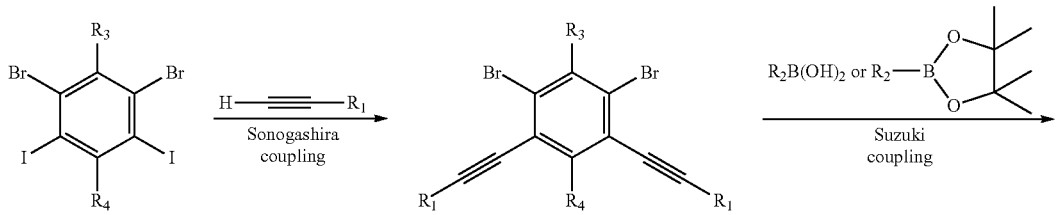

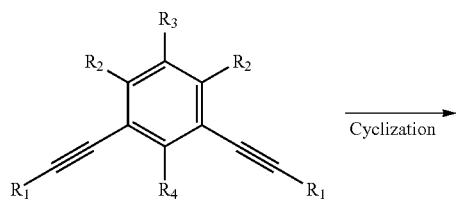

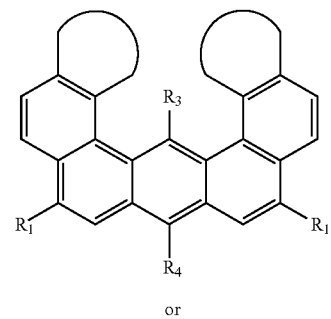

or

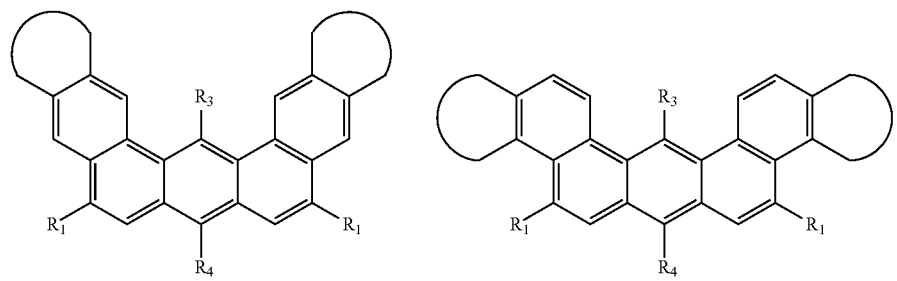

Synthesis Example 1
Synthesis of Compound 22
Compound 22 was synthesized by following Reaction Scheme 2 below:
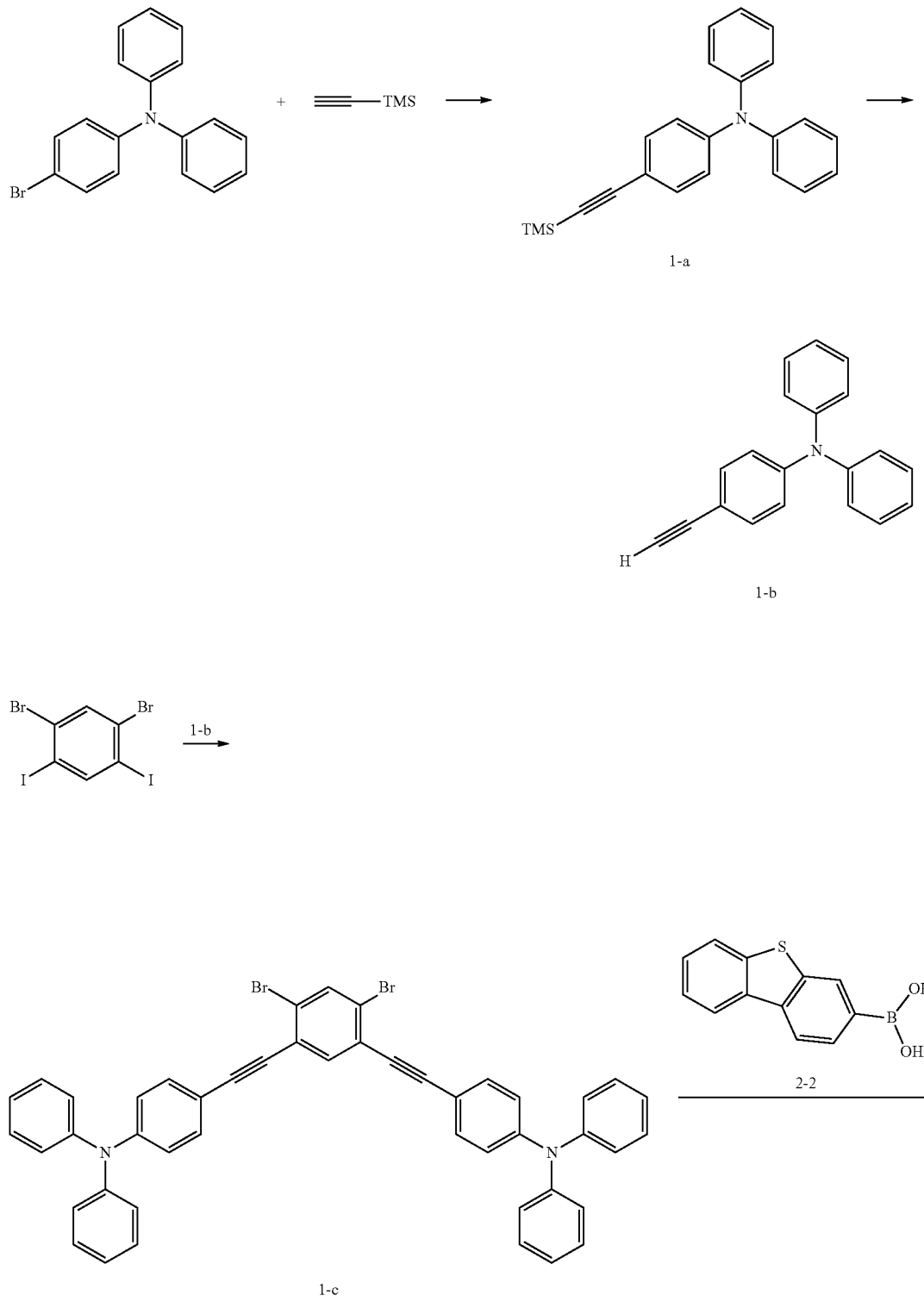

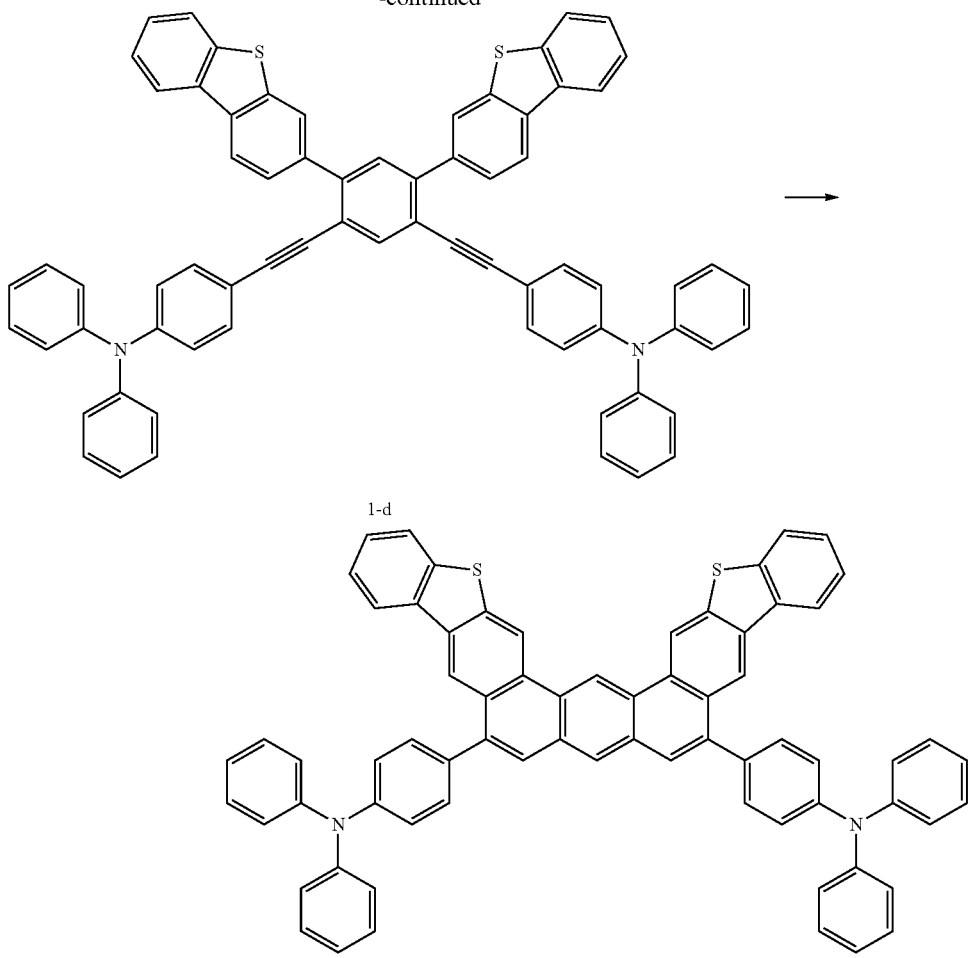

Synthesis of Intermediate 1-a 10 g of (4-bromo-phenyl)-diphenyl-amine, 0.60 mg (0.04 eq) of bis(chloro(triphenylphosphine)palladium (PdCl$_2$(PPh$_3$)$_2$), and 470 mg (0.08 eq) of CuI were added into a reaction vessel, which was then supplied with N$_2$ gas in a vacuum. Afterward, 100 ml of tetrahydrofuran (THF) was added to the reaction vessel and stirred. Next, 13 ml (3 eq) of triethylamine and 5.2 ml (1.2 eq) of TMS-acetylene were slowly added dropwise thereinto, and then stirred at room temperature for about 2 hours in the N$_2$ atmosphere. After removing the solvent using a rotary evaporator, the resultant was extracted three times each with 100 ml of diethylether and 100 ml of water. An organic layer was collected and was dried using magnesium sulfate to evaporate the solvent. The residue was separated and purified by silica gel column chromatography to obtain 8.8 g (84% yield) of Intermediate 2-a. This compound was identified using liquid chromatography-mass spectroscopy (LC-MS). C$_{23}$H$_{23}$N$_1$S$_1$: M+341.16

Synthesis of Intermediate 1-b 8 g of Intermediate 1-a was dissolved in 100 ml of THF, and 60 ml of tetrabutylammonium fluoride in THF (1.0M) was added dropwise thereinto and stirred for about 30 minutes. 100 ml of water was added to the reaction solution, and the resultant was extracted three times each with 100 ml of ethylether. An organic layer was collected and was dried using magnesium sulfate to evaporate the solvent. The residue was separated and purified by silica gel column chromatography to obtain 5.6 g (91% yield) of Intermediate 1-b. This compound was identified using LC-MS. C$_{20}$H$_{15}$N$_1$: M+269.12

Synthesis of Intermediate 1-c 3.46 g (0.48 eq) of 1,5-dibromo-2,4-diiodo-benzene, 1.2 g (0.07 eq) of Pd(PPh$_3$)$_4$, and 400 mg (0.14 eq) of CuI were put into a reaction vessel, which was then supplied with N$_2$ gas in a vacuum. Next, 50 ml of THF was added into the reaction vessel and then stirred. Then, 4.5 ml (2.2 eq) of triethylamine and 4g (1 eq) of Intermediate 1-b were slowly added dropwise thereinto, and then stirred at room temperature for about 2 hours in a N$_2$ atmosphere. After removing the solvent using a rotary evaporator, 50 ml of water was added to the reaction solution, and the resultant was extracted three times each with 50 ml of ethylether. An organic layer was collected and dried using magnesium sulfate to evaporate the solvent. The residue was separated and purified using silica gel column chromatography to obtain 6.6 g (60% yield) of Intermediate 1-c. This compound was identified using LC-MS. C$_{46}$H$_{30}$Br$_2$N$_2$: M+768.08

Synthesis of Intermediate 1-d 5.0 g of Intermediate 1-c, 3.27 g (2.2 eq) of Compound 2-2, 750 mg (0.10 eq) of Pd(PPh$_3$)$_4$, and 9.0 g (10 eq) of K$_2$CO$_3$ were dissolved in 100 ml of THF and 30 ml of distilled water to obtain a mixed solution. The mixed solution was then refluxed for about 24 hours while being stirred after a temperature increase to about 120° C. The reaction solution was cooled to room temperature, followed by three times of extraction each with 100 ml of water and 100 ml of diethylether. An organic layer was collected and dried using magnesium sulfate to evaporate the solvent. The residue was separated and purified using silica gel column chromatography to obtain 5.3 g (83% yield) of Intermediate 1-d. This compound was identified using LC-MS. C$_{70}$H$_{44}$N$_2$S$_2$: M+976.29

Synthesis of Compound 22

3 g of Intermediate 1-d was dissolved in 50 ml of methylene chloride, and 9.4 ml (40 eq) of trifluoroacetic acid was added dropwise thereinto and stirred at room temperature for about 1 hour. After completion of the reaction, the resultant was extracted three times each with 100 mL of water and 100 mL of diethylether. An organic layer was collected and dried using magnesium sulfate to evaporate the solvent. The residue was separated and purified using silica gel column chromatography to obtain 2.7 g (90% yield) of Compound 22d. This compound was identified using LC-MS and nuclear magnetic resonance (NMR). $^1$H NMR (CDCl$_3$, 400 MHz) δ (ppm) 8.93 (s, 2H), 8.31 (s, 2H), 8.13 (s, 2H), 8.12 (s, 2H), 7.86 (d, 2H), 7.78 (d, 2H), 7.33 (m, 2H), 7.31 (m, 2H), 7.23 (d, 4H), 7.01 (m, 8H), 6.62 (m, 4H), 6.52 (d, 4H), 6.46 (d, 8H); C$_{70}$H$_{44}$N$_2$S$_2$: M+976.29

<Intermediates I-1 to 2-14>

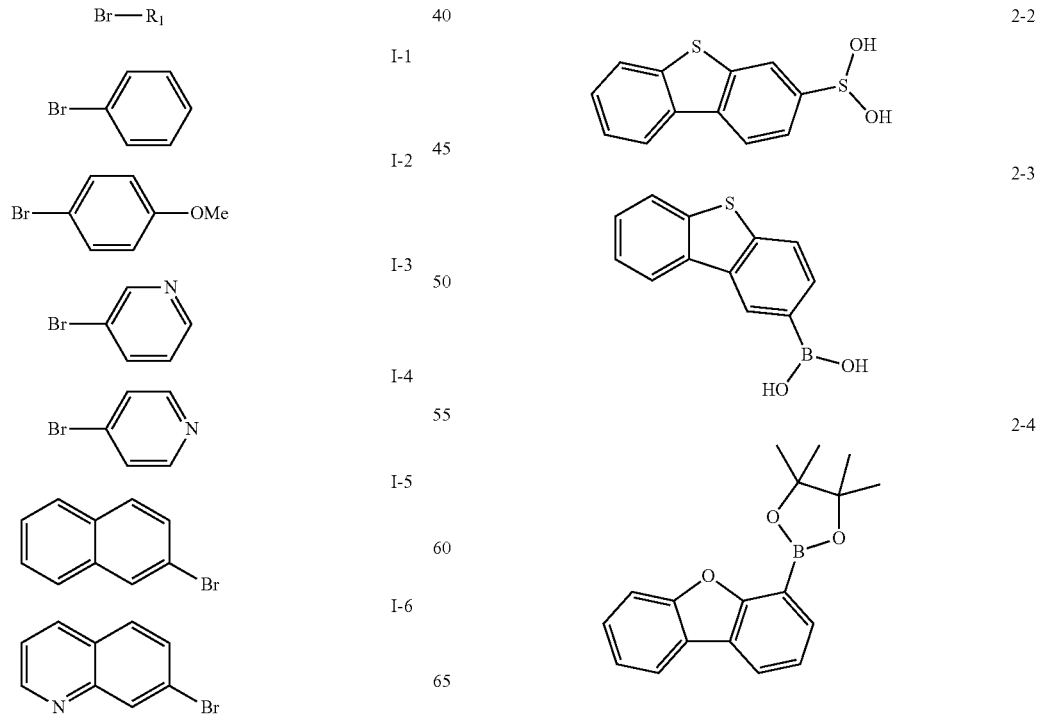

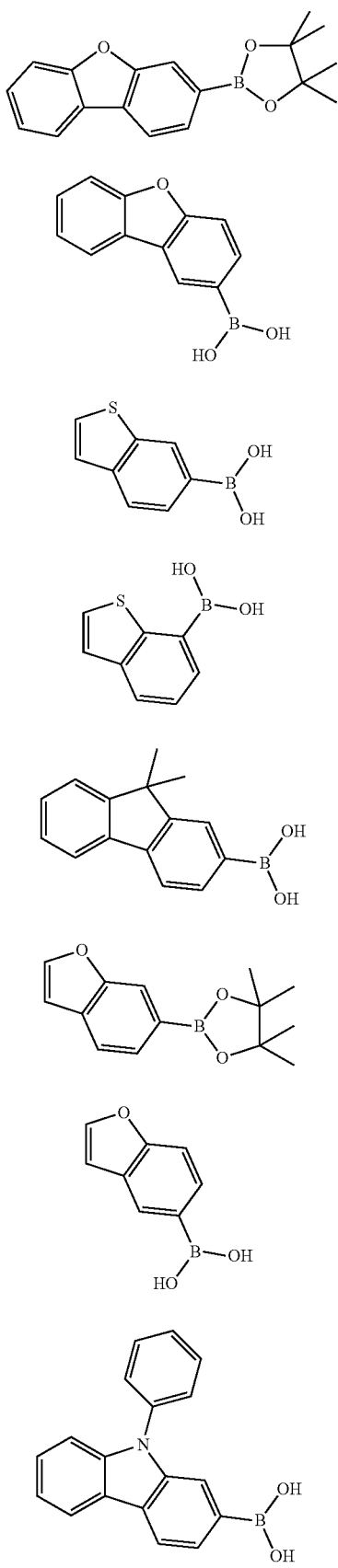

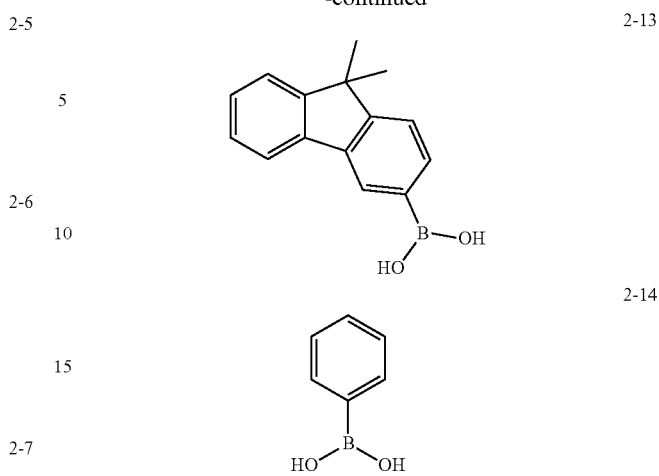

Synthesis Example 2

Synthesis of Compound 1

Compound 1 was synthesized in the same manner as in Synthesis Example 1, except that Intermediate 1-1 was used instead of (4-bromo-phenyl)-diphenyl-amine during the synthesis of Intermediate 1-a, and Intermediate 2-1 was used instead of Intermediate 2-2 during the synthesis of Intermediate 1-d. This compound was identified using LC-MS and NMR. $^1$H NMR (CDCl$_3$, 400 MHz) δ (ppm) 8.31 (s, 2H), 8.13 (s, 2H), 8.12 (d, 2H), 7.86 (d, 2H), 7.82 (d, 2H), 7.78 (d, 2H), 7.48 (d, 4H), 7.31~7.33 (m, 8H), 7.22 (m, 2H); C$_{46}$H$_{26}$S$_2$: M+642.15

Synthesis Example 3

Synthesis of Compound 6

Compound 6 was synthesized in the same manner as in Synthesis Example 1, except that Intermediate 1-7 was used instead of (4-bromo-phenyl)-diphenyl-amine during the synthesis of Intermediate 1-a, and Intermediate 2-7 was used instead of Intermediate 2-2 during the synthesis of Intermediate 1-d. This compound was identified using LC-MS and NMR. $^1$H NMR (CDCl$_3$, 400 MHz) δ (ppm) 8.93 (s, 1H), 8.31 (s, 2H), 8.13 (s, 2H), 8.12 (s, 2H), 7.40 (d, 2H), 7.29 (d, 2H), 7.23 (d, 4H), 7.00~7.01 (m, 8H), 6.62 (m, 4H), 6.52 (d, 4H), 6.46 (m, 8H); C$_{62}$H$_{40}$N$_2$S$_2$: M+876.26

Synthesis Example 4

Synthesis of Compound 11

Compound 11 was synthesized in the same manner as in Synthesis Example 1, except that Intermediate 1-4 was used instead of (4-bromo-phenyl)-diphenyl-amine during the synthesis of Intermediate 1-a, and Intermediate 2-6 was used instead of Intermediate 2-2 during the synthesis of Intermediate 1-d. This compound was identified using LC-MS and NMR. $^1$H NMR (CDCl$_3$, 400 MHz) δ (ppm) 8.93 (d, 2H), 8.65 (m, 4H), 8.31 (s, 2H), 8.13 (s, 2H), 7.88 (d, 2H), 7.60 (d, 4H), 7.49 (d, 2H), 7.42 (d, 2H), 7.19 (m, 2H), 7.13 (m, 2H); C$_{44}$H$_{24}$N$_2$O$_2$: M+612.18

Synthesis Example 5

Synthesis of Compound 16

Compound 16 was synthesized in the same manner as in Synthesis Example 1, except that Intermediate 1-5 was used instead of (4-bromo-phenyl)-diphenyl-amine during the synthesis of Intermediate 1-a, and Intermediate 2-3 was used instead of Intermediate 2-2 during the synthesis of Intermediate 1-d. This compound was identified using LC-MS and NMR. $^1$H NMR (CDCl$_3$, 400 MHz) δ (ppm) 8.93 (d, 2H), 8.31 (s, 2H), 8.13 (s, 2H), 7.89 (s, 2H), 7.88 (d, 2H), 7.86 (d, 2H), 7.73 (d, 2H), 7.67 (d, 4H), 7.54 (d, 2H), 7.31~7.33 (m, 8H); $C_{54}H_{30}S_2$: M+742.18

Synthesis Example 6

Synthesis of Compound 23

Compound 23 was synthesized in the same manner as in Synthesis Example 1, except that Intermediate 1-7 was used instead of (4-bromo-phenyl)-diphenyl-amine during the synthesis of Intermediate 1-a, and Intermediate 2-4 was used instead of Intermediate 2-2 during the synthesis of Intermediate 1-d. This compound was identified using LC-MS and NMR. $^1$H NMR (CDCl$_3$, 400 MHz) δ (ppm) 8.31 (d, 2H), 8.12~8.13 (m, 4H), 7.82 (d, 2H), 7.49 (d, 2H), 7.42 (d, 2H), 7.23 (d, 4H), 7.19 (m, 2H), 7.13 (m, 2H), 7.00~7.01 (m, 4H), 6.62 (m, 4H), 6.52 (d, 4H), 6.46 (d, 4H); $C_{70}H_{44}N_2O_2$: M+944.34

Synthesis Example 7

Synthesis of Compound 26

Compound 26 was synthesized in the same manner as in Synthesis Example 1, except that Intermediate 1-8 was used instead of (4-bromo-phenyl)-diphenyl-amine during the synthesis of Intermediate 1-a, and Intermediate 2-4 was used instead of Intermediate 2-2 during the synthesis of Intermediate 1-d. This compound was identified using LC-MS and NMR. $^1$H NMR (CDCl$_3$, 400 MHz) δ (ppm) 8.31 (s, 2H), 8.13 (s, 2H), 8.12 (d, 2H), 8.00 (s, 2H), 7.92 (d, 2H), 7.86 (d, 2H), 7.82 (d, 2H), 7.78 (d, 2H), 7.53 (d, 2H), 7.49 (d, 2H), 7.31 (m, 2H), 7.19 (m, 2H), 7.13 (m, 2H); $C_{58}H_{30}O_2S_2$: M+822.17

Synthesis Example 8

Synthesis of Compound 29

Compound 29 was synthesized in the same manner as in Synthesis Example 1, except that Intermediate 1-9 was used instead of (4-bromo-phenyl)-diphenyl-amine during the synthesis of Intermediate 1-a, and Intermediate 2-5 was used instead of Intermediate 2-2 during the synthesis of Intermediate 1-d. This compound was identified using LC-MS and NMR. $^1$H NMR (CDCl$_3$, 400 MHz) δ (ppm) 8.93 (s, 2H), 8.31 (s, 2H), 8.13 (s, 2H), 8.12 (s, 2H), 7.71 (s, 2H), 7.48~7.49 (m, 6H), 7.42 (m, 4H), 7.41 (d, 2H), 7.19 (m, 4H), 7.13 (m, 4H); $C_{58}H_{30}O_4$: M+790.21

Synthesis Example 9

Synthesis of Compound 42

Compound 42 was synthesized in the same manner as in Synthesis Example 1, except that Intermediate 1-2 was used instead of (4-bromo-phenyl)-diphenyl-amine during the synthesis of Intermediate 1-a, and Intermediate 2-12 was used instead of Intermediate 2-2 during the synthesis of Intermediate 1-d. This compound was identified using LC-MS and NMR. $^1$H NMR (CDCl$_3$, 400 MHz) δ (ppm) 8.93 (s, 2H), 8.31 (s, 2H), 8.12~8.13 (m, 4H), 7.55 (s, 2H), 7.37 (m, 4H), 7.30~7.35 (m, 10H), 7.08 (m, 2H), 7.00 (m, 2H), 6.83 (d, 4H), 3.73 (s, 6H); $C_{60}H_{40}N_2O_2$: M+820.31

Synthesis Example 10

Synthesis of Compound 44

Compound 44 was synthesized in the same manner as in Synthesis Example 1, except that Intermediate 1-3 was used instead of (4-bromo-phenyl)-diphenyl-amine during the synthesis of Intermediate 1-a, and Intermediate 2-13 was used instead of Intermediate 2-2 during the synthesis of Intermediate 1-d. This compound was identified using LC-MS and NMR. $^1$H NMR (CDCl$_3$, 400 MHz) δ (ppm) 8.81 (m, 4H), 8.55 (d, 2H), 8.31 (s, 2H), 8.13 (s, 2H), 8.06 (d, 2H), 7.97 (d, 2H), 7.81 (d, 2H), 7.61 (d, 2H), 7.44 (m, 4H), 7.24 (m, 2H); $C_{50}H_{36}N_2$: M+664.29

Synthesis Example 11

Synthesis of Compound 53

Compound 53 was synthesized in the same manner as in Synthesis Example 1, except that Intermediate 1-5 was used instead of (4-bromo-phenyl)-diphenyl-amine during the synthesis of Intermediate 1-a, and Intermediate 2-9 was used instead of Intermediate 2-2 during the synthesis of Intermediate 1-d. This compound was identified using LC-MS and NMR. $^1$H NMR (CDCl$_3$, 400 MHz) δ (ppm) 8.86 (s, 2H), 8.31 (s, 2H), 8.26 (d, 2H), 8.13 (s, 2H), 7.89 (s, 2H), 7.73 (d, 2H), 7.67 (m, 4H), 7.54 (d, 2H), 7.44 (m, 2H), 7.32 (m, 4H), 7.24 (m, 2H), 1.75 (s, 6H); $C_{60}H_{42}$: M+762.33

Synthesis Example 12

Synthesis of Compound 54

Compound 54 was synthesized in the same manner as in Synthesis Example 1, except that Intermediate 1-5 was used instead of (4-bromo-phenyl)-diphenyl-amine during the synthesis of Intermediate 1-a, and Intermediate 2-12 was used instead of Intermediate 2-2 during the synthesis of Intermediate 1-d. This compound was identified using LC-MS and NMR. $^1$H NMR (CDCl$_3$, 400 MHz) δ (ppm) 8.93 (s, 2H), 8.31 (s, 2H), 8.12~8.13 (m, 4H), 7.89 (s, 2H), 7.73 (m, 214), 7.67 (d, 4H), 7.54~7.55 (m, 4H), 7.40 (d, 2H), 7.32 (m, 4H), 7.26~7.30 (m, 10H), 7.08 (m, 2H), 7.00 (m, 2H); $C_{66}H_{40}N_2$: M+860.32

Synthesis Example 13

Synthesis of Compound 56

Compound 56 was synthesized in the same manner as in Synthesis Example 1, except that Intermediate 1-6 was used instead of (4-bromo-phenyl)-diphenyl-amine during the synthesis of Intermediate 1-a, and Intermediate 2-9 was used instead of Intermediate 2-2 during the synthesis of Intermediate 1-d. This compound was identified using LC-MS and NMR. $^1$H NMR (CDCl$_3$, 400 MHz) δ (ppm) 8.86 (s, 2H), 8.81 (d, 2H), 8.31 (s, 2H), 8.26~8.27 (m, 4H), 8.13 (s, 2H), 8.06 (d, 2H), 8.00 (d, 2H), 7.74 (d, 2H), 7.65 (d, 2H), 7.61 (d, 2H), 7.44 (m, 2H), 7.24~7.26 (m, 4H); $C_{58}H_{40}N_2$: M+764.32

Synthesis Example 14

Synthesis of Compound 59

Compound 59 was synthesized in the same manner as in Synthesis Example 1, except that Intermediate 1-7 was used instead of (4-bromo-phenyl)-diphenyl-amine during the synthesis of Intermediate 1-a, and Intermediate 2-9 was used instead of Intermediate 2-2 during the synthesis of Intermediate 1-d. This compound was identified using LC-MS and NMR. $^1$H NMR (CDCl$_3$, 400 MHz) δ (ppm) 8.86 (s, 2H), 8.31 (s, 2H), 8.26 (s, 2H), 8.13 (s, 2H), 8.06 (d, 2H), 7.61 (d, 2H), 7.44 (m, 2H), 7.23~7.24 (m, 6H), 7.01 (m, 4H), 6.62 (m, 4H), 6.52 (d, 4H), 6.46 (d, 8H), 1.73 (s, 6H); $C_{76}H_{56}N_2$: M+996.44

Synthesis Example 15

Synthesis of Compound 70

Compound 70 was synthesized by following Reaction Scheme 3 below:

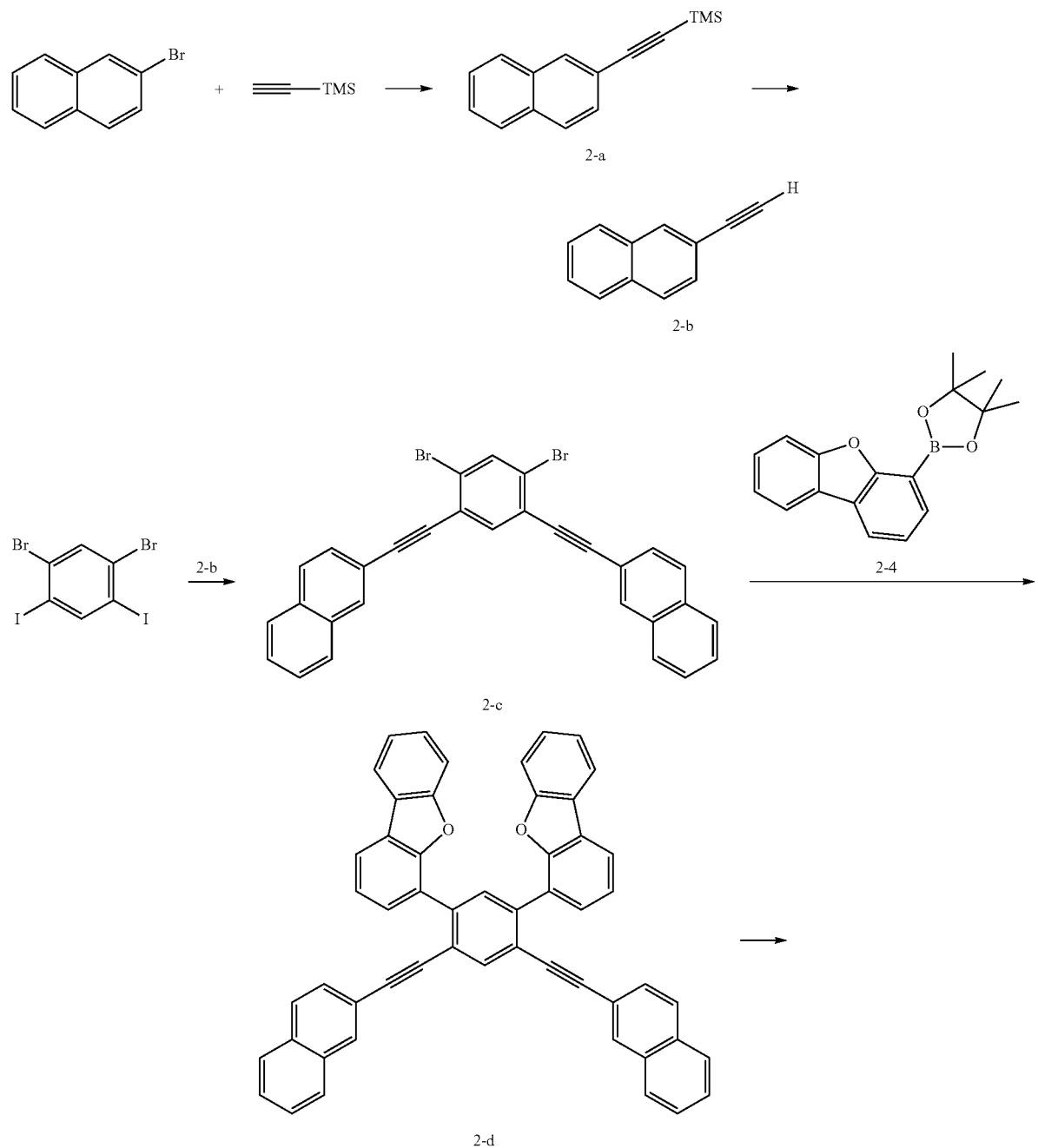

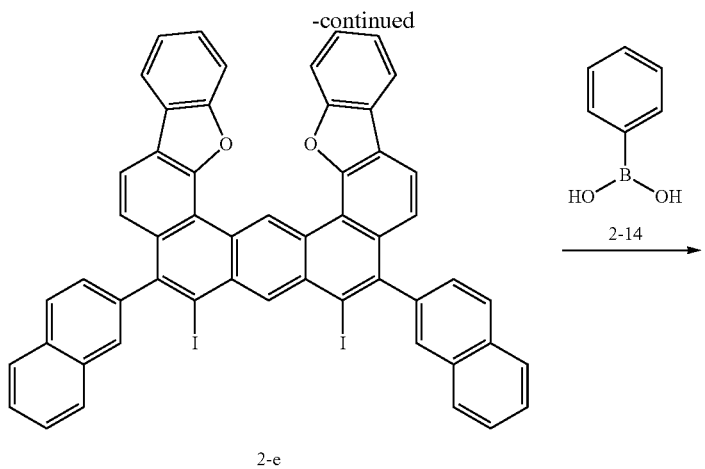

2-e

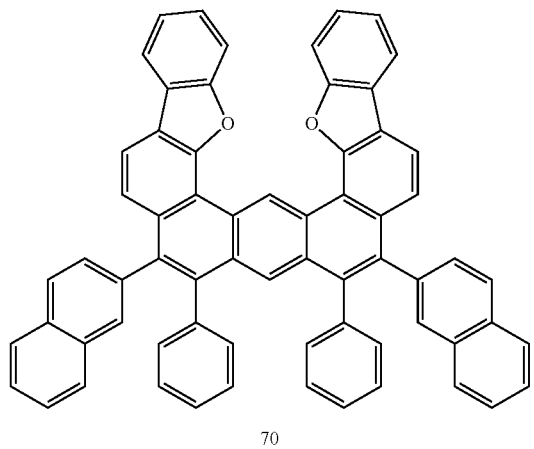 [SMILES: c1ccc(-c2c(-c3ccc4ccccc4c3)c3ccc4c5ccccc5oc4c3c3cc4c(cc23)c(-c2ccccc2)c(-c2ccc3ccccc3c2)c2ccc3c5ccccc5oc3c24)cc1]

70

Synthesis of Intermediate 2-a 6.4 g of 9-bromoanthracene, 1.4 g (0.04 eq) of $Pd(PPh_3)_4$, and 470 mg of (0.08 eq) of CuI were add into a reaction vessel. After creating a vacuum, an atmosphere inside the reaction vessel is supplied with $N_2$ gas, and then 100 ml of THF was added to the reaction vessel and stirred. Next, 13 ml (3 eq) of triethylamine and 5.2 ml (1.2 eq) of TMS-acetylene were slowly added dropwise thereinto, and then stirred at room temperature for about 12 hours in the $N_2$ atmosphere. After removing the solvent using a rotary evaporator, the resultant was extracted three times each with 100 ml of diethylether and 100 ml of water. An organic layer was collected and was dried using magnesium sulfate to evaporate the solvent. The residue was separated and purified by silica gel column chromatography to obtain 6.1 g (88% yield) of Intermediate 2-a. This compound was identified using LC-MS. $C_{15}H_{16}Si_1$: M+224.10

Synthesis of Intermediate 2-b 5.2 g of Intermediate 2-a was dissolved in 100 ml of THF, and 60 ml of tetrabutylammonium fluoride in THF (1.0M) was added dropwise thereinto and stirred for about 30 minutes. 100 ml of water was added to the reaction solution, and the resultant was extracted three times each with 100 ml of ethylether. An organic layer was collected and was dried using magnesium sulfate to evaporate the solvent. The residue was separated and purified by silica gel column chromatography to obtain 3 g (91% yield) of Intermediate 2-b. This compound was identified using LC-MS. $C_{12}H_8$: M+153.06

Synthesis of Intermediate 2-c 4.6 g (0.48 eq) of 1,5-dibromo-2,4-diiodo-benzene, 1.59 g (0.07 eq) of $Pd(PPh_3)_4$, and 530 mg (0.14 eq) of CuI were put into a reaction vessel, which was then supplied with $N_2$ gas in a vacuum. Next, 70 ml of THF was added into the reaction vessel and then stirred. Then, 6.0 ml (2.2 eq) of triethylamine and 3g (1 eq) of Intermediate 2-b were slowly added dropwise thereinto, and then stirred at room temperature for about 2 hours in a $N_2$ atmosphere. After removing the solvent using a rotary evaporator, 50 ml of water was added to the reaction solution, and the resultant was extracted three times each with 50 ml of ethylether. An organic layer was collected and dried using magnesium sulfate to evaporate the solvent. The residue was separated and purified using silica gel column chromatography to obtain 3.3 g (63% yield) of Intermediate 2-c. This compound was identified using LC-MS. $C_{30}H_{16}Br_2$: M+533.96

Synthesis of Intermediate 2-d 3.3 g of Intermediate 2-c, 4g (2.2 eq) of Compound 2-4, 715 mg (0.10 eq) of $Pd(PPh_3)_4$, and 8.50 g (10 eq) of $K_2CO_3$ were dissolved in 100 ml of THF and 30 ml of distilled water to obtain a mixed solution. The mixed solution was then refluxed for about 24 hours while being stirred after a temperature increase to about 120° C. The reaction solution was cooled to room temperature, followed by three times of extraction each with 100 ml of water and 100 ml of diethylether. An organic layer was collected and dried using magnesium sulfate to evaporate the solvent. The residue was separated and purified using silica gel column chromatography to obtain 3.5 g (81% yield) of Intermediate 2-d. This compound was identified using LC-MS. $C_{54}H_{30}O_2$: M+710.22

Synthesis of Intermediate 2-e 7.3 g (4 eq) of bis(pyridine)iodoniumtetrafluoroborate and 60 ml of dichloromethane were mixed together, and 6.059 ml (0.004 eq, d 1.696) of $CF_3SO_3H$ was added thereto and stirred at about −40° C. Then, 20 ml of dichloromethane and 3.5 g (1 eq) of Intermediate 2-d were mixed and added to the reaction solution, and the temperature was increased to about 10° C., then stirred for about 2 hours. After the temperature of the reaction solution was increased to room temperature, the resultant was extracted three times with 100 ml of water and 100 ml of ethylether. The organic layer was collected and dried using magnesium sulfate to evaporate the solvent. The residue was separated and purified using silica gel column chromatography to obtain 4.5 g (95% yield) of Intermediate 2-e. This compound was identified using LC-MS. $C_{54}H_{23}I_2O_2$: M+692.02

Synthesis of Compound 70

4.5 g of Intermediate 2-e, 1.7 g (3 eq) of Intermediate 2-14, 540 mg (0.1 eq) of $Pd(PPh_3)_4$, and 6.5 g (10 eq) of $K_2CO_3$ were mixed with 80 ml of THF and 25 ml of distilled water to obtain a mixed solution. The mixed solution was then refluxed for about 24 hours while being stirred after a temperature increase to about 120° C. The reaction solution was cooled to room temperature, followed by three times of extraction each with 100 ml of water and 100 ml of diethylether. An organic layer was collected and dried using magnesium sulfate to evaporate the solvent. The residue was separated and purified using silica gel column chromatography to obtain 3.0 g (76% yield) of Compound 70. This compound was identified using LC-MS and NMR. $^1$H NMR (CDCl$_3$, 400 MHz) δ (ppm) 8.31 (s, 2H), 8.12 (d, 2H), 7.82 (d, 2H), 7.80 (s, 2H), 7.73 (m, 2H), 7.67 (m, 4H), 7.54 (d, 2H), 7.48 (m, 4H), 7.42 (d, 2H), 7.32 (m, 8H), 7.19 (m, 2H), 7.13 (m, 2H); $C_{66}H_{38}O_2$: M+862.29.

Synthesis Example 16

Synthesis of Compound 71

Compound 71 was synthesized in the same manner as in Synthesis Example 11, except that Intermediate 1-6 was used instead of 9-bromoanthracene during the synthesis of Intermediate 2-a, and Intermediate 2-8 was used instead of Intermediate 2-4 during the synthesis of Intermediate 2-d. This compound was identified using LC-MS and NMR. $^1$H NMR (CDCl$_3$, 400 MHz) δ (ppm) 8.81 (d, 2H), 8.31 (s, 2H), 8.23 (s, 2H), 8.12 (d. 2H), 8.00 (d, 2H), 7.82 (d, 2H), 7.74 (d, 2H), 7.65 (d, 2H), 7.48 (m, 4H), 7.40 (d, 2H), 7.29 (d, 2H), 7.32 (m, 4H), 7.26 (m, 2H), 7.22 (m, 2H); $C_{56}H_{32}N_2S_2$: M+796.20

Example 1

To manufacture an anode, a Corning 15 Ω/cm² (1200 Å) ITO glass substrate was cut to a size of 50 mm×50 mm×0.7 mm and then sonicated in isopropyl alcohol and pure water each for five minutes, and then cleaned by irradiation of ultraviolet rays for 30 minutes and exposure to ozone. The resulting glass substrate was loaded into a vacuum deposition device.

Then, 2-TNATA, which is a HIL material, was vacuum-deposited on the glass substrate to form a HIL having a thickness of about 600 Å. Subsequently, 4,4'-bis[N-(1-naphthyl)-N-phenylamino]biphenyl (NPB), which is a hole transporting compound, was vacuum-deposited on the HIL to form a HTL having a thickness of about 300 Å.

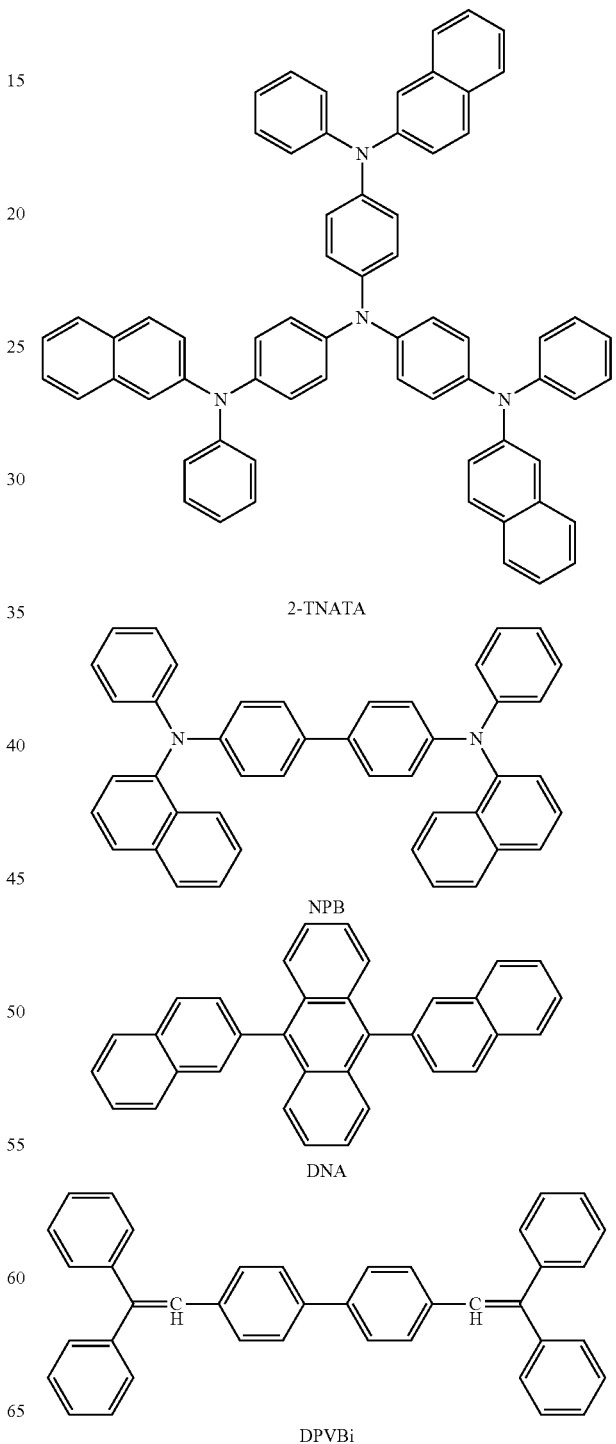

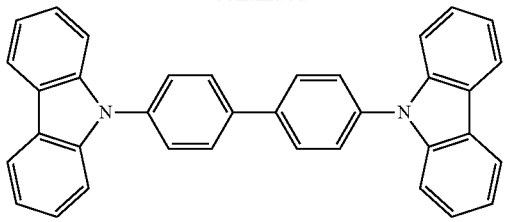

CBP

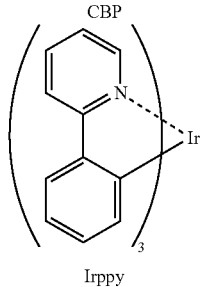

Irppy

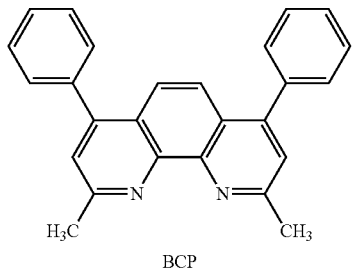

BCP 9,10-di-naphthalene-2-yl-anthracene (DNA) as a blue fluorescent host and the synthesized Compound 53 as a blue fluorescent dopant, instead of known blue fluorescent dopant, were co-deposited on the HTL at a weight ratio of 98:2 to form an EML having a thickness of about 300 A.

Then, Alq$_3$ was deposited on the EML to form an ETL having a thickness of 300 Å, and then LiF, which is a halogenated alkali metal, was deposited on the ETL to form an EIL having a thickness of 10 Å. Then, Al was vacuum-deposited on the EIL to form a cathode having a thickness of 3000 Å, thereby forming an LiF/Al electrode and completing the manufacture of an OLED.

The OLED had a driving voltage of about 6.28 V at a current density of 50 mA/cm$^2$, a luminosity of 2,538 cd/m$^2$, a luminescent efficiency of 5.06 cd/A, and a half life-span (hr @100 mA/cm$^2$) of about 33 hours.

Example 2

An OLED was manufactured in the same manner as in Example 1, except that Compound 59, instead of Compound 53, was used to form the ETL The OLED had a driving voltage of about 6.35 V at a current density of 50 mA/cm$^2$, a luminosity of 2,455 cd/m$^2$, a luminescent efficiency of 4.91 cd/A, and a half life-span (hr @100 mA/cm$^2$) of about 30 hours.

Example 3

The synthesized Compound 1, instead of known compound CBP, as a green phosphorescent host, and a known compound Irppy as a green phosphorescent dopant were co-deposited at a weight ratio of 91:9 to form an EML having a thickness of about 300 Å. Then, BCP as a hole blocking compound was vacuum-deposited on the EML to form a HBL having a thickness of about 50 Å. Other than that, an OLED was manufactured in the same manner as in Example 1.

The OLED had a driving voltage of about 5.42 V at a current density of 50 mA/cm$^2$, a luminosity of 17,952 cd/m$^2$, a luminescent efficiency of 35.9 cd/A, and a half life-span (hr @100 mA/cm$^2$) of about 84 hours.

Example 4

An OLED was manufactured in the same manner as in Example 3, except that Compound 54, instead of Compound 1, was used to form the EML.

The OLED had a driving voltage of about 5.74 V at a current density of 50 mA/cm$^2$, a luminosity of 19,056 cd/m$^2$, a luminescent efficiency of 38.11 cd/A, and a half life-span (hr @100 mA/cm$^2$) of about 90 hours.

Example 5

An OLED was manufactured in the same manner as in Example 1, except that Compound 22 was used instead of 4,4'-bis[N-(1-naphthyl)-N-phenylamino]biphenyl (NPB), which is a known material as a hole transport material in Example 1, and a known blue fluorescent dopant DPVBi was used instead of Compound 53 as a blue fluorescent dopant to form the HTL.

The OLED had a driving voltage of about 6.02 V at a current density of 50 mA/cm$^2$, a luminosity of 2,552 cd/m$^2$, a luminescent efficiency of 5.10 cd/A, and a half life-span (hr @100 mA/cm$^2$) of about 32 hours.

Example 6

An OLED was manufactured in the same manner as in Example 5, except that Compound 23, instead of Compound 22, was used to form the ETL.

The OLED had a driving voltage of about 6.23 V at a current density of 50 mA/cm$^2$, a luminosity of 2,677 cd/m$^2$, a luminescent efficiency of 5.34 cd/A, and a half life-span (hr @100 mA/cm$^2$) of about 37 hours.

Example 7

An OLED was manufactured in the same manner as in Example 1, except that Compound 22 was used instead of 4,4'-bis[N-(1-naphthyl)-N-phenylamino]biphenyl (NPB), which is a known material as a hole transport material that is used to form the ETL in Example 1.

The OLED had a driving voltage of about 5.98 V at a current density of 50 mA/cm$^2$, a luminosity of 2,683 cd/m$^2$, a luminescent efficiency of 5.36 cd/A, and a half life-span (hr @100 mA/cm$^2$) of about 35 hours.

Comparative Example 1

An OLED was manufactured in the same manner as in Example 1, except that a known blue fluorescent dopant DPVBi was used instead of Compound 53 to form the EML.

The OLED had a driving voltage of about 7.35 V at a current density of 50 mA/cm$^2$, a luminosity of 1,522 cd/m$^2$, a luminescent efficiency of 3.04 cd/A, and a half life-span (hr @100 mA/cm$^2$) of about 15 hours.

Comparative Example 2

An OLED was manufactured in the same manner as in Example 3, except that a known green phosphorescent host CBP was used instead of Compound 1 to form the EML.

The OLED had a driving voltage of about 6.8 V at a current density of 50 mA/cm$^2$, a luminosity of 10,902 cd/m$^2$, a luminescent efficiency of 21.8 cd/A, and a half life-span (hr @100 mA/cm$^2$) of about 60 hours.

The characteristics and lifetimes of the OLEDs of Examples 1-7 and Comparative Examples 1-2 are shown in Table 1 below.

TABLE 1

| | Emitting material (host or dopant) or hole transport material | Driving voltage (V) | Current density (mA/cm$^2$) | Luminosity (cd/m$^2$) | Luminescent efficiency (cd/A) | Emitting color | Half life-span (hr @100 mA/cm$^2$) |
|---|---|---|---|---|---|---|---|
| Example 1 | Blue fluorescent dopant Compound 53 | 6.28 | 50 | 2,538 | 5.06 | Blue | 33 hr |
| Example 2 | Blue fluorescent dopant Compound 59 | 6.35 | 50 | 2,455 | 4.91 | Blue | 30 hr |
| Example 3 | Green phosphorescent host Compound 1 | 5.42 | 50 | 17,952 | 35.9 | Green | 84 hr |
| Example 4 | Green phosphorescent host Compound 54 | 5.74 | 50 | 19,056 | 38.11 | Green | 90 hr |
| Example 5 | Hole transporting Compound 22 | 6.02 | 50 | 2,552 | 5.10 | Blue | 32 hr |
| Example 6 | Hole transporting Compound 23 | 6.23 | 50 | 2,677 | 5.34 | Blue | 37 hr |
| Example 7 | Blue fluorescent dopant Compound 53, Hole transporting Compound 22 | 5.98 | 50 | 2,683 | 5.36 | Blue | 35 hr |
| Comparative Example 1 | DNA/DPVBi | 7.35 | 50 | 1,522 | 3.04 | Blue | 15 hr |
| Comparative Example 2 | CBP/Irppy | 6.8 | 50 | 10,902 | 21.8 | Green | 60 hr |

As the OLEDs are manufactured using the condensation compounds represented by Formula 1, 22, or 53 as a blue fluorescent dopant, a green phosphorescent host, or an hole transporting compound, all the OLEDs according to embodiments had lower driving voltages, improved I-V-L characteristics with much improved efficiencies, and remarkable improvements in luminance and lifetime, as compared to those manufactured using widely-known material DPVBi, CBP, and NPB.

Therefore, the condensation compound represented by Formula 1, 2, or 3 according to one or more embodiments may have excellent light luminescent characteristics, particularly blue fluorescence and green phosphorescence light. Thus, when the compound is used, an OLED with a high-efficiency, low-voltage, high-luminance, and long-lifetime may be manufactured.

By way of summation and review, a major factor affecting luminescent efficiency of an OLED is a luminescent material. Light-emitting materials generally used are fluorescent materials or phosphorescent materials, which may not be satisfactory in terms of efficiency, driving voltage, and lifetime. Thus, there has been a demand for development of a more stable material with improved performance.

Embodiments may provide a condensation compound with improved characteristics, and a high-efficiency, low-voltage, high-luminance, and long-lifetime organic light-emitting device including the novel condensation compound. The condensation compound has improved electrical characteristics, excellent charge transporting capabilities, improved emission capability, and a glass transition temperature (Tg) high enough to prevent crystallization. The condensation compound is suitable as an electron transporting material for fluorescent and phosphorescent devices of any color, such as red, green, blue, or white, or as a green, blue, or white light-emitting material with higher emission efficiency and longer lifetime, and appropriate color coordinates, as compared with existing materials.

While the present invention has been particularly shown and described with reference to exemplary embodiments thereof, it will be understood by those of ordinary skill in the art that various changes in form and details may be made therein without departing from the spirit and scope as defined by the following claims.

What is claimed is:

1. A condensation compound represented by Formula 1, 2, or 3 below:

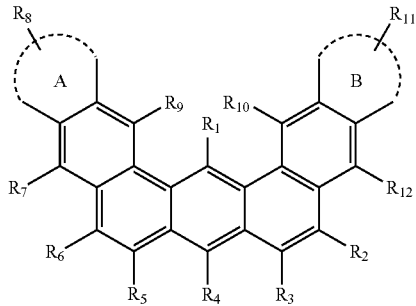

<Formula 1>

<Formula 2>

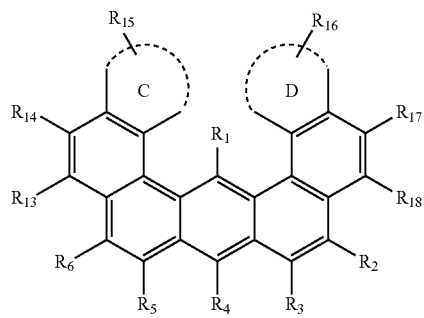

<Formula 3>

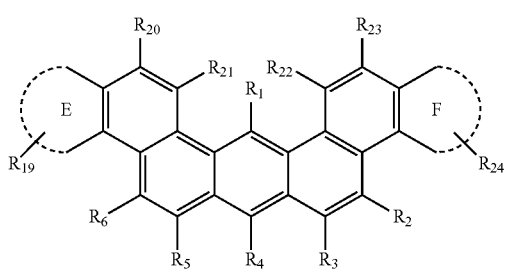

wherein $R_1$ to $R_{24}$ are each independently a hydrogen atom, a deuterium atom, a halogen atom, a cyano group, a substituted or unsubstituted C1-C60 alkyl group, a substituted or unsubstituted C5-C60 aryl group, a substituted or unsubstituted C3-C60 heteroaryl group, or a substituted or unsubstituted C6-C60 condensed polycyclic group; A to F each independently represent a substituted or unsubstituted furan group, a substituted or unsubstituted thiophene group, a substituted or unsubstituted pyrrole group, a substituted or unsubstituted benzofuran group, a substituted or unsubstituted benzothiophene group, a substituted or unsubstituted benzopyrrole group, or substituted or unsubstituted benzocyclopentyl group that are fused to a benzo[m]tetraphene skeleton of Formula 1, 2, or 3.

2. The condensation compound of claim 1, wherein $R_1$ and $R_4$ are each independently a halogen atom, a cyano group, a substituted or unsubstituted C1-C30 alkyl group, or a substituted or unsubstituted C5-C30 aryl group.

3. The condensation compound of claim 1, wherein $R_2$ and $R_6$ are each independently a substituted or unsubstituted C5-C30 aryl group, or a substituted or unsubstituted C5-C30 heteroaryl group.

4. The condensation compound of claim 1, wherein $R_3$, $R_5$, $R_7$, $R_9$, $R_{10}$, $R_{12}$, $R_{13}$, $R_{14}$, $R_{17}$, $R_{18}$, $R_{20}$, $R_{21}$, $R_{22}$, and $R_{23}$ are each independently a hydrogen atom or a deuterium atom.

5. The condensation compound of claim 1, wherein A to F, which are a substituted or unsubstituted furan group, a substituted or unsubstituted thiophene group, a substituted or unsubstituted pyrrole group, a substituted or unsubstituted benzofuran group, a substituted or unsubstituted benzothiophene group, a substituted or unsubstituted benzopyrrole group, or substituted or unsubstituted benzocyclopentyl group, fuse to the benzo[m]tetraphene skeleton of Formula 1, 2, or 3 at positions 2 and 3 in Formula 4 below, or at positions 2 and 3 in Formula 5 below:

<Formula 4>

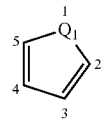

<Formula 5>

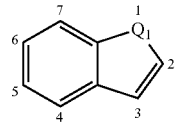

wherein $Q_1$ is —O—, —$NR_{30}$—, —S— or —$CR_{31}R_{32}$—; and $R_{30}$ to $R_{32}$ are each independently a hydrogen atom, a deuterium atom, a substituted or unsubstituted C1-C20 alkyl group, a substituted or unsubstituted C5-C20 aryl group, a substituted or unsubstituted C3-C20 heteroaryl group, or a substituted or unsubstituted C6-C20 condensed polycyclic group.

6. The condensation compound of claim 1, wherein the condensation compound of Formula 1, 2, or 3 is symmetrical.

7. The condensation compound of claim 1, wherein $R_2$ and $R_6$ in Formulae 1 to 3 are each independently one of the groups represented by Formulae 2a to 2e below:

2a

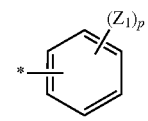

2b

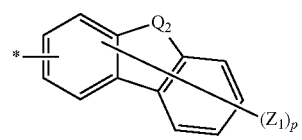

2c

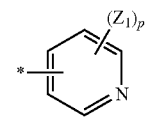

2d

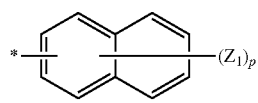

2e

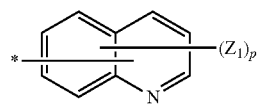

wherein $Q_2$ is a linking group represented by —C($R_{40}$)($R_{41}$)—, —N($R_{42}$)—, —S—, or —O—; $Z_1$, $R_{40}$, $R_{41}$, and $R_{42}$ are each independently a hydrogen atom, a deuterium atom, a substituted or unsubstituted C1-C20 alkyl group, a substituted or unsubstituted C5-C20 aryl group, a substituted or unsubstituted C3-C20 heteroaryl group, a substituted or unsubstituted C6-C20 condensed polycyclic group, an amino group substituted with a C5-C20 aryl group or a C3-C20 heteroaryl group, a halogen atom, a cyano group, a nitro group, a hydroxyl group, or a carboxy group; p is an integer from 1 to 7; and * indicates a binding site.

8. The condensation compound of claim 1, wherein the condensation compound of Formula 1, 2, or 3 is one of compounds represented by the following Formulae 1, 22, 53, 54, and 59:

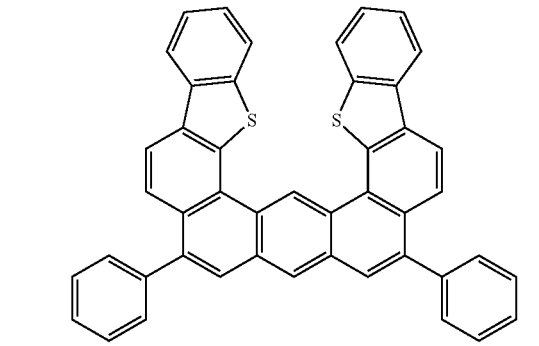

1

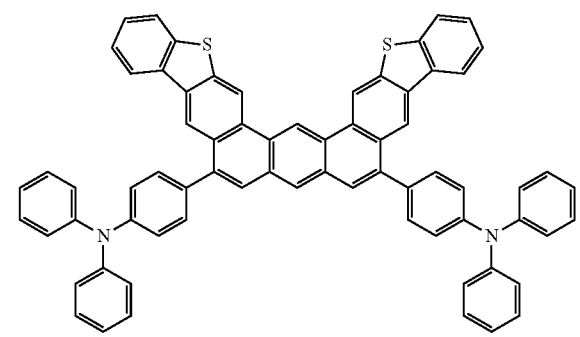

22

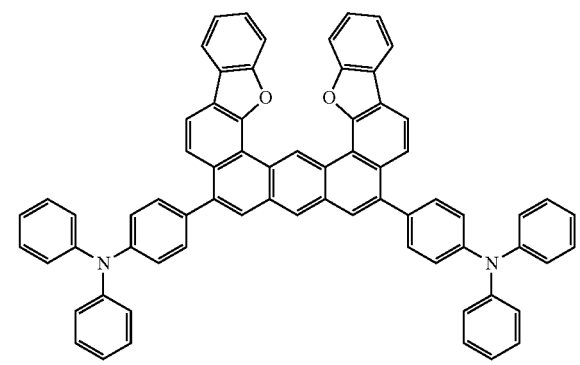

23

53

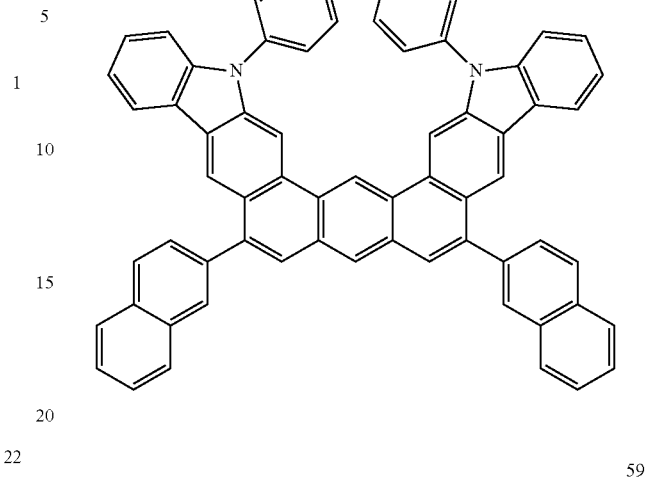

54

59

9. An organic light-emitting device (OLED), comprising:
a first electrode;
a second electrode; and
an organic layer between the first electrode and the second electrode,
wherein the organic layer includes the condensation compound of claim 1.

10. The OLED of claim 9, wherein the organic layer includes the condensation compound as a fluorescent dopant.

11. The OLED of claim 9, wherein the organic layer includes the condensation compound as a phosphorescent host.

12. The OLED of claim 9, wherein the organic layer includes a blue emission layer or a green emission layer.

13. The OLED of claim 9, wherein:
the organic layer includes an emission layer (EML), a hole injection layer (HIL), a hole transport layer (HTL), and a functional layer having both electron injection and electron transport capabilities,
the EML, the HIL, the HTL, or the functional layer having both electron injection and electron transport capabilities includes the condensation compound of claim 1, and
the EML includes an anthracene-based compound, an arylamine-based compound, or a styryl-based compound.

14. The OLED of claim 9, wherein:
the organic layer includes a EML, a HIL, a HTL, a functional layer having both electron injection and electron transport capabilities, the EML, the HIL, the HTL, or the functional layer having both electron injection and electron transport capabilities include the condensation compound of claim 1, and at least one of a red layer, a green layer, a blue layer, and a white layer of the EML includes a phosphorescent compound.

15. The OLED of claim 14, wherein at least one of the HIL, the HTL, and the functional layer having both hole injection and hole transport capabilities includes a charge-generating material.

16. The OLED of claim 15, wherein the charge-generating material is a p-dopant, wherein the p-dopant is a quinone derivative, a metal oxide, or a compound containing a cyano group.

17. The OLED of claim 9, wherein:

the organic layer includes an electron transport layer (ETL), and the ETL includes an electron transporting organic compound and a metal complex.

18. The OLED of claim 17, wherein the metal complex is lithium quinolate (LiQ) or Compound 203 below:

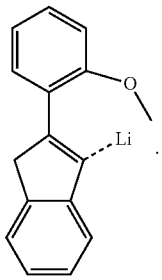

<Compound 203>

19. The OLED of claim 9, wherein the organic layer is formed of the condensation compound of claim 1 using a wet method.

20. A flat display device comprising the OLED of claim 9, wherein the first electrode of the OLED is electrically connected to a source or drain electrode of a thin-film transistor.

* * * * *